US012787180B2

(12) United States Patent
Fujikawa et al.

(10) Patent No.: US 12,787,180 B2
(45) Date of Patent: Nov. 3, 2026

(54) TRANSFER LAMINATE AND MANUFACTURING METHOD THEREFOR

(71) Applicant: DIC Corporation, Tokyo (JP)

(72) Inventors: Wataru Fujikawa, Takaishi (JP); Norimasa Fukazawa, Takaishi (JP); Hiroyuki Hagiwara, Takaishi (JP); Rei Tamura, Takaishi (JP)

(73) Assignee: DIC CORPORATION, Tokyo (JP)

( * ) Notice: Subject to any disclaimer, the term of this patent is extended or adjusted under 35 U.S.C. 154(b) by 2 days.

(21) Appl. No.: 18/867,956

(22) PCT Filed: May 11, 2023

(86) PCT No.: PCT/JP2023/017673
§ 371 (c)(1),
(2) Date: Nov. 21, 2024

(87) PCT Pub. No.: WO2023/238592
PCT Pub. Date: Dec. 14, 2023

(65) Prior Publication Data

US 2025/0365870 A1 Nov. 27, 2025

(30) Foreign Application Priority Data

Jun. 7, 2022 (JP) ................................ 2022-092146

(51) Int. Cl.
*H05K 3/20* (2006.01)
*C23C 2/00* (2006.01)
(Continued)

(52) U.S. Cl.
CPC ............ *H05K 3/205* (2013.01); *C23C 2/006* (2013.01); *C23C 2/026* (2022.08); *H05K 3/0044* (2013.01);
(Continued)

(58) Field of Classification Search
None
See application file for complete search history.

(56) References Cited

U.S. PATENT DOCUMENTS 10,178,773 B2 * 1/2019 Chung ................ H05K 3/0061
2010/0140100 A1 * 6/2010 Kim ...................... H05K 3/205
205/125
(Continued)

FOREIGN PATENT DOCUMENTS

EP 3817522 A1 * 5/2021 ............ H05K 3/108
JP 2021197484 A * 12/2021 ............ H01L 23/12
(Continued)

OTHER PUBLICATIONS

CNC Cookbook—Complete Surface Finish Chart, Symbols & Roughness Conversion Tables (Year: 2018).*
(Continued)

*Primary Examiner* — John Vincent Lawler
(74) *Attorney, Agent, or Firm* — WHDA, LLP

(57) ABSTRACT

The layered body includes a seed layer that serves as a base for plating and that can be formed using a simple and low-cost method capable of ensuring stable quality and preventing the occurrence of scratches on the plating seed layer due to contact with a coating apparatus during application and contact with conveyor rollers. The layered body can provide good adhesion between a support and a metal layer (metal plating layer) without roughening the surface of the support. The transfer layered bodies is produced by forming a plating seed layer containing a dispersant and an electrically conductive material on a temporary support, forming a resin layer on the plating seed layer, and then allowing functional groups in the plating seed layer and functional groups in the resin layer to react with each other.

33 Claims, 19 Drawing Sheets

(51) Int. Cl.

| | |
|---|---|
| ***C23C 2/02*** | (2006.01) |
| ***H05K 3/00*** | (2006.01) |
| ***H05K 3/42*** | (2006.01) |

(52) U.S. Cl.

CPC ..... *H05K 3/423* (2013.01); *H05K 2203/0152* (2013.01); *H05K 2203/0369* (2013.01); *H05K 2203/061* (2013.01); *H05K 2203/0723* (2013.01); *H05K 2203/1438* (2013.01); *H05K 2203/1453* (2013.01)

(56) References Cited

U.S. PATENT DOCUMENTS

| | | | | |
|---|---|---|---|---|
| 2010/0255240 | A1* | 10/2010 | Beppu | B32B 15/08 526/348 |
| 2011/0201190 | A1* | 8/2011 | Hermes | C25D 5/02 257/E21.294 |
| 2014/0008012 | A1* | 1/2014 | Freydl | H05K 3/007 156/247 |
| 2014/0338192 | A1* | 11/2014 | Chung | H05K 3/0014 29/846 |
| 2015/0344777 | A1 | 12/2015 | Nagamine et al. | |
| 2015/0351250 | A1 | 12/2015 | Kella et al. | |
| 2016/0234935 | A1* | 8/2016 | Kohiki | H05K 1/09 |
| 2016/0330850 | A1* | 11/2016 | Oka | H05K 1/09 |
| 2018/0124925 | A1* | 5/2018 | Hashizume | H05K 1/097 |
| 2018/0206368 | A1* | 7/2018 | Murakawa | H05K 9/0086 |

FOREIGN PATENT DOCUMENTS

| | | | | |
|---|---|---|---|---|
| KR | 10-2013-0073851 A | | 7/2013 | |
| KR | 10-2014-0124384 A | | 10/2014 | |
| WO | WO-2015037512 A1 | * | 3/2015 | H05K 1/095 |
| WO | 2015/060196 A1 | | 4/2015 | |
| WO | 2019/013038 A1 | | 1/2019 | |

OTHER PUBLICATIONS

Nitta—JP 2021-197484 A—MT—wiring board—w—release roughness—Dec. 2021 (Year: 2021).*

Fujikawa—WO 2015-037512 A1—OG—electroconductive pattern—2015 (Year: 2015).*

International Search Report dated Jul. 25, 2023, issued in counterpart International Application No. PCT/JP2023/017673. (2 pages).

* cited by examiner

TRANSFER LAMINATE AND MANUFACTURING METHOD THEREFOR

TECHNICAL FIELD

The present invention relates to a transfer layered body including a plating seed layer and a resin layer that are disposed in this order on a temporary support. The invention also relates to a method for producing, using the transfer layered body, a printed wiring board, a printed wiring board for high frequency transmission, a rigid printed wiring board, a flexible printed wiring board, a package substrate, an electromagnetic shield, and a molded interconnect device.

BACKGROUND ART

As electronic devices become smaller and faster, printed wiring boards are required to have higher density and higher performance. To meet this requirement, there is a need for a printed wiring board including a sufficiently thin metal layer having a smooth surface. It is known that such a printed wiring board is formed using a flexible copper clad laminate (hereinafter abbreviated as "FCCL") or a rigid copper clad laminate (hereinafter abbreviated as "RCCL").

The FCCL is produced using a method including laminating mainly a heat resistant polymer film and a copper foil together using an epoxy resin-based adhesive, a method (casting method) including applying a varnish such as a polyimide to the surface of a copper foil and drying the varnish to form a film, a method (laminating method) including thermocompression-bonding a copper foil and a polyimide film including a thermoplastic resin layer together, a method (sputtering method) including forming a metal film on a surface of a polyimide film by a sputtering method and plating the metal film with copper, or a method including applying a primer layer to a surface of a polyimide film, applying a metal nanoparticle layer to the primer layer, and plating the metal nanoparticle layer with copper with the metal nanoparticle layer used as the base of plating (PTL 1).

The RCCL is produced by a method including laminating a fully cured resin or a ceramic and a copper film using an epoxy resin-based adhesive, a method including heating a glass cloth impregnated with an epoxy resin and laminating the semi-cured substrate (prepreg) and a copper foil together, or a method including applying a vanish prepared by mixing a resin and an inorganic filler to a release film, drying the vanish, and laminating the resin coating obtained by drying the vanish to a copper film or the surface of copper traces by thermocompression bonding (a build-up film).

When any of the methods using a copper foil is applied to the FCCL or the RCCL, the copper foil or a substrate to be laminated to the copper foil must be roughened in order to achieve sufficient adhesion between the copper foil and the substrate or an adhesive layer. One problem in this case is that it is difficult to reduce the pitch of the printed wiring board. Another problem is that, in the high-frequency transmission required for 5G communications, which are becoming widespread, and Beyond 5G communications, which are expected to be widespread, transmission loss may occur in high-frequency ranges such as the millimeter wave band.

With the sputtering method or the application method using the metal nanoparticle layer, the copper plating layer and the substrate can be brought to close contact with each other at their smooth interface without roughening the substrate. Therefore, advantages of these methods over the methods using the copper foil are that the pitch of the printed wiring board can be easily reduced and that transmission loss of high-frequency signals is low.

However, with the sputtering method, vapor deposition or sputtering is used to form the thin metal film, and therefore a large-scale vacuum facility is needed. One problem in this case is that the size of the substrate is limited due to the size of the facility. Moreover, when the sputtering method is applied to both sides of a substrate, the time required to evacuate the facility is twice that when the sputtering method is applied to one side. In this case, while one of the two sides is subjected to processing, defects may be formed on the surface of the metal layer formed on the other side by the sputtering method. Disadvantages in this case are that the yield is low and that the production cost is high.

When, for example, a single-sided plate is produced using the application method using the primer layer and the metal nanoparticle layer, it is necessary that, after the application of the primer layer to a substrate, the metal nanoparticle layer be applied. When a double-sided plate is produced, it is necessary to apply the primer layer and the metal nanoparticle layer to the side opposite to the side coated first, so that the time required for the processing is long. Another problem is that defects are generated on the coated surfaces during application, which reduces the quality. When both sides are coated, the number of times the first coated surface passes through a dryer differs from the number of times the last coated surface passes through the dryer, so that their thermal histories differ from each other. One problem in this case is that the quality of the first coated surface differs from the quality of the last coated surface.

Accordingly, there is a need for a low-cost and simple production method that can form an electrically conductive pattern such as a copper layer having sufficient adhesion to a support such as a polymer film or a rigid substrate without roughening the surface of the copper layer and the surface of the substrate and that can form the metal layer without using a large-scale vacuum facility and can ensure stable quality.

Plastic molded articles with decorative plating have been used for mobile phones, personal computers, mirrors, containers, various switches, shower heads, etc. Supports for these applications have been limited only to acrylonitrile-butadiene-styrene (hereinafter abbreviated as "ABS") copolymers and polymer alloys of ABS and polycarbonate (hereinafter abbreviated to as "ABS-PC"). This is because it is necessary to roughen the surface of the substrate in order to ensure the adhesion between the substrate and the plating film. When ABS, for example, is used, the surface can be roughened by removing the polybutadiene component by etching using a strong oxidizer such as hexavalent chromic acid or permanganate. However, since hexavalent chromic acid etc. are environmentally hazardous substances, it is preferable not to use these substances, and alternative methods have been developed (see, for example, PTL 2).

The plating described above is performed on plastic molded articles, for example, for decoration purposes. In this case, there is a demand to obtain coating films with good adhesion not only to ABS and ABS-PC substrates but also to other types of plastics, and there is also a demand to reduce the amount of environmentally hazardous substances used.

CITATION LIST

Patent Literature

PTL 1: International Publication No. WO2019/013038
PTL 2: International Publication No. WO2015/060196

SUMMARY OF INVENTION

Technical Problem

One object to be achieved by the present invention is to provide a layered body including a seed layer that serves as a base for plating and that can be formed using a simple and low-cost method capable of ensuring stable quality and preventing the occurrence of scratches on the plating seed layer due to contact with a coating apparatus during application and contact with conveyor rollers. The layered body can provide good adhesion between a support and a metal layer (metal plating layer) without roughening the surface of the support. Other objects of the invention are to provide a rigid printed wiring board, a flexible printed wiring board, and a molded article using the layered body.

The present inventors have conducted extensive studies to achieve the above objects and produced transfer layered bodies by forming a plating seed layer containing a dispersant and an electrically conductive material on a temporary support, forming a resin layer on the plating seed layer, and then allowing functional groups in the plating seed layer and functional groups in the resin layer to react with each other. The inventors have found that, by laminating the transfer layered body or bodies to only one side or both the front and back sides of a support and then removing only the temporary support of each transfer layered body, the plating seed layer(s) with high quality can be formed on the surface(s) of the support easily and at low cost. Thus, the invention has been completed.

Specifically, the present invention includes the following.

[1]A transfer layered body including: a temporary support (A); a plating seed layer (B) containing a dispersant (b1) and an electrically conductive material (b2); and a resin layer (C) containing a compound (c1) having a functional group [X], the plating seed layer (B) and the resin layer (C) being disposed in this order on at least one side of the temporary support (A), wherein the signal intensity of carbon atoms in the plating seed layer (B) that is measured by glow discharge optical emission spectrometry is larger on a resin layer (C) side than on a temporary support (A) side.

[2] The transfer layered body according to 1, wherein, in the plating seed layer (B), the signal intensity measured by the glow discharge optical emission spectrometry on the temporary support (A) side is less than or equal to ⅔ the signal intensity on the resin layer (C) side.

[3] The transfer layered body according to 1 or 2, wherein a basic nitrogen atom-containing group or a phosphate group included in the compound (b1) contained in the plating seed layer (B) and the functional group [X] included in the compound (c1) contained in the resin layer (C) have been reacted with each other to form a chemical bond.

[4] The transfer layered body according to any one of 1 to 3, wherein the functional group [X] is at least one functional group selected from an epoxy group, carboxylic acid groups, carboxylic anhydride groups, a keto group, alkylolamido groups, an isocyanate group, a vinyl group, alkyl halide groups, an acryloyl group, a cyanamido group, a carbamido group, and acyl halide groups or at least one functional group selected from an epoxy group and an amino group.

[5] The transfer layered body according to any one of 1 to 4, wherein the electrically conductive material (b2) is silver.

[6] The transfer layered body according to any one of 1 to 5, wherein the resin layer (C) includes one or more resin layers (C).

[7] The transfer layered body according to any one of 1 to 6, wherein the temporary support (A) has a surface roughness (maximum height Sz) of 0.001 to 20 μm as measured using a laser microscope.

[8] The transfer layered body according to any one of 1 to 7, further including a release layer on a surface of the temporary support (A).

[9] The transfer layered body according to any one of 1 to 8, wherein the temporary support (A) is a film or a metal.

[10]A laminate including: a support D; and the transfer layered body according to any one of 1 to 9, wherein the support D and the transfer layered body are laminated together such that a surface of the transfer layered body that is formed by the resin layer (C) faces at least one side of the support D.

[11] The laminate according to 10, wherein the support D is formed of a fully cured product of a thermosetting resin.

[12]A method for producing the layered body according to any one of 1 to 9, the method including:

step 1 of forming, on at least one side of the temporary support (A), the plating seed layer (B) containing the dispersant (b1) including a basic nitrogen atom-containing group or a phosphate group and the electrically conductive material (b2); and step 2 of forming, on the plating seed layer (B), the resin layer (C) containing the compound (c1) having the functional group [X] and allowing the basic nitrogen atom-containing group or the phosphate group included in the dispersant (b1) contained in the plating seed layer (B) and the functional group [X] included in the compound (c1) contained in the resin layer (C) to react with each other to form a chemical bond.

[13]A method for producing the layered body according to any one of 1 to 9, the method including:

step 1 of forming, on at least one side of the temporary support (A), the plating seed layer (B) containing the dispersant (b1) including a basic nitrogen atom-containing group or a phosphate group and the electrically conductive material (b2), the plating seed layer (B) being formed into a pattern; and step 2 of forming the resin layer (C) on the plating seed layer (B) formed into the pattern and allowing the basic nitrogen atom-containing group or the phosphate group included in the dispersant (b1) contained in the plating seed layer (B) and the functional group [X] included in the compound (c1) contained in the resin layer (C) to react with each other to form a chemical bond.

[14] The method for producing the transfer layered body according to 12 or 13, further including step 1' of forming a layer having releasability on the temporary support (A).

[15]A method for producing an electrically conductive pattern, the method including:

step 1 of laminating the transfer layered body obtained by the method for producing according to 12 or 13 to at least one side of a support (D) such that a surface of the transfer layered body that is formed by the resin layer (C) faces the support (D); and step 2 of removing the temporary support (A) of the transfer layered body laminated to the support (D) to thereby form the resin layer (C) and the plating seed layer (B) on the at least one side of the support (D).

[16] The method for producing an electrically conductive pattern according to 15, further including the step of forming a metal plating layer (E) on the plating seed layer (B).

[17]A method for producing an electrically conductive pattern, the method including:

step 1 of laminating the transfer layered body obtained by the method for producing according to 12 or 13 to at least one side of a support (D) such that a surface of the transfer layered body that is formed by the resin layer (C) faces the support (D);

step 2 of forming a through hole extending from the temporary support (A) of the transfer layered body so as to pass through both sides;

step 3 of applying palladium, an electrically conductive polymer, an electrically conductive paste, or carbon to the transfer layered body and a surface of the through hole to impart electrical conductivity to the surface of the through hole; and step 4 of removing the temporary support (A) and forming a metal plating layer (E) on the plating seed layer (B) and in the through hole.

[18]A method for producing an electrically conductive pattern, the method including:

step 1 of laminating the transfer layered body obtained by the method for producing according to 12 or 13 to at least one side of a support (D) such that a surface of the transfer layered body that is formed by the resin layer (C) faces the support (D);

step 2 of forming a through hole extending from the temporary support (A) of the transfer layered body so as to pass through both sides;

step 3 of forming a metal film on the transfer layered body and a surface of the through hole using a dry plating method to impart electrical conductivity to the surface of the through hole; and step 4 of removing the temporary support (A) and forming a metal plating layer (E) on the plating seed layer (B) and in the through hole.

[19]A method for producing an electrically conductive pattern, the method including:

step 1 of laminating the transfer layered body obtained by the method for producing according to 12 or 13 to at least one side of a support (D) such that a surface of the transfer layered body that is formed by the resin layer (C) faces the support (D);

step 2 of forming a through hole extending from the temporary support (A) of the transfer layered body so as to pass through both sides;

step 3 of removing the temporary support (A) and forming a metal plating layer (E) on a surface of the plating seed layer (B); and step 4 of filling the through hole with an electrically conductive paste to impart electrical conductivity to the through hole.

[20]A method for producing an electrically conductive pattern, the method including:

step 1 of laminating a support (D) to at least one side of a substrate having an electrically conductive pattern formed thereon;

step 2 of laminating the transfer layered body obtained by the method for producing according to 12 or 13 to a surface of the support (D) such that a surface of the transfer layered body that is formed by the resin layer (C) faces the support (D);

step 3 of forming a blind hole extending from the temporary support (A) of the transfer layered body to the electrically conductive pattern on the substrate;

step 4 of applying palladium, an electrically conductive polymer, an electrically conductive paste, or carbon to the transfer layered body and a surface of the blind hole to impart electrical conductivity to the surface of the blind hole; and step 5 of removing the temporary support (A) and forming a metal plating layer (E) on the plating seed layer (B) and in the blind hole.

[21]A method for producing an electrically conductive pattern, the method including:

step 1 of laminating a support (D) to at least one side of a substrate having an electrically conductive pattern formed thereon;

step 2 of laminating the transfer layered body obtained by the method for producing according to 12 or 13 to a surface of the support (D) such that a surface of the transfer layered body that is formed by the resin layer (C) faces the support (D);

step 3 of forming a blind hole extending from the temporary support (A) of the transfer layered body to the electrically conductive pattern on the substrate;

step 4 of forming a metal film on the transfer layered body and a surface of the blind hole using a dry plating method to impart electrical conductivity to the surface of the blind hole; and step 5 of removing the temporary support (A) and forming a metal plating layer (E) on the plating seed layer (B) and in the blind hole.

[22]A method for producing an electrically conductive pattern, the method including:

step 1 of laminating a support (D) to at least one side of a substrate having an electrically conductive pattern formed thereon;

step 2 of laminating the transfer layered body obtained by the method for producing according to 12 or 13 to a surface of the support (D) such that a surface of the transfer layered body that is formed by the resin layer (C) faces the support (D);

step 3 of forming a blind hole extending from the temporary support (A) of the transfer layered body to the electrically conductive pattern on the substrate;

step 4 of removing the temporary support (A) and forming a metal plating layer (E) on a surface of the plating seed layer (B); and step 5 of filling the blind hole with an electrically conductive paste to impart electrical conductivity to the blind hole.

[23] A method for producing an electrically conductive pattern, the method including:

step 1 of laminating the transfer layered body obtained by the method for producing according to 12 or 13 to at least one side of a support (D) such that a surface of the transfer layered body that is formed by the resin layer (C) faces the support (D);

step 2 of forming a through hole extending from the temporary support (A) of the transfer layered body so as to pass through both sides;

step 3 of applying palladium, an electrically conductive polymer, an electrically conductive paste, or carbon to the transfer layered body and a surface of the through hole to impart electrical conductivity to the surface of the through hole;

step 4 of removing the temporary support (A) and forming a patterned resist on a surface of the plating seed layer (B);

step 5 of forming a metal plating layer (E) on the plating seed layer (B) and in the through hole; and step 6 of removing the patterned resist and removing, using an etching solution, the plating seed layer (B)

from a portion other than a portion in which the metal plating layer (E) serving as an electrically conductive pattern is formed.

[24] A method for producing an electrically conductive pattern, the method including:

step 1 of laminating the transfer layered body obtained by the method for producing according to 12 or 13 to at least one side of a support (D) such that a surface of the transfer layered body that is formed by the resin layer (C) faces the support (D);

step 2 of forming a through hole extending from the temporary support (A) of the transfer layered body so as to pass through both sides;

step 3 of forming a metal film on the transfer layered body and a surface of the through hole using a dry plating method to impart electrical conductivity to the surface of the through hole;

step 4 of removing the temporary support (A) and forming a patterned resist on a surface of the plating seed layer (B);

step 5 of forming a metal plating layer (E) on the plating seed layer (B) and in the through hole; and step 6 of removing the patterned resist and removing, using an etching solution, the plating seed layer (B) from a portion other than a portion in which the metal plating layer (E) serving as an electrically conductive pattern is formed.

[25]A method for producing an electrically conductive pattern, the method including:

step 1 of laminating the transfer layered body obtained by the method for producing according to 12 or 13 to at least one side of a support (D) such that a surface of the transfer layered body that is formed by the resin layer (C) faces the support (D);

step 2 of forming a through hole extending from the temporary support (A) of the transfer layered body so as to pass through both sides;

step 3 of removing the temporary support (A) and forming a patterned resist on a surface of the plating seed layer (B);

step 4 of forming a metal plating layer (E) on the plating seed layer (B);

step 5 of removing the patterned resist and removing, using an etching solution, the plating seed layer (B) from a portion other than a portion in which the metal plating layer (E) serving as an electrically conductive pattern is formed; and step 6 of filling the through hole with an electrically conductive paste to impart electrical conductivity to the through hole.

[26]A method for producing an electrically conductive pattern, the method including:

step 1 of laminating the transfer layered body obtained by the method for producing according to 12 or 13 to at least one side of a support (D) such that a surface of the transfer layered body that is formed by the resin layer (C) faces the support (D);

step 2 of removing the temporary support (A) to form the resin (C) and the plating seed layer (B) on a surface of the support (D);

step 3 of forming a patterned resist on a surface of the plating seed layer (B);

step 4 of forming a metal plating layer (E) on the plating seed layer (B);

step 5 of removing the patterned resist and removing, using an etching solution, the plating seed layer (B) from a portion other than a portion in which the metal plating layer (E) serving as an electrically conductive pattern is formed;

step 6 of forming a through hole extending from the temporary support (A) of the transfer layered body so as to pass through both sides; and step 7 of filling the through hole with an electrically conductive paste to impart electrical conductivity to the through hole.

[27]A method for producing an electrically conductive pattern, the method including:

step 1 of laminating a support (D) to at least one side of a substrate having an electrically conductive pattern formed thereon;

step 2 of laminating the transfer layered body obtained by the method for producing according to 12 or 13 to a surface of the support (D) such that a surface of the transfer layered body that is formed by the resin layer (C) faces the support (D);

step 3 of forming a blind hole extending from the temporary support (A) of the transfer layered body to the electrically conductive pattern on the substrate;

step 4 of applying palladium, an electrically conductive polymer, an electrically conductive paste, or carbon to the transfer layered body and a surface of the blind hole to impart electrical conductivity to the surface of the blind hole;

step 5 of removing the temporary support (A) and forming a patterned resist on a surface of the plating seed layer (B);

step 6 of forming a metal plating layer (E) on the plating seed layer (B) and in the blind hole; and step 7 of removing the patterned resist and removing, using an etching solution, the plating seed layer (B) from a portion other than a portion in which the metal plating layer (E) serving as an electrically conductive pattern is formed.

[28] A method for producing an electrically conductive pattern, the method including:

step 1 of laminating a support (D) to at least one side of a substrate having an electrically conductive pattern formed thereon;

step 2 of laminating the transfer layered body obtained by the method for producing according to 12 or 13 to a surface of the support (D) such that a surface of the transfer layered body that is formed by the resin layer (C) faces the support (D);

step 3 of forming a blind hole extending from the temporary support (A) of the transfer layered body to the electrically conductive pattern on the substrate;

step 4 of forming a metal film on the transfer layered body and a surface of the blind hole using a dry plating method to impart electrical conductivity to the surface of the blind hole;

step 5 of removing the temporary support (A) and forming a patterned resist on a surface of the plating seed layer (B); and step 6 of forming a metal plating layer (E) on the plating seed layer (B) and in the blind hole; and step 7 of removing the patterned resist and removing, using an etching solution, the plating seed layer (B) from a portion other than a portion in which the metal plating layer (E) serving as an electrically conductive pattern is formed.

[29]A method for producing an electrically conductive pattern, the method including:

step 1 of laminating a support (D) to at least one side of a substrate having an electrically conductive pattern formed thereon;

step 2 of laminating the transfer layered body obtained by the method for producing according to 12 or 13 to a surface of the support (D) such that a surface of the transfer layered body that is formed by the resin layer (C) faces the support (D);

step 3 of forming a blind hole extending from the temporary support (A) of the transfer layered body to the electrically conductive pattern on the substrate;

step 4 of removing the temporary support (A) and forming a patterned resist on a surface of the plating seed layer (B);

step 5 of forming a metal plating layer (E) on the plating seed layer (B);

step 6 of removing the patterned resist and removing, using an etching solution, the plating seed layer (B) from a portion other than a portion in which the metal plating layer (E) serving as an electrically conductive pattern is formed; and step 7 of filling the blind hole with an electrically conductive paste to impart electrical conductivity to the blind hole.

[30]A method for producing an electrically conductive pattern, the method including:

step 1 of laminating a support (D) to at least one side of a substrate having an electrically conductive pattern formed thereon;

step 2 of laminating the transfer layered body obtained by the method for producing according to 12 or 13 to a surface of the support (D) such that a surface of the transfer layered body that is formed by the resin layer (C) faces the support (D);

step 3 of removing the temporary support (A) to form the resin (C) and the plating seed layer (B) on the surface of the support (D);

step 4 of forming a patterned resist on a surface of the plating seed layer (B);

step 5 of forming a metal plating layer (E) on the plating seed layer (B);

step 6 of removing the patterned resist and removing, using an etching solution, the plating seed layer (B) from a portion other than a portion in which the metal plating layer (E) serving as an electrically conductive pattern is formed;

step 7 of forming a blind hole extending from the temporary support (A) of the transfer layered body to the electrically conductive pattern on the substrate; and step 8 of filling the blind hole with an electrically conductive paste to impart electrical conductivity to the blind hole.

[31] The method for producing an electrically conductive pattern according to any one of 15 to 30, the method further including the step of smoothing a surface of the support (D).

[32]A method for producing a printed wiring board, the method comprising using the method for producing an electrically conductive pattern according to any one of 15 to 31.

[33]A method for producing a printed wiring board and an electromagnetic seed film, the method comprising using the method for producing an electrically conductive pattern according to any one of 15 to 31, wherein the support (D) is at least one selected from a rigid substrate, a film, a build-up film, a ceramic, glass, a silicon wafer, and a metal.

[34]A method for producing a molded interconnect device, the method comprising using the method for producing an electrically conductive pattern according to any one of 15 to 31, wherein the support (D) is a molded article.

are provide.

Advantageous Effects of Invention

The transfer layered body of the present invention is prepared by forming a plating seed layer and a resin layer on a temporary support and allowing functional groups in the plating seed layer and functional groups in the resin layer to react with each other. With the method for producing an electrically conductive pattern, the transfer layered body/bodies is/are laminated to one side/both sides of a support at a time, and the resin layer(s) and the plating seed layer(s) can be formed on the support more easily, at lower cost, and with higher quality than with a conventional coating method using metal nanoparticles.

The electrically conductive pattern production method of the invention can be preferably used, for example, for electronic members such as printed wiring boards, high-speed transmission printed wiring boards, rigid printed wiring boards, flexible printed wiring boards, package substrates, ceramic substrates, glass substrates, silicon wafer substrates, metal substrates, electrically conductive films for touch panels, metal meshes for touch panels, organic solar cells, organic EL devices, organic transistors, RFIDs such as contactless IC cards, electromagnetic shields, LED light substrates, and digital signage. In particular, the production method are optimal for rigid printed wiring board applications and flexible printed wiring board applications.

By applying the invention to molded articles, the molded articles can be preferably used for molded interconnect devices (MIDs), connectors for connecting wiring cables for optical communications etc., electrical members, peripheral members of electric motors, electronic members such as battery members, and decorations for decorative components for automobiles, lamp reflectors, mobile phones, personal computers, mirrors, containers, household electrical appliances, various switches, faucet members, and shower heads.

DESCRIPTION OF EMBODIMENTS

Figure 1:
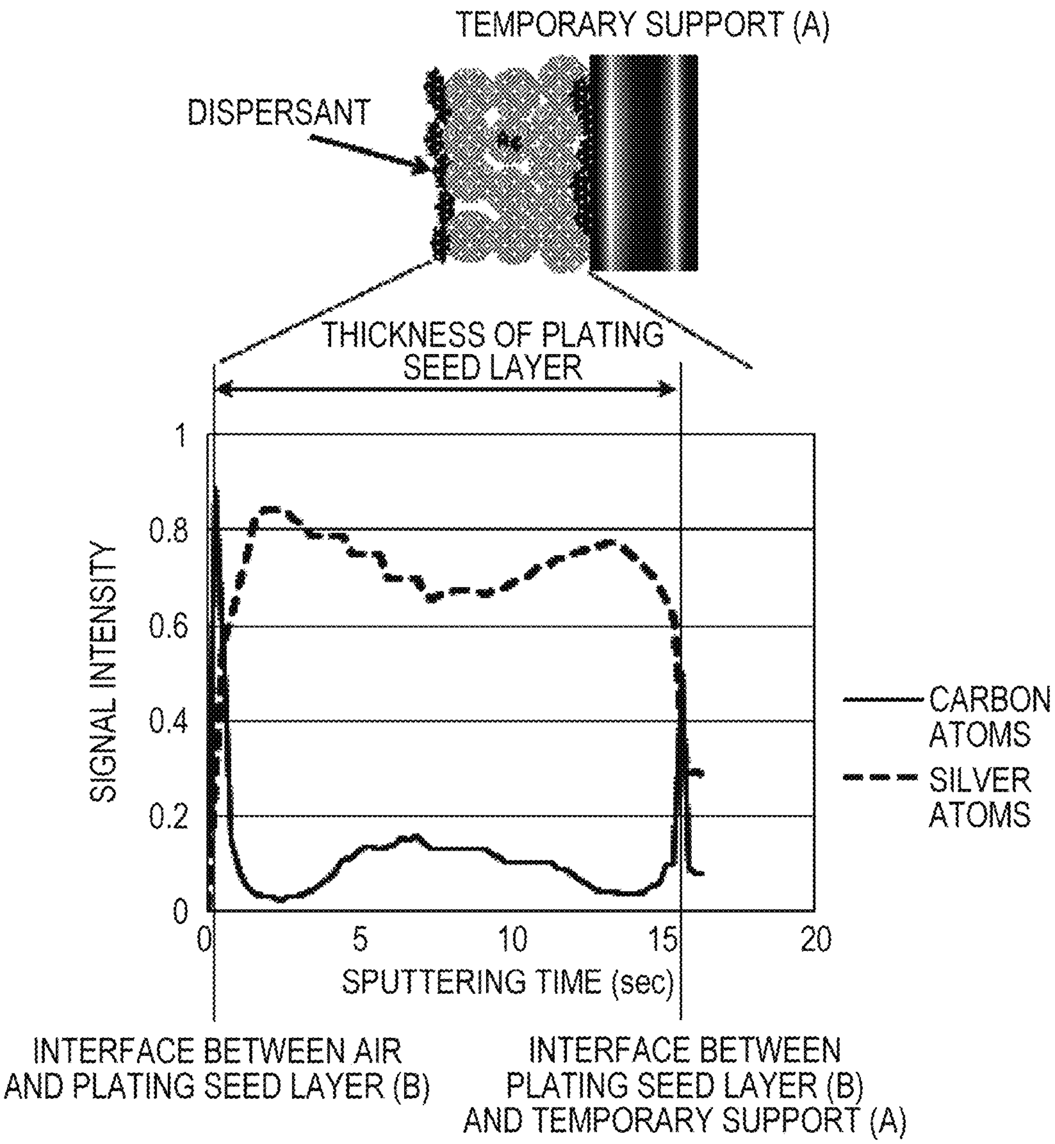
FIG. 1 shows the results of glow discharge optical emission spectrometry measurement on a coating film obtained by applying a fluid containing silver as an electrically conductive material (b2) to a temporary support (A) and drying the fluid.

The present invention relates to a transfer layered body including a temporary support (A), a plating seed layer (B) containing a dispersant (b1) and an electrically conductive material (b2), and a resin layer (C) containing a compound (c1) having a functional group [X], the plating seed layer (B) and the resin layer (C) being stacked in this order on at least one side of the temporary support (A). A functional group included in the compound (b1) contained in the plating seed layer (B) and the functional group [X] included in the compound (c1) contained in the resin layer (C) have been reacted with each other to form a chemical bond. The invention also relates to a method for producing the transfer layered body.

An electrically conductive pattern production method includes: step 1 of laminating the transfer layered body to at least one side of a support (D) such that the surface of the transfer layered body that is formed by the resin layer (C) faces the support (D); and step 2 of removing the temporary support (A) of the laminated transfer layered body to form the resin layer (C) and the plating seed layer (B) on the at least one side of the support (D).

The transfer layered body of the invention may be a layered body in which a plating seed layer (B) and a resin layer (C) are sequentially stacked on at least one side of a temporary support (A) or a layered body in which plating seed layers (B) and resin layers (C) are sequentially stacked on both sides of a temporary support (A).

It is necessary that the temporary support (A) be removed after lamination of the transfer layered body. It is therefore preferable to select the temporary support (A) such that the temporary support (A) and the plating seed layer (B) can be easily separated from each other at their interface. For example, any of the following polymer films may be used: aromatic polyesters such as polyethylene terephthalate, polybutylene terephthalate (PBT), polyethylene naphthalate, and polybutylene naphthalate; fluorene-based resins such as polytetrafluoroethylene, tetrafluoroethylene perfluoroalkyl vinyl ether copolymers, tetrafluoroethylene-hexafluoropropylene copolymers, tetrafluoroethylene-ethylene copolymers, vinylidene fluoride resins, chlorotrifluoroethylene resins, chlorotrifluoroethylene-ethylene copolymers, tetrafluoroethylene-perfluorodioxole copolymers, vinyl fluoride resins, and polyvinylidene fluoride; olefin resins such as polymethylpentene (TPX), polypropylene (PP) [including biaxially oriented polypropylene (OPP) and cast polypropylene (CPP)], and polyethylene (PE) [including high-density polyethylene (HDPE), low-density polyethylene (LDPE), and linear low-density polyethylene (LLDPE)]; polystyrene (PS); polyvinyl chloride (PVC), polyimide resins such as polyimides and transparent polyimides; polyamide resins such as polyamide-imides and polyamides; polycarbonates, acrylonitrile-butadiene-styrene (ABS) resins, polymer alloys of ABS and polycarbonate, acrylic resins such as polymethyl(meth)acrylate, polyvinyl chloride, polyvinylidene chloride, polyvinyl alcohol, polycarbonates, polyethylene, polypropylene, polyurethanes, liquid crystal polymers (LCPs), polyether ether ketone (PEEK), polyphenylene sulfide (PPS), poly phenylene sulfone (PPSU), and epoxy resins. Of these, aromatic polyesters, polyethylene, olefin resins, fluorine-based resins, polyimide resins, LCPs, polyphenylene sulfide, and polystyrene are preferably used for the temporary support.

A metal may be used for the temporary support (A), and examples of the metal that can be used include copper, aluminum, aluminum alloys, titanium, stainless steel, beryllium copper, phosphor bronze, nickel, nichrome, nickel alloys, tin, zinc, lead, gold, zinc, lead, tantalum, molybdenum, niobium, iron, and silver. The temporary support (A) used may be an inorganic substrate formed of silicon, a ceramic, glass, etc.

No particular limitation is imposed on the shape of the temporary support (A), but a film- or sheet-shaped support is easy to handle. The thickness of the temporary support (A) is generally preferably in the range of 1 to 5,000 μm, more preferably in the range of 1 to 300 μm, still more preferably in the range of 1 to 200 μm, yet more preferably in the range of 1 to 100 μm, and even more preferably in the range of 1 to 50 μm. After the transfer layered body is laminated to the support (D) described later and the plating seed layer (B) and the resin layer (C) are transferred to the support (D) and stacked thereon, the temporary support (A) is no longer necessary. Therefore, it is preferable that the temporary support (A) is thin enough to maintain workability.

To facilitate the transfer of the plating seed layer (B) and the resin layer (C) from the transfer layered body, it is preferable that the surface of the temporary support (A) is smooth. Specifically, the surface roughness (maximum height Sz) measured using a laser microscope is preferably in the range of 0.001 to 30 μm, preferably in the range of 0.01 to 20 μm, and more preferably in the range of 0.05 to 10 μm. The surface roughness (maximum height Sz) is measured using an evaluation method described in ISO 25178 and represents the distance from the highest point on the surface to the lowest point.

A transfer layered body including a release layer formed on the surface of the temporary support (A) may be used. The release layer can be formed by applying a silicone-based release agent or a non-silicone-based release agent to the temporary support (A). Examples of the non-silicone-based release agent that can be used include alkyd resins, melamine resins, acrylic resins, cellulose resins, urea resins, polyolefins, paraffin, silica composite acrylic resins, silica composite melamine resins, silica composite urethane resins, silica composite epoxy-based resins, silica composite phenolic resins, silica composite poval resins, silica composite polystyrene-based resins, silica composite polyvinyl acetate-based resins, silica composite polyimide-based resins, and silica composite polyamide-imide-based resins. With a release layer formed of a silicone resin, the silicone resin transfers to the surface of the plating seed layer (B) when the temporary support (A) of the transfer layered body is removed, and this inhibits the adhesion between the plating seed layer (B) and the metal plating layer (E) described later when the metal plating layer is formed on the plating seed layer (B). Therefore, it is preferable to use a non-silicone-based release agent for the release layer. Specifically, it is preferable to use a polyolefin, an acrylic resin, a melamine resin, a urethane resin, a silica composite acrylic resin, a silica composite melamine resin, a silica composite urethane resin, a silica composite epoxy-based resin, a silica composite phenolic resin, a silica composite poval resin, a silica composite polystyrene-based resin, a silica composite polyvinyl acetate-based resin, a silica composite polyimide-based resin, or a silica composite polyamide-imide-based resin.

No particular limitation is imposed on the thickness of the release layer so long as it can have releasability. However, it is preferable that the release layer is a thin film in order to prevent the release layer from adhering to the surface of the plating seed layer (B) described later. Specifically, the thickness is preferably 0.01 to 50 μm, more preferably 0.01 to 10 μm, and still more preferably 0.01 to 1 μm.

Preferably, a metal is used for the temporary support (A). When a metal is used, the plating seed layer (B) formed in the manner described later on the surface of the temporary support (A) using metal nano-particles can be dried at a higher temperature than that when a polymer film is used. In this case, the surface resistance of the plating seed layer (B) can be reduced, and therefore the electrical conductivity of the plating seed layer itself can be increased. In the step of forming an electrically conductive pattern, the surface of the resin (C) in the transfer layered body described later is laminated to the support (D), and then a through hole extending from the surface of the temporary support (A) so as to pass through both sides or a blind hole extending inward to the electrically conductive pattern is formed. In this case, a drill or a laser is used to form the hole. When a polymer film is used for the temporary support (A), smears of the polymer may be generated during the formation of the hole, and plating deposition defects may occur in the step of imparting electrical conductivity to the through hole or the blind hole. When a metal is used, a conventional drilling process for a printed board using a drill or laser can be used, and it is therefore preferable to use copper or aluminum for the temporary support (A).

To form the plating seed layer (B) described later on the temporary support (A) by a coating process, the surface of the temporary support (A) may be optionally subjected to surface treatment in order to allow the coating to easily wet the surface. Specific examples of the surface treatment include plasma discharge treatment such as corona discharge treatment, dry treatment such as UV treatment, and wet treatment using water, an aqueous solution of an acid, an alkali, etc., an organic solvent, etc. If the surface of the temporary support (A) is treated excessively, the temporary support (A) and the plating seed layer (B) are not easily separated from each other at their interface. Therefore, it is preferable to treat the surface appropriately.

The plating seed layer (B) will next be described.

The plating seed layer (B) is a layer containing the dispersant (b1) and the electrically conductive material (b2). When the plating seed layer (B) is formed on the temporary support (A) using a method described later, the dispersant (b1) can be localized at the interface between the plating support layer (B) and air and the interface between the plating seed layer (B) and the temporary support (A).

The interface between the plating seed layer (B) and air is a surface on which the resin layer (C) described later is to be formed. When a large amount of the dispersant (b1) is localized at the interface with air, the formation of a chemical bond between a functional group included in the dispersant (b1) and the functional group [X] included in the compound (c1) contained in the resin layer (C) is facilitated, so that the adhesion between the plating seed layer (B) and the resin layer (C) is improved. The interface between the plating seed layer (B) and the temporary support (A) is a surface on which the metal plating layer (E) is to be formed after the transfer layered body is transferred to the support (D) as described later. Therefore, if the amount of the dispersant (b1) localized at the interface is large, the adhesion between the plating seed layer (B) and the metal plating layer (E) deteriorates.

The inventors conducted extensive studies. Specifically, the plating seed layer (B) was formed on the temporary support (A), and the existence state of carbon atoms derived from the dispersant (b1) was measured by glow discharge optical emission spectrometry. Then the inventors found that there is an optimal amount of carbon atoms at the interface between the plating seed layer (B) and air (on the resin layer (C) side in the final state) and there is an optimal amount of carbon atoms at the interface between the plating seed layer (B) and the temporary support (A) (on the metal plating layer (E) side in the final state).

The glow discharge optical emission spectrometry is a method in which high-frequency sputtering is performed on the plating seed layer (B) in an argon glow discharge region and emission lines from the sputtered atoms are continuously subjected to spectral analysis to measure the distributions of elements in the thickness direction of the plating seed layer (B). A high-frequency glow discharge optical emission surface analyzer (GDS) GD-Profiler 2 manufactured by HORIBA Ltd. can be used for the glow discharge optical emission spectrometry. As for the measurement conditions, argon gas is used at a gas pressure of 1000 Pa. The electric power used is 20 W, and the anode diameter is 4 mm. The signal intensities obtained by the glow discharge optical emission spectrometry measurement are emission intensities of elements obtained by independent detectors simultaneously. Therefore, to quantify the elements, it is necessary to prepare calibration curves corresponding to the respective elements. When attention is focused on one element, the element profile in the depth direction of the plating seed layer (B) can be obtained from the signal intensity of the element.

Figure 2:
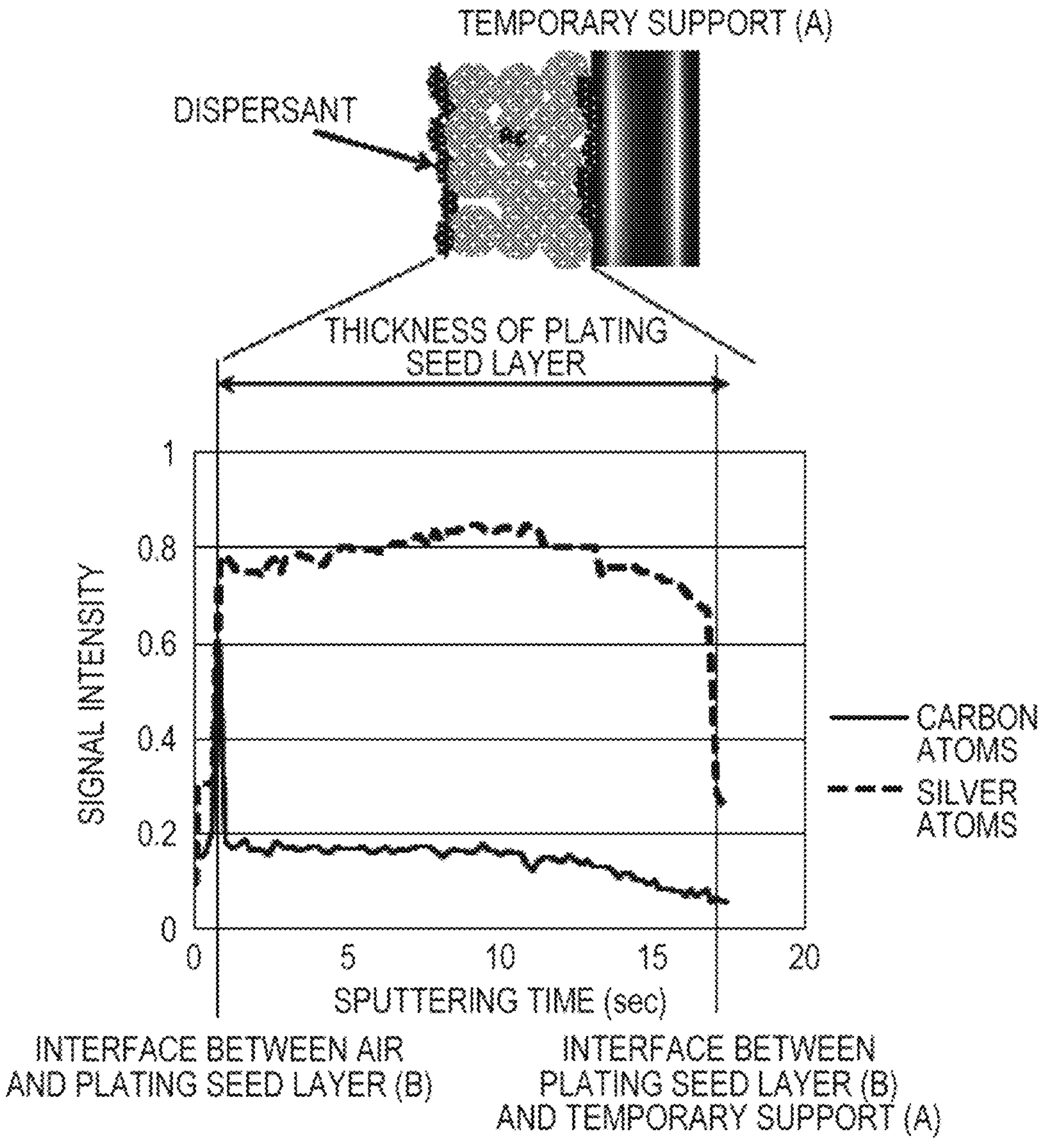
FIG. 2 shows the results of glow discharge optical emission spectrometry measurement on a coating film obtained by applying a fluid containing silver as an electrically conductive material (b2) to a temporary support (A) and drying the fluid.

FIGS. 1 and 2 show the results of glow discharge optical emission spectrometry when silver is used as the electrically conductive material (b2).

FIG. 1 is a graph with the horizontal axis representing sputtering time and the vertical axis representing the signal intensities of elements. The interface between air and the plating seed layer (B) (the resin layer (C) side in the final state) is located at about 0.5 seconds after the start of sputtering. As can be seen, in the profile of carbon atoms, unlike the profile of silver atoms, a large amount of carbon atoms are present at the interface. As the sputtering time increases, the amount of carbon atoms decreases. This indicates that the amount of carbon atoms inside the plating seed layer (B) is relatively small. As can be seen, as the sputtering further proceeds, the interface between the plating seed layer (B) and the temporary support (A) (the metal plating layer (E) side in the final state) appears at about 16 seconds after the start of sputtering, and a large amount of carbon atoms are present at the interface. As can be seen, since a large amount of carbon atoms derived from the dispersant (b1) are present at the interface between air and the plating seed layer (B), the functional group included in the dispersant (b1) and the functional group [X] included in the compound (c1) contained in the resin layer (C) described later can easily react with each other to form a chemical bond.

In FIG. 2, a plating seed layer (B) different from that in FIG. 1 was formed on the temporary support (A). The interface between air and the plating seed layer (B) (the resin layer (C) side in the final state) is located at about 1 second after the start of sputtering. As can be seen, in the profile of carbon atoms, unlike the profile of silver atoms, a large amount of carbon atoms are present at the interface. As can be seen, even as the sputtering further proceeds, the signal intensity of carbon atoms does not change. The interface between the plating seed layer (B) and the temporary support (A) (the metal plating layer (E) side in the final state) is located at about 21 seconds after the start of sputtering at which the signal intensity of silver atoms drops. However, no increase in the amount of carbon atoms is found at the interface.

The plating seed layer (B) may be a layer provided on the entire surface of the temporary support (A) or may be a layer provided on part of the surface of the temporary support (A). An electrically conductive pattern obtained using the plating seed layer (B) may be a pattern in which the plating seed layer (B) is formed on the entire surface of the temporary support (A) or may be a pattern in which the plating seed layer (B) is formed on part of the surface. Specific examples of the plating seed layer (B) present on part of the surface of the temporary support (A) include: an electrically conductive pattern formed on the surface of the temporary support (A) using a patterned resist; an electrically conductive pattern formed as the plating seed layer (B) only on necessary portions using a printing method; and an electrically conductive pattern obtained by forming the plating seed layer (B) on the entire surface of the temporary support (A) and removing (trimming) unnecessary portions using, for example, a laser so as to allow only necessary portions to remain.

The plating seed layer (B) contains the electrically conductive material (b2) in the range of 80% by mass to 99.9% by mass with respect to the total mass of the plating seed layer (B) and contains the dispersant (b1) in the range of 0.1% by mass to 20% by mass and preferably in the range of 0.1% by mass to 10% by mass.

A compound having a basic nitrogen atom-containing group or a phosphate group may be used as the dispersant (b1) contained in the plating seed layer (B), and the dispersant (b1) is allowed to react with the functional group [X] included in the compound (c1) contained in the resin layer (C) described later to form a chemical bond. The basic nitrogen atom-containing groups or the phosphate groups may react partially with the functional groups [X] to form chemical bonds or may react entirely with the functional groups [X] to form chemical bonds.

Examples of the basic nitrogen atom-containing group include an imino group, primary amino groups, and secondary amino groups.

When the dispersant (b1) used has a plurality of basic nitrogen atom-containing groups in its molecule, it is preferable, in terms of improving the adhesion between the plating seed layer (B) and the resin layer (C), that one of the basic nitrogen atom-containing groups is involved in the bond with the functional group [X] included in the compound (c1) contained in the resin layer (C) described later when the plating seed layer (B) is formed and that another basic nitrogen atom-containing group contributes to the interaction with the electrically conductive material (b2) such as silver in the plating seed layer (B).

When the plating seed layer (B) is a porous layer, the adhesion between the plating seed layer (B) and the metal plating layer (E) described later can be improved. Therefore, the dispersant (b1) containing a basic nitrogen-containing group is preferably a high-molecular weight dispersant, and the high-molecular weight dispersant used is preferably a polyalkylenimine such as polyethyleneimine or polypropyleneimine or a compound prepared by adding polyoxyalkylene to a polyalkylenimine. When the dispersant used is a high-molecular weight dispersant, the dispersant in the plating seed layer (B) can be removed more easily than a low-molecular weight dispersant to form a porous layer, and larger pores can be formed. Specifically, pores of the order of nanometers to submicron order can be formed. The pores can be easily filled with the metal forming the metal plating layer (E) described later, and the metal in the pores serves as an anchor, so that the adhesion between the plating seed layer (B) and the metal plating layer (E) described later can be significantly improved.

When the dispersant (b1) used has a phosphate group in its molecule, it is preferable to use an acrylic resin into which the phosphate group can be easily introduced. To introduce a phosphate group into an acrylic resin, a monomer having a phosphate group is used as a raw material of the acrylic resin. Examples of the monomer having a phosphate group include 2-((meth)acryloyloxy)ethyl phosphate, 2-((meth)acryloyloxy)propyl phosphate, diphenyl(2-acryloyloxyethyl) phosphate, diphenyl(2-methacryloyloxyethyl) phosphate, and phenyl(2-acryloyloxyethyl) phosphate.

It is preferable to use a functional group [Y] other than the phosphate group for the dispersant (b1) in combination with the phosphate group in order to improve the adhesion between the plating seed layer (B) and the resin layer (C). Examples of the functional group [Y] include a carboxyl group, an isocyanate group, a blocked isocyanate group, an epoxy group, a hydroxy group, an oxazoline group, an N-methylol group, an N-alkoxymethyl group, an amino group, and an alkoxysilyl group. The dispersant (b1) may include two or more of the functional groups.

The content of the functional group [Y] in the dispersant (b1) is preferably in the range of 0.001 to 5 mmol/g, more preferably in the range of 0.01 to 3 mmol/g, and still more preferably in the range of 0.01 to 2 mmol/g because the adhesion to the resin layer (C) can be further improved.

Examples of the electrically conductive material (b2) included in the plating seed layer (B) include transition metals and compounds thereof. In particular, ionic transition metals are preferred. Examples of the ionic transition metal include copper, silver, gold, nickel, palladium, platinum, and cobalt. Of these, silver and copper are preferred because the metal plating layer (E) described later can be easily formed, and silver is used more preferably because the surface resistance of the plating seed layer can be reduced. Metals having magnetism such as nickel and cobalt reduce transmission characteristics required for high-frequency transmission. It is therefore preferable to use silver or copper, and it is more preferable to use silver.

Preferably, the electrically conductive material (b2) used to form the plating seed layer (B) has a particulate or fibrous shape. When the electrically conductive material (b2) is particles, it is preferable that the particles are of the order of nanometers. Specifically, the average particle diameter is preferably in the range of 1 to 100 nm and more preferably in the range of 1 to 50 nm because a denser coating film can be obtained and the resistance can be further reduced. To measure the average particle diameter, "Nanotrac UPA-150" manufactured by Microtrac can be used.

When the electrically conductive material (b2) has a fibrous shape, the diameter of the fibers is preferably in the range of 5 to 100 nm and more preferably in the range of 5 to 50 nm because a denser coating film can be obtained and the resistance can be further reduced. The length of the fibers is preferably in the range of 0.1 to 100 μm and more preferably in the range of 0.1 to 30 μm.

The plating seed layer (B) can be formed by preparing a fluid containing the dispersant (b1) and the electrically conductive material (b2) and applying the fluid. The content of the electrically conductive material (b2) in the fluid is preferably in the range of 1 to 90% by mass, more preferably in the range of 1 to 60% by mass, and still more preferably in the range of 1 to 10% by mass.

A solvent or a dispersant for dispersing the electrically conductive material (b2) in the solvent may be added to the fluid. An optional component described later such as a surfactant, a leveling agent, a viscosity modifier, a film-forming aid, an antifoaming agent, or a preservative may also be used.

To disperse the electrically conductive material (b2) in the solvent, a dispersant may also be used. Examples of the dispersant include dodecanethiol, 1-octanethiol, triphenylphosphine, dodecylamine, polyethylene glycol, polyvinylpyrrolidone, polyethyleneimine, polyvinylpyrrolidone; fatty acids such as myristic acid, octanoic acid, and stearic acid; polycyclic hydrocarbon compounds having a carboxyl group such as cholic acid, glycyrrhizic acid, and abietic acid, urethane resins, acrylic resins, and compounds in which a phosphate group is included in a urethane or acrylic resin.

The amount of the dispersant used to disperse the electrically conductive material (b2) is preferably in the range of 0.01 to 50 parts by mass and more preferably in the range of 0.01 to 10 parts by mass based on 100 parts by mass of the electrically conductive material (b2).

When the dispersant is removed by firing to form a porous plating seed layer (B) for the purpose of improving the adhesion between the plating seed layer (B) and the metal plating layer (E) described later, the amount of the dispersant is preferably in the range of 0.1 to 10 parts by mass and more preferably in the range of 0.1 to 5 parts by mass based on 100 parts by mass of the metal particles (c).

The solvent used for the fluid may be a water-based solvent or an organic solvent. Examples of the water-based solvent include distilled water, ion exchanged water, pure water, and ultrapure water. Examples of the organic solvent include alcohol compounds, ether compounds, ester compounds, and ketone compounds.

Examples of the alcohol compound include methanol, ethanol, n-propanol, isopropyl alcohol, n-butanol, isobutyl alcohol, sec-butanol, tert-butanol, heptanol, hexanol, octanol, nonanol, decanol, undecanol, dodecanol, tridecanol, tetradecanol, pentadecanol, stearyl alcohol, allyl alcohol, cyclohexanol, terpineol, terpineol, dihydroterpineol, ethylene glycol monomethyl ether, ethylene glycol monoethyl ether, ethylene glycol monobutyl ether, diethylene glycol monoethyl ether, diethylene glycol monomethyl ether, diethylene glycol monobutyl ether, tetraethylene glycol monobutyl ether, propylene glycol monomethyl ether, dipropylene glycol monomethyl ether, tripropylene glycol monomethyl ether, propylene glycol monopropyl ether, dipropylene glycol monopropyl ether, propylene glycol monobutyl ether, dipropylene glycol monobutyl ether, and tripropylene glycol monobutyl ether.

In addition to the solvent, ethylene glycol, diethylene glycol, 1,3-butanediol, isoprene glycol, glycerin, etc. may be optionally used for the fluid.

The surfactant used may be a commonly-used surfactant, and examples thereof include di-2-ethylhexyl sulfosuccinate, dodecylbenzenesulfonate, alkyl diphenyl ether disulfonate, alkylnaphthalenesulfonate, and hexametaphosphate.

The leveling agent used may be a commonly-used leveling agent, and examples thereof include silicone-based compounds, acetylenediol-based compounds, and fluorine-based compounds.

The viscosity modifier used may be a commonly-used thickener, and examples thereof include: acrylic polymers and synthetic rubber latexes that can increase viscosity by adjusting the pH to alkaline; and urethan resins, hydroxyethyl cellulose, carboxymethyl cellulose, methyl cellulose, polyvinyl alcohol, hydrogenated castor oil, amide waxes, polyethylene oxide, metal soaps, and dibenzylidene sorbitol that can increase viscosity by molecular association.

The film-forming aid used may be a commonly-used film-forming aid, and examples thereof include anionic surfactants (such as dioctyl sulfosuccinate sodium salt), hydrophobic nonionic surfactants (such as sorbitan monooleate), polyether-modified siloxane, and silicone oil.

The antifoaming agent used may be a commonly-used antifoaming agent, and examples thereof include silicone-based antifoaming agents, nonionic surfactants, polyethers, higher alcohols, and polymer-based surfactants.

The preservative used may be a commonly-used preservative, and examples thereof include isothiazoline-based preservatives, triazine-based preservatives, imidazole-based preservatives, pyridine-based preservatives, azole-based preservatives, and pyrithione-based preservatives.

The viscosity of the fluid (a value measured at 25° C. using a B type viscometer) is preferably in the range of 0.1 to 500,000 mPa·s and more preferably in the range of 0.2 to 10,000 mPa·s. When the fluid is applied (printed) using a method described later such as an inkjet printing method or a letterpress reverse printing method, the viscosity is preferably in the range of 5 to 20 mPa·s.

The transfer layered body production method of the invention includes: applying a fluid containing the dispersant (b1) and the electrically conductive material (b2) to the temporary support (A); removing the organic solvent etc. contained in the fluid by drying to form the plating seed layer (B); applying a fluid containing the compound (c1) having the functional group [X] to form the resin layer (C); then allowing the basic nitrogen atom-containing group or the phosphate group included in the dispersant (b1) contained in the plating seed layer (B) and the functional group [X] included in the compound (c1) contained in the resin layer (C) to react with each other to form a bond.

Examples of the method for applying or printing the fluid to the temporary support (A) include an inkjet printing method, a reverse printing method, a screen printing method, an offset printing method, a gravure printing method, a flexographic printing method, a pad printing method, a spin coating method, a spray coating method, a bar coating method, a die coating method, a slit coating method, a roll coating method, a dip coating method, a rotary coating method, a capillary coating method, a micro gravure printing method, and a doctor roll method.

The drying temperature after the application or printing of the fluid containing the dispersant (b1) and the electrically conductive material (b2) is preferably in the range of 50° C. to 400° C., more preferably in the range of 80° C. to 340° C., preferably in the range of 120° C. to 320° C., preferably in the range of 150° C. to 300° C., and still more preferably in the range of 180° C. to 280° C.

The drying may be performed while air is blown or no air is blown. The drying may be performed in air, in an atmosphere purged with an inert gas such as nitrogen or argon, in the flow of air, or in a vacuum. When the plating seed layer (B) is a layer formed using metal nano-particles dispersed using a dispersant, the layer containing the metal nano-particles is oxidized by drying the layer in air, and the adhesion to the metal plating layer (E) described later can thereby be improved. By drying the above layer in air, the dispersant, surfactant, leveling agent, viscosity modifier, film-forming aid, antifoaming agent, preservative, etc. present on the surface of the plating seed layer (B) can be oxidized and decomposed, so that the amount of the compounds that may impede the adhesion can be reduced. In this manner, the adhesion between the plating seed layer (B) and the metal plating layer (E) can be improved.

The mass of the plating seed layer (B) per unit area is preferably in the range of 1 to 30000 mg/$m^2$ and preferably in the range of 1 to 5,000 mg/$m^2$. When the plating seed layer (B) is electroless-plated, the plating seed layer (B) is used as a catalyst. In this case, the thickness of the plating seed layer can be small. Specifically, the mass per unit area is preferably 1 to 5000 mg/$m^2$, preferably 10 to 1000 mg/$m^2$, preferably 10 to 500 mg/$m^2$, and more preferably 50 to 500 mg/$m^2$. When the plating seed layer (B) is electroplated, the plating seed layer (B) needs to have electrical conductivity. In this case, the lower the resistance, the better. Therefore, the lager the thickness, the better. The mass per unit area is preferably 100 to 30000 mg/$m^2$, preferably 100 to 10000 mg/$m^2$, and preferably 300 to 5000 mg/$m^2$. To improve the adhesion between the metal plating layer (E) described later and the plating seed layer (B) and to reduce the thickness of the expensive plating seed layer (B) to thereby reduce the cost, the mass per unit area is more preferably 500 to 2000 mg/$m^2$.

It is preferable that, when the plating seed layer (B) is electroplated, the surface resistance of the plating seed layer (B) is low in order to form uniform electroplating. The surface resistance is preferably in the range of 0.1 to 10000Ω/□, more preferably in the range of 0.15 to 1000Ω/

□, more preferably in the range of 0.15 to 500Ω/□, more preferably in the range of 0.2 to 100Ω/□, more preferably in the range of 0.2 to 10Ω/□, and still more preferably in the range of 0.2 to 5Ω/□.

Next, the resin layer (C) will be described.

The resin layer (C) is a layer provided for the purpose of increasing the area ratio (transfer ratio) of the plating seed layer (B) successfully transferred to the support (D) described later when the transfer layered body is laminated to the support (D) in the manner described later to thereby increase the adhesion between the plating seed layer (B) and the support (D).

The resin layer (C) is formed as a coating film (c) prepared by applying a composition (c1-1) containing the compound (c1) having the functional group [X] to the surface of the plating seed layer (B) and drying the composition. The functional group [X] included in the compound (c1) present in the coating film (c) reacts with the basic nitrogen atom-containing group or phosphate group in the dispersant (b1) contained in the plating seed layer (B) to form a chemical bond. The reaction proceeds at room temperature, and the chemical bond is formed. However, the reaction proceeds more easily under heating, and the formation of the chemical bond is facilitated.

In this manner, the adhesion at the interface between the plating seed layer (B) and the resin layer (C) increases. Therefore, the plating seed layer (B) and the resin layer (C) are not easily separated from each other when the transfer layered body is laminated to the support (D) in the manner described later and then the temporary support (A) of the transfer layered body is removed. Moreover, a structure including the resin layer (C) and the plating seed layer (B) stacked on the support (D) described later can have an electrically conductive pattern with adhesion high enough to prevent delamination over time.

The coating film (c) that can serve as a precursor of the resin layer (C) is formed by applying a composition containing the compound (c1) having the functional group [X] to the surface of the support and, for example, drying the composition. The compound (c1) contained in the coating film (c) has the functional group [X] that is reactable with the basic nitrogen atom-containing group or the phosphate group in the dispersant (b1) contained in the plating seed layer (B).

Examples of the functional group [X] reactable with the basic nitrogen atom-containing group include a keto group, an epoxy group, a carboxylic acid group, a carboxylic anhydride group, an alkylolamido group, an isocyanate group, a vinyl group, an alkyl halide group, an acryloyl group, a cyanamido group, a carbamido group (urea bond), and an acyl halide group, and at least one functional group selected from these groups can be used. The keto group is a carbonyl group derived from a ketone. The isocyanate group may be blocked by a blocking agent in order to prevent a reaction at room temperature.

In particular, the functional group [X] used is preferably at least one selected from the group consisting of an epoxy group, a keto group, a carboxylic acid group, a carboxylic anhydride group, an alkylolamido group, and an isocyanate group, from the viewpoint of preventing the generation of byproducts such as halogens, acids, and amines when the functional group [X] reacts with the basic nitrogen atom-containing group in the compound (b1).

Examples of the functional group [X] reactable with the phosphate group include an epoxy group and an amino group, and at least one functional group selected from these groups can be used. When the dispersant (b1) includes the functional group [Y], examples of the functional group reactable with the functional group [Y] include a carboxyl group, an isocyanate group, a blocked isocyanate group, an epoxy group, a hydroxy group, an oxazoline group, an N-methylol group, an N-alkoxymethyl group, an amino group, and an alkoxysilyl group. The resin (al) may have two or more functional groups selected from the above functional groups. The carboxyl group may be derived from an acid anhydride. The amino group may be any of primary to tertiary amino groups.

The amount of the functional groups [X] present with respect to the total amount of the resin layer (C) is preferably in the range of 50 mmol/kg to 10,000 mmol/kg and more preferably in the range of 100 mmol/kg to 8,000 mmol/kg and is still more preferably in the range of 100 mmol/kg to 5,000 mmol/kg because the adhesion can be further improved.

Examples of the resin layer (C) include urethane resins, acrylic resins, core-shell composite resins including a urethane resin serving as a shell and an acrylic resin serving as a core, epoxy resins, phenoxy resins, imide resins, amide resins, melamine resins, phenolic resins, urea-formaldehyde resins, blocked isocyanate polyvinyl alcohols obtained by allowing polyisocyanate to react with a blocking agent such as phenol, and polyvinylpyrrolidone. The core-shell composite resin including a urethane resin serving as a shell and an acrylic resin serving as a core can be obtained, for example, by polymerizing an acrylic monomer in the presence of a urethane resin. One of the above resins may be used alone, or a combination of two or more may be used.

Preferably, a resin containing an aminotriazine-modified novolac resin is used as the resin forming the resin layer (C). The phenolic hydroxy group (functional group [X]) in the aminotriazine novolac resin and the basic nitrogen atom-containing group included in the plating seed layer (B) undergo an acid-base reaction to form an ionic bond, and the adhesion at the interface between the plating seed layer (B) and the resin layer (C) is improved.

The aminotriazine-modified novolac resin is a novolac resin in which an aminotriazine ring structure and a phenol structure are bonded via a methylene group. The aminotriazine-modified novolac resin is obtained, for example, by the co-condensation reaction of an aminotriazine compound such as melamine, benzoguanamine, or acetoguanamine, a phenol compound such as phenol, cresol, butylphenol, bisphenol A, phenylphenol, naphthol, or resorcin, and formaldehyde near a neutral pH in the presence of a weak alkaline catalyst such as an alkylamine or without any catalyst or by the reaction of an alkyl ether of an aminotriazine compound such as methyletherified melamine and any of the above phenol compounds.

Preferably, the aminotriazine-modified novolac resin has substantially no methylol group. The aminotriazine-modified novolac resin may include molecules including only methylene-linked aminotriazine structures and molecules including only methylene-linked phenol structures that are generated as byproducts during production. Moreover, the aminotriazine-modified novolac resin may contain a small amount of unreacted raw materials.

Examples of the phenol structure include a phenol residue, a cresol residue, a butylphenol residue, a bisphenol A residue, a phenylphenol residue, a naphthol residue, and a resorcin residue. The residue as used herein means a structure obtained by removing at least one hydrogen atom bonded to carbon in an aromatic ring. For example, the residue of phenol means a hydroxyphenyl group.

Examples of the triazine structure include structures derived from aminotriazine compounds such as melamine, benzoguanamine, and acetoguanamine.

One type of phenol structure or a combination of two or more types may be used. One type of triazine structure or a combination of two or more types may be used. The phenol structure is preferably a phenol residue, and the triazine structure is preferably a structure derived from melamine, because the adhesion can be further improved.

The hydroxyl value of the aminotriazine-modified novolac resin is preferably in the range of 50 to 200 mgKOH/g, more preferably in the range of 80 to 180 mgKOH/g, and still more preferably in the range of 100 to 150 mgKOH/g because the adhesion can be further improved.

One aminotriazine-modified novolac resin may be used alone, or a combination of two or more may be used.

When the aminotriazine-modified novolac resin is used as the compound having an aminotriazine ring, it is preferable to use the compound in combination with an epoxy resin.

Examples of the epoxy resin include a bisphenol A-type epoxy resin, a bisphenol F-type epoxy resin, a biphenyl-type epoxy resin, a cresol novolac-type epoxy resin, a phenol novolac-type epoxy resin, a bisphenol A novolac-type epoxy resin, an alcohol ether-type epoxy resin, a tetrabromobisphenol A-type epoxy resin, a naphthalene-type epoxy resin, a phosphorus-containing epoxy compound having a structure derived from a 9,10-dihydro-9-oxa-10-phosphaphenanthrene-10-oxide derivative, an epoxy resin having a structure derived from a dicyclopentadiene derivative, and epoxidized products of fats and oils such as epoxidized soybean oil. One of these epoxy resins may be used alone, or a combination of two or more may be used.

Among the above epoxy resins, a bisphenol A-type epoxy resin, a bisphenol F-type epoxy resin, a biphenyl-type epoxy resin, a cresol novolac-type epoxy resin, a phenol novolac-type epoxy resin, and a bisphenol A novolac-type epoxy resin are preferred because the adhesion can be further improved, and a bisphenol A-type epoxy resin is particularly preferable. The epoxy group (functional group [X]) in the epoxy resin and the basic nitrogen atom-containing group included in the plating seed layer (B) are reacted with each other to form a covalent bond, and therefore the adhesion at the interface between the plating seed layer (B) and the resin layer (C) is improved.

The epoxy equivalent of the epoxy resin is preferably in the range of 100 to 300 g/eq, more preferably in the range of 120 to 250 g/eq, and still more preferably in the range of 150 to 200 g/eq because the adhesion can be further improved.

When the resin layer (C) is a layer containing the aminotriazine-modified novolac resin and the epoxy resin, the molar ratio [(x)/(y)] of the phenolic hydroxy group in the aminotriazine-modified novolac resin to the epoxy group in the epoxy resin is preferably in the range of 0.1 to 5, more preferably in the range of 0.2 to 3, and still more preferably in the range of 0.3 to 2 because the adhesion can be further improved.

To facilitate the reaction between the aminotriazine-modified novolac resin and the epoxy resin, a curing accelerator may also be used. Examples of the curing accelerator include an amine compound having a primary, secondary, or tertiary amino group. The amine compound used may be any of aliphatic, alicyclic, and aromatic amine compounds. Other examples of the curing accelerator that can be used include mercaptans, acid anhydrides, acid boron fluoride, borates, organic acid hydrazides, Lewis acids, organometallic compounds, onium salts, and cationic compounds.

It is also preferable to use a compound containing a phenoxy resin. The resin layer (C) has the function of improving the adhesion between the support (D) and the plating seed layer (B) as described later. In the present invention, it is preferable that the phenoxy resin used has a weight average molecular weight in the range of 10,000 to 100,000. By using a high-molecular weight phenoxy resin for the resin layer (C), the ductility of the polymer can be increased, and the elastic modulus can be improved. Therefore, the transfer ratio of the plating seed layer (B) when a surface of the resin layer (C) is thermocompression-bonded to the support (A) using the transfer layered body and then the temporary support (A) is removed is improved. Moreover, the adhesion between the support (D) and the metal plating layer (E) can be improved. When the high-molecular weight phenoxy resin is used, deterioration such as decomposition of the polymer due to heat during a long-term heat resistance test can be prevented. Therefore, even after the long-term heat resistance test, the adhesion to the metal plating layer (E) can be maintained.

The phenoxy resin is a polyhydroxy polyether obtained by the reaction of a divalent phenol compound and epichlorohydrin or the reaction of a divalent epoxy compound and a divalent phenol compound. Examples of the divalent phenol compound include bisphenols. Examples of the phenoxy resin include phenoxy resins having a bisphenol A structure (skeleton), phenoxy resins having a bisphenol F structure, phenoxy resins having a bisphenol S structure, phenoxy resins having a bisphenol M structure, phenoxy resins having a bisphenol P structure, and phenoxy resins having a bisphenol Z structure. Other examples include phenoxy resins having skeleton structures such as a novolac structure, an anthracene structure, a fluorene structure, a dicyclopentadiene structure, a norbornene structure, a naphthalene structure, a biphenyl structure, and an adamantane structure. One of these phenoxy resins may be used alone, or a mixture of two or more may be used. Of these, phenoxy resins having a bisphenol structure are preferred, and a bisphenol A skeleton, a bisphenol F skeleton, and a bisphenol S skeleton are more preferred. The phenoxy resin may have any functional group such as a phenolic hydroxy group or an epoxy group at each end.

In the present invention, the weight average molecular weight of the phenoxy resin used is preferably in the range of 10,000 to 100,000. When the molecular weight is 10,000 or more, the adhesion of the plating after the long-term heat resistance test is high. When the molecular weight is 100,000 or less, the solubility in an organic solvent is improved, and the coating solution used to form the resin layer (C) can have an appropriate viscosity, so that good handleability is achieved. The weight average molecular weight of the phenoxy resin is preferably 20,000 to 80,000 and more preferably 22,000 to 50,000. The weight average molecular weight of the phenoxy resin can be adjusted by changing the molar ratio of the epoxy resin to the phenolic resin and the reaction time in the reaction described above. In the present description, the weight average molecular weight used is a standard polystyrene-equivalent value measured by gel permeation chromatography (GPC) described later. In the GPC measurement, a high performance GPC (HLC-8420GPC manufactured by TOSOH Corporation) was used as a measurement device, and columns used were TSKgel G5000HxL/G4000HxL/G3000HxL/G2000HxL (manufactured by TOSOH Corporation) connected in series. The eluent used was tetrahydrofuran, and an RI detector was used for the measurement. The phenoxy resin generally means a high-molecular weight epoxy resin. However, in the present description, the term "epoxy resin" means a resin having a weight average molecular weight of less than 10,000 and is distinguished from the phenoxy resin described above.

The phenoxy resin used may be a commercial product, and examples of the commercial product include: 1256 and 1255HX30 (these are bisphenol A skeleton-containing phenoxy resins), 4250 and 4275 (bis A/bis F mixtures), YL6794, YL7213, YL7290, YL7482, YL7553, and YX8100 (bisphenol S skeleton-containing phenoxy resins), X6954 (bisphenol acetophenone skeleton-containing phenoxy resin, and YX7200 (cyclohexane skeleton-containing phenoxy resin), all of which are manufactured by Mitsubishi Chemical Corporation; YP-70 (bisphenol F-type phenoxy resin), ZX356-2 (bisphenol A and bisphenol F skeleton-containing phenoxy resin), YPB-40PXM40 (bromine-containing phenoxy resin), ERF-001M30 (phosphorus-containing phenoxy resin), and FX-280, FX-293, FX-310 (fluorene skeleton-containing phenoxy resin), all of which are manufactured by NIPPON STEEL Chemical & Material Co., Ltd.; and PKHA, PKHB, PKHB+, PKHC, PKHH, PKHJ, and PKFE, all of which are manufactured by Gabriel Phenoxies.

In the present invention, it is preferable that the resin layer (C) contains an epoxy resin in combination with the phenoxy resin described above. By using the epoxy resin in combination with the phenoxy resin, the adhesion to the plating layer in an ordinary state and after the long-term heat resistance test is further improved.

Examples of the epoxy resin include a bisphenol A-type epoxy resin, a bisphenol F-type epoxy resin, a biphenyl-type epoxy resin, a cresol novolac-type epoxy resin, a phenol novolac-type epoxy resin, a bisphenol A novolac-type epoxy resin, an alcohol ether-type epoxy resin, a tetrabromobisphenol A-type epoxy resin, a naphthalene-type epoxy resin, a phosphorus-containing epoxy compound having a structure derived from a 9,10-dihydro-9-oxa-10-phosphaphenanthrene-10-oxide derivative, an epoxy resin having a structure derived from a dicyclopentadiene derivative, and epoxidized products of fats and oils such as epoxidized soybean oil. One of these epoxy resins may be used alone, or a combination of two or more may be used.

The epoxy resin used in combination with the phenoxy resin is preferably an aromatic epoxy resin such as a bisphenol A-type epoxy resin, a bisphenol F-type epoxy resin, a biphenyl-type epoxy resin, a cresol novolac-type epoxy resin, a phenol novolac-type epoxy resin, or a bisphenol A novolac-type epoxy resin, more preferably a liquid epoxy resin, and particularly preferably a bisphenol A-type epoxy resin because the adhesion to the metal plating layer (E) described later can be further improved.

The epoxy equivalent of the epoxy resin is preferably 100 to 5,000 g/eq, more preferably 120 to 2,000 g/eq, and still more preferably 120 to 250 g/eq because the adhesion can be further improved.

When the resin layer further contains the epoxy resin in addition to the phenoxy resin, the mixing mass ratio of the phenoxy resin to the epoxy resin is preferably 90:10 to 10:90 and more preferably 85:15 to 15:80.

In the present invention, when the phenoxy resin is used for the resin layer (C), an epoxy group at a terminal end of the phenoxy resin reacts with a basic nitrogen atom-containing group included in the plating seed layer (B), so that the adhesion at the interface between the plating seed layer (B) and the resin layer (C) is improved. The phenoxy resin may be used in combination with another resin.

The resin layer (C) formed through the heating process described above may include remaining functional groups [X] unreacted with the basic nitrogen atom-containing group or phosphate group included in the compound (b1).

As described above, in the resin layer (C), it is necessary that the basic nitrogen atom-containing groups or phosphate groups included in the plating seed layer (B) and the functional groups [X] included in the resin layer (C) be reacted with each other under heating etc. The resin layer (C) after drying may be fully cured or may be semi-cured. The present method includes laminating a surface of the resin layer (C) of the transfer layered body described later to the support (D) and removing the temporary support (A) of transfer layered body to thereby form an electrically conductive pattern on the support (D). It is therefore preferable that the resin layer (C) is semi-cured in order to obtain the adhesion to the support (D).

The resin layer (C) may be disposed on part or all of the surface of the plating seed layer (B) present on the temporary support layer (A) and may be disposed on one side or both sides of the temporary support (A). For example, when an electrically conductive pattern is formed on the surface of the support (D) described later, the transfer layered body used may include the resin layer (C) over the entire surface of the temporary support (A) and the plating seed layer (B) only under necessary portions of the resin layer (C). In another electrically conductive pattern, the resin layer (C) may be disposed only on portions of the surface of the temporary support (A) on which the plating seed layer (B) is disposed.

The number of resin layers (C) may be one or may be two or more. When two or more resin layers (C) are formed, for example, the layer close to the plating seed layer can improve the adhesion to the plating seed layer (B), and the resin layer (C) close to the support (D) described later in the final state can improve the adhesion to the support (D). The first resin layer (C) close to the plating seed layer (C) is a layer close to the plating seed layer (B) and the metal plating layer (E) described later and is a portion close to copper traces after the formation of an electrically conductive pattern. Therefore, the resin layer (C) may be formed by selecting a suitable resin composition for the purpose of improving insulation reliability.

The coating material for the resin layer (C) is applied to the surface of the plating seed layer (B) formed on the surface of the temporary support (A), and it is preferable to add an organic solvent to the coating material in order to obtain a viscosity suitable for application. Examples of the organic solvent include toluene, ethyl acetate, methyl ethyl ketone, methyl isobutyl ketone, cyclohexanone, isopropyl alcohol, diacetone alcohol, ethylene glycol, and toluene. One of these solvent may be used alone, or a combination of two or more may be used.

Preferably, the amount of the organic solvent used may be appropriately adjusted according to the coating method used to coat the plating seed layer (B) and the desired thickness of the resin layer (C).

If necessary, well-known additives such as a film-forming aid, a leveling agent, a thickener, a water-repellent agent, an antifoaming agent, and an antioxidant may be appropriately added to the coating material for the resin layer (C).

The resin layer (C) can be formed by applying the resin layer (C) to part or all of the plating seed layer (B) formed on the surface of the temporary support (A) and then removing the organic solvent contained in the coating material for the resin layer (C).

Examples of the method for applying the coating material for the resin layer (C) include an inkjet printing method, a reverse printing method, a screen printing method, an offset printing method, a gravure printing method, a flexographic printing method, a pad printing method, a spin coating method, a spray coating method, a bar coating method, a die coating method, a slit coating method, a roll coating method, a dip coating method, a rotary coating method, a capillary coating method, a micro gravure printing method, and a doctor roll method.

In the above method, the coating material for the resin layer (C) is applied to the surface of the plating seed layer (B) formed on the surface of the temporary support (A), and then the organic solvent contained in the coating layer is removed. In this method, the coating material is generally dried using, for example, a dryer to volatilize the organic solvent. It is necessary to set the drying temperature within a temperature range in which the organic solvent used can be volatilized, in which the support (A) is not adversely affected, e.g., thermally deformed, and in which the functional groups [X] included in the resin layer (C) and the basic nitrogen atom-containing groups or the phosphate groups included in the plating seed layer (B) can react with each other.

The drying temperature for the resin layer (C) is preferably in the range of 50° C. to 400° C., more preferably in the range of 80° C. to 340° C., preferably in the range of 120° C. to 280° C., and still more preferably in the range of 150° C. to 200° C.

The thickness of the resin layer (C) depends on the intended application. However, the thickness is preferably in the range in which the adhesion between the resin layer (C) and the support (D) described later can be further improved. The thickness of the resin layer (C) is preferably in the range of 10 nm to 30 μm, more preferably in the range of 50 nm to 1 μm, still more preferably in the range of 100 nm to 800 nm, and yet more preferably in the range of 200 nm to 500 nm.

If necessary, the surface of the resin layer (C) may be subjected to surface treatment in advance using plasma discharge treatment such as corona discharge treatment, a dry treatment method such as a UV treatment method, or a wet treatment method using water, an acidic or alkaline chemical, or an organic solvent because, in a laminate prepared by laminating a surface of the resin layer (C) of the transfer layered body described later to the support (D) and removing the temporary support (A), the adhesion between the resin layer (C) and the support (D) can be further improved.

Next, the support (D) will be described.

The support (D) is used as a substrate for forming an electrically conductive pattern, and a different support (D) must be used depending on the intended application such as a printed wiring board, a flexible printed wiring board, a rigid printed wiring board, a package substrate, a ceramic substrate, a glass substrate, a silicon wafer substrate, a metal substrate, an electromagnetic shielding film, or a molded interconnect device.

Examples of the material of the support (D) include polyimide resins, modified polyimide (MPI) resins, polyamide-imide resins, polyamide resins, polyethylene terephthalate resins, polybutylene terephthalate resins, polyethylene naphthalate resins, polycarbonate resins, acrylonitrile-butadiene-styrene (ABS) resins, polyarylate resins, polyacetal resins, acrylic resins such as polymethyl (meth) acrylate, polyvinylidene fluoride resins, polytetrafluoroethylene resins, polyvinyl chloride resins, polyvinylidene chloride resins, vinyl chloride resins obtained by graft-copolymerizing acrylic resins, polyvinyl alcohol resins, polyethylene resins, polypropylene resins, urethane resins, cycloolefin resins, polystyrene, liquid crystal polymers (LCPs), polyether ether ketone (PEEK) resins, polyphenylene sulfides (PPSs), polyphenylene sulfones (PPSUs), polyphenylene ethers (PPEs), bismaleimide-triazine resins (BT resins), fluorocarbon resin composite polyimide resins (a film including a fluorocarbon resin layer on the surface of a polyimide resin), thermoplastic polyimide resin composite polyimide resins (a film including a thermoplastic polyimide resin layer formed on the surface of a polyimide resin), cellulose nanofibers, silicon, silicon carbide, gallium nitride, sapphire, ceramics, glass, diamond-like carbon (DLC), and alumina.

Preferably, the support (D) used may be a resin substrate containing a thermosetting resin and an inorganic filler. Examples of the thermosetting resin include epoxy resins, phenolic resins, unsaturated imide resins, cyanate resins, isocyanate resins, benzoxazine resins, oxetane resins, amino resins, unsaturated polyester resins, allyl resins, dicyclopentadiene resins, silicone resins, triazine resins, melamine resins, liquid crystal polymers (LCPs), polyether ether ketone (PEEK) resins, polyphenylene sulfides (PPSs), polyphenylene sulfones (PPSUs), and polyphenylene ethers (PPEs). Examples of the inorganic filler include silica, alumina, talc, mica, aluminum hydroxide, magnesium hydroxide, calcium carbonate, aluminum borate, and borosilicate glass. One of these thermosetting resins may be used alone, or a combination of two or more may be used. One of these inorganic fillers may be used alone, or a combination of two or more may be used.

The inorganic filler used may be in a powder form, a flake form, a fiber form, etc.

The support (D) may be in any form such as a flat flexible form, a rigid form, or a rigid flexible form. More specifically, the support (D) used may be a commercial material formed into a film, a sheet, or a plate or may be a material formed using a solution, melt, or dispersion of any of the above resins into a flat shape. The support (D) may be a substrate prepared by disposing any of the above resin materials on an electrically conductive material such as a metal or may be a substrate prepared by stacking any of the above resin materials on a printed wiring board having a circuit pattern formed thereon. Any stacking method may be used. When the support (D) is a semi-cured support such as a prepreg, the support (D) may be laminated to a printed wiring board having a circuit pattern under heat and pressure. When the support (D) is a fully cured support, an adhesive sheet such as a bonding sheet is used to stack the support (D).

When the support (D) is used for a flexible wiring board, the resin used may be a polyimide resin, a modified polyimide (MPI) resin, a transparent polyimide, a polytetrafluoroethylene resin, a cycloolefin resin, polystyrene, a liquid crystal polymer (LCP), polyphenylene sulfide (PPS), polyamide, a fluorocarbon resin composite polyimide resin (a film including a fluorocarbon resin layer on the surface of a polyimide resin or a multilayer film prepared by alternately stacking a polyimide resin and a fluorocarbon resin), or a thermoplastic polyimide resin composite polyimide resin (a film including a thermoplastic polyimide resin layer formed on the surface of a polyimide resin).

No particular limitation is imposed on the thickness of the support (D) when the support (D) has a film or sheet shape. In consideration of flexibility and bendability, the thickness is generally about 1 to about 5,000 μm, more preferably 1 to 500 μm, and still more preferably 1 to 200 μm.

When the support (D) is a rigid wiring board, the rigid wiring board used may be, for example, a glass fiber-epoxy resin composite substrate (a glass-epoxy resin, FR-4, FR-5), a paper-epoxy resin composite substrate (FR-3), a glass nonwoven fabric-epoxy resin composite substrate (CEM-3), a paper-glass nonwoven fabric-epoxy resin composite substrate (CEM-1), a paper-phenolic resin composite substrate (a paper-phenolic resin, FR-1, FR-2), a glass fiber-PPE resin composite substrate (e.g., MEGTRON 6 manufactured by Panasonic Corporation), a bismaleimide-triazine resin (BT resin), a silica-epoxy resin composite substrate (e.g., a build-up film manufactured by Ajinomoto Co., Inc.), a polyimide, a liquid crystal polymer, polyether ether ketone, polyphenylene sulfide, polystyrene, polycarbonate, a polyester resin, polypropylene, polyethylene, an acrylic resin, a urethane resin, a cycloolefin polymer, glass, silicon, silicon carbide, gallium nitride, gallium oxide, sapphire, ceramic, alumina ceramic, alumina, glass, diamond-like carbon, aluminum, stainless steel, copper, silver, gold, iron, or nickel.

Other examples of the support (D) include synthetic fibers such as polyester fibers, polyamide fibers, and polyaramide fibers, inorganic fibers such as carbon fibers, and natural fibers such as cellulose nanofibers.

When the support (D) is used for a printed wiring board required to support high frequency transmission, it is preferable that the surface of the support (D) is smooth. In a 5th generation mobile communication system (5G) and in millimeter wave communications, the frequency of an AC current used for high-speed communications is high. The higher the frequency, the more likely the skin effect in which a current flows through a surface layer of a copper trace is to occur. If the outermost layer of copper traces through which a current flows has large surface irregularities, the irregularities may serve as a resistance, causing an increase in transmission loss. Therefore, it is preferable that the surface of the support (D) is smooth. The surface roughness (maximum height Sz) measured using a laser microscope is preferably in the range of 0.001 to 30 μm, preferably in the range of 0.01 to 20 μm, and more preferably in the range of 0.05 to 10 μm. The surface roughness (maximum height Sz) is a value measured by an evaluation method described in ISO 25178 and represents the distance from the highest point on the surface to the lowest point.

Examples of the method for smoothing the support (D) include a method in which the surface of the support (D) is physically smoothed and a method in which the surface of the support (D) is chemically smoothed. Examples of the physical smoothing method include calendering in which the support (D) is caused to pass between smooth rolls to smoothen the surface, cutting, grinding, abrasive polishing, discharge processing, laser processing, and water jet processing. Examples of the chemical smoothing method include electropolishing and etching.

When the support (D) is an uncured or semi-cured thermosetting or thermoplastic resin, the smoothing processing can be performed using the following method. A smooth metal foil such as a copper or aluminum foil or a smooth heat-resistant film such as a polyimide or a fluorocarbon film is used as a smoothing treatment substrate, and the smooth surface is laminated to the surface of the support (D) by thermocompression bonding and then removed to thereby transfer the smooth surface to the surface of the support (D). In particular, when the support (D) is a substrate for a rigid board containing a thermosetting resin such as an epoxy resin or a polyphenylene ether resin, glass fibers, and an inorganic filler, the surface of the substrate can be smoothened by thermocompression-bonding a smooth surface of a copper foil to the substrate using, for example, a press and then etching the copper foil using copper chloride or iron chloride to remove the copper foil. The surface roughness of the smoothing treatment substrate affects the surface roughness of the support (D) to be smoothened. Therefore, it is preferable that the surface roughness of the smoothing treatment substrate is small, and the surface roughness (maximum height Sz) measured using a laser microscope is preferably in the range of 0.001 to 30 μm, preferably in the range of 0.01 to 20 μm, and more preferably in the range of 0.05 to 10 μm. The surface roughness (maximum height Sz) is measured using an evaluation method described in ISO 25178 and represents the distance from the highest point on the surface to the lowest point.

A surface of the resin layer (C) of the transfer layered body described later is laminated to the support (D), and then the temporary support (A) of the transfer layered body is removed to thereby obtain a laminate in which the resin layer (C) and the plating seed layer (B) are formed on the surface of the support (D). To further improve the adhesion between the resin layer (C) and the support (D), fine irregularities that do not impair smoothness may be formed on the surface of the support (D) as needed, or the support (D) may be subjected to surface treatment in order to introduce functional groups such as hydroxyl groups, carbonyl group, or carboxyl groups. Examples of the surface treatment method include plasma discharge treatment such as corona discharge treatment, dry treatment such as UV treatment, and wet treatment using water, an aqueous solution of an acid, an alkali, etc., an organic solvent, etc.

Next, a method for transferring the transfer layered body to the support (D) will be described.

The transferring method used may include laminating a surface of the resin layer (C) of the transfer layered body to the support (D) using heat and pressure. Examples of the method that can be used include, but not particularly limited to, a thermal lamination method, a solventless lamination method, an extrusion lamination method, a wet lamination method, a heat roll transfer method, an in-mold transfer method, a pressing method, a vacuum pressing method, and a water pressure transfer method.

When the support (D) is a roll film formed of a flexible material, it is preferable to use a thermal lamination method, a solventless lamination method, an extrusion lamination method, or a wet lamination method. A thermal lamination method is more preferred because the treatment is particularly simple. When the support (D) is formed of a rigid material, the support (D) in the form of a flat sheet is generally subjected to thermocompression bonding, and it is preferable to use a pressing method or a vacuum pressing method.

As for the thermocompression bonding conditions, the heating condition is preferably in the range of 50° C. to 400° C., more preferably in the range of 80° C. to 350° C., more preferably in the range of 80° C. to 280° C., more preferably in the range of 100° C. to 200° C., and more preferably in the range of 120 to 180° C. The pressure condition is preferably in the range of 0.05 MPa to 35 MPa, more preferably in the range of 0.3 MPa to 20 MPa, and more preferably in the range of 0.3 MPa to 20 MPa.

When thermal lamination is used, thermocompression bonding is performed using linear pressure between rolls while the transfer layered body and the support (D) are conveyed, and therefore the treatment time of the thermocompression bonding is shorter than or equal to 1 second. When pressing or vacuum pressing is used, the treatment time is preferably in the range of 1 second to 120 minutes, preferably in the range of 30 seconds to 60 minutes, and more preferably in the range of 30 seconds to 15 minutes. The treatment time is preferably in the range of 1 minute to 5 minutes in terms of productivity.

When thermocompression bonding is performed, air may enter the space between the transfer layered body and the support (D), or gas generated from the support (D) and the transfer layered body is accumulated between the transfer layered body and the support (D), causing a reduction in the transfer ratio. It is therefore preferable to perform thermocompression bonding in a vacuum using a vacuum press. As for the vacuum conditions, the absolute pressure is preferably 100 hPa or less, more preferably 50 hPa or less, and more preferably 13 hPa or less. Preferably, the heating and pressure conditions for the treatment are the same as those described above.

Next, a description will be given of a method for laminating a surface of the resin layer (C) of the transfer layered body to the support (D) and then removing the temporary support (A).

No particular limitation is imposed on the method for removing the temporary support (A). However, if the adhesion between the support (D) and the resin layer (C) during the thermocompression bonding is low (if they are in a temporarily bonded state), the resin layer (C) and the plating seed layer (B) may not be sufficiently transferred to the support (D) and may partially remain on the transfer layered body side. Therefore, the peeling direction and the peeling rate of the temporary support (A) during peeling are important. Specifically, the temporary support (A) is peeled off from the support (D) in a diction of preferably 90 degrees to 180 degrees with respect to the support (D), preferably in a diction in the range of 120 degrees to 180 degrees, and preferably in a diction in the range of 150 degrees to 180 degrees. During peeling, it is preferable not to peel off the support (D) but to peel off the temporary support (A) at the angle described above. The peeling speed is preferably in the range of 0.01 m/minute to 20 m/minute, more preferably in the range of 0.05 to 10 m/minute, and more preferably in the range of 0.5 to 5 m/minute.

Next, a description will be given of post-treatment performed on the laminate prepared by laminating the surface of the resin layer (C) of the transfer layered body to the support (D) and then removing the temporary support (A) of the transfer layered body.

As described above, heat treatment may be performed in order to reduce the resistance of the plating seed layer, to fully cure the semi-cured resin layer (C), to allow the functional group [X] included in the compound (c1) contained in the resin layer (C) and the basic nitrogen atom-containing group or the phosphate group included in the dispersant (b1) contained in the plating seed layer (B) to react with each other to form a bond, and to further improve the adhesion between the support (D) and the resin layer (C). The heat treatment condition is preferably in the range of 80° C. to 400° C., more preferably in the range of 100° C. to 350° C., more preferably in the range of 120° C. to 325° C., and more preferably in the range of 150° C. to 300° C. The heat treatment time is preferably in the range of 1 second to 168 hours and more preferably in the range of 30 seconds to 72 hours and is still more preferably in the range of 1 minute to 30 minutes in terms of productivity.

In the next step, the metal plating layer (E) or the patterned resist described later is formed on the surface of the plating seed layer (B). It is therefore preferable to perform cleaning treatment for cleaning out components that reduce the adhesion of the metal plating layer (E) or the patterned resist described later to the plating seed layer (B). When the temporary support (A) is, for example, a resin film, examples of the components that reduce the adhesion include an oligomer component that is present in the film and bleeds to the surface of the film. Examples of the components when the release layer is formed on the temporary support (A) include a component of the release agent partially having migrated to the plating seed layer (C). Examples of the components when the temporary support (A) is a metal include a metal oxide coating on the temporary support. Examples of the cleaning treatment include oxidative decomposition in which organic substances present on the surface of the plating seed layer (B) are heated, plasma discharge treatment such as corona discharge treatment, a dry treatment method such as a UV treatment method, and a wet treatment method using water, an aqueous solution of an acid, an alkali, etc., water containing ozone (ozone nanobubbles), or an organic solvent.

The metal plating layer (E) included in the laminate of the invention is, for example, a layer disposed for the purpose of forming a highly reliable wiring pattern that is prevented from breaking for a long time when the laminate is used for a printed wiring board etc. and that can maintain good current conducting ability.

When the plating seed layer (B) is formed over the entire surface of the support (D), the metal plating layer (E) is also formed over the entire surface of the support (D). When the plating seed layer (B) is present on part of the support (D), the metal plating layer (E) is formed only on the portions in which the plating seed layer (B) is present.

The metal plating layer (E) is a layer formed on the plating seed layer (B), and a dry plating method or a wet plating method can be used to form the metal plating layer (E). Examples of the dry plating method include a metal vapor deposition method and a metal sputtering method. Examples of the wet plating method include an electroplating method and an electroless plating method. It is preferable to use a wet plating method because the metal plating layer (E) can be formed easily. A combination of two or more plating methods may be used. For example, the metal plating layer (E) may be formed by performing electroless plating followed by electroplating. When the plating seed layer (B) has electrical conductivity, it is preferable to perform electroplating directly on the plating seed layer (B) because the plating cost for forming the electrically conductive pattern can be reduced.

The electroless plating method is a method in which, for example, an electroless plating solution is brought into contact with the metal forming the plating seed layer (B) to allow a metal such as copper contained in the electroless plating solution to precipitate to thereby form an electroless plating layer (coating) formed of a metal coating.

Examples of the electroless plating solution include a solution containing a metal such as copper, silver, gold, nickel, chromium, cobalt, or tin, a reducing agent, and a solvent such as a water-based solvent or an organic solvent.

Examples of the reducing agent include dimethylaminoborane, hypophosphorous acid, sodium hypophosphite, dimethylamineborane, hydrazine, formaldehyde, sodium borohydride, and phenol.

The electroless plating solution used may be a solution optionally containing a complexing agent, and examples of the complexing agent include: organic acids such as monocarboxylic acids such as acetic acid and formic acid, dicarboxylic acid compounds such as malonic acid, succinic acid, adipic acid, maleic acid, and fumaric acid, hydroxycarboxylic acid compounds such as malic acid, lactic acid, glycolic acid, gluconic acid, and citric acid, amino acid compounds such as glycine, alanine, iminodiacetic acid, arginine, aspartic acid, and glutamic acid, and amino polycarboxylic acid compounds such as iminodiacetic acid, nitrilotriacetic acid, ethylenediaminediacetic acid, ethylenediaminetetraacetic acid, and diethylenetriaminepentaacetic acid; soluble salts of the above organic acids (such as sodium salts, potassium salts, or ammonium salts); and amine compounds such as ethylenediamine, diethylenetriamine, and triethylenetetramine.

The electroplating method is a method for forming an electroplating layer (metal coating). For example, an electroplating solution is brought into contact with the metal forming the plating seed layer (B) or the surface of an electroless plating layer (coating) formed by the electroless plating, and an electric current is applied while this state is maintained. Then a metal such as copper contained in the electroplating solution is precipitated on the electrically conductive material (b2) forming the plating seed layer (B) serving as a cathode or the electroless plating layer (coating) formed by the electroless plating to thereby form the electroplating layer (metal coating).

Examples of the electroplating solution include a solution containing a sulfide of a metal such as copper, nickel, chromium, cobalt, or tin, sulfuric acid, and a water-based solvent. Specific examples include a solution containing copper sulfate, sulfuric acid, and a water-based solvent.

Preferably, the electroless plating solution and the electroplating solution are used at a temperature in the range of 20 to 98° C.

The thickness of the metal plating layer (E) is preferably in the range of 0.01 μm or more and 100 μm or less and more preferably in the range of 0.5 μm or more and 50 μm or less. The thickness of the metal plating layer (E) can be adjusted by controlling the treatment time, the current density, the amount of an additive used for plating, etc. in the plating treatment step of forming the metal plating layer (E).

Examples of a method for patterning the metal plating layer (E) include: photolithography-etching methods such as a subtractive process and a semi-additive process; and a method in which a print pattern on the metal particle layer (C) is plated.

The subtractive process is a method for forming a desired pattern by forming an etching resist layer having a shape corresponding to the desired pattern shape on the metal plating layer (E) included in the laminate of the invention produced in advance and then performing developing treatment using a chemical to dissolve and remove the metal plating layer (E) and the plating seed layer (B) in the portions with the resist removed therefrom. The chemical used can be a chemical containing copper chloride, iron chloride, etc.

The semi-additive process is a method for forming a desired pattern as follows. A surface of the resin layer (C) of the transfer layered body is laminated to the support (D), and then the temporary support (A) of the transfer layered body is removed to thereby prepare a laminate having the resin layer (C) and the plating seed layer (B) formed on the surface of the support (D). If necessary, the plating seed layer (B) is subjected to surface treatment, and a plating resist layer corresponding to the desired pattern is formed on the treated surface. Next, an electroless plating method, an electroplating method, or a combination thereof is used to form the metal plating layer (E), and then the plating resist layer and the plating seed layer (B) in contact therewith are dissolved and removed using a chemical etc. When the plating seed layer (B) is silver, it is preferable that a chemical described later that selectively etches silver is used for the etching.

When it is necessary to provide electrical continuity between the front and back sides of the support (D) or between the front side of the support (D) and the inner copper layer in the semi-additive process, the temporary support (A) is not removed after the surface of the resin layer (C) of the transfer layered body is laminated to the support (D), so that the temporary support (A) can play a role in protecting the surface of the plating seed layer as described later. More specifically, after the transfer layered body is laminated to the support (D), a through hole or a blind hole is formed from the front side of the temporary support (A) using a drill or a laser. Then at least one selected from the group consisting of palladium, an electrically conductive polymer, carbon, and an electrically conductive paste is applied to the surface (wall surface) of the through or blind hole to impart electrical conductivity to the through or blind hole. Then the temporary support (A) of the transfer layered body is removed. If necessary, the plating seed layer (B) is subjected to surface treatment, and a plating resist layer having a shape corresponding to the desired pattern is formed on the treated surface. Next, the metal plating layer (E) is formed by an electroplating method, and the plating resist layer and the plating seed layer (B) in contact therewith are dissolved and removed using a chemical etc. to thereby form the desired pattern. When the plating seed layer (B) is silver, it is preferable that a chemical described later that selectively etches silver is used for the etching.

By imparting electrical conductivity to the through hole or the blind hole using a dry plating method, electrical continuity can be provided between the front and back sides as follows. When it is necessary to provide electrical continuity between the front and back sides of the support (D) or between the front side of the support (D) and the inner copper layer in the semi-additive process, the temporary support (A) is not removed after the surface of the resin layer (C) of the transfer layered body is laminated to the support (D), so that the temporary support (A) can play a role in protecting the surface of the plating seed layer as described later. More specifically, after the transfer layered body is laminated to the support (D), a through hole or a blind hole is formed from the front side of the temporary support (A) using a drill or a laser. Then electrical conductivity is imparted to the surface (wall surface) of the through hole or the blind hole using a dry plating method. Then the temporary support (A) of the transfer layered body is removed. If necessary, the plating seed layer (B) is subjected to surface treatment, and a plating resist layer having a shape corresponding to the desired pattern is formed on the treated surface. Next, the metal plating layer (E) is formed by an electroplating method, and the plating resist layer and the plating seed layer (B) in contact therewith are dissolved and removed using a chemical etc. to thereby form the desired pattern. When the plating seed layer (B) is silver, it is preferable that a chemical described later that selectively etches silver is used for the etching.

Electrical continuity can also be provided between the front and back sides by filling the through hole or the blind hole with an electrically conductive paste. Specifically, after the transfer layered body is laminated to the support (D), a through hole or a blind hole is formed from the front side of the temporary support (A) using a drill or a laser. Then the temporary support (A) of the transfer layered body is removed. If necessary, the plating seed layer (B) is subjected to surface treatment, and a plating resist layer having a shape corresponding to the desired pattern is formed on the treated surface. Next, the metal plating layer (E) is formed by an electroplating method. Then the plating resist layer and the plating seed layer (B) in contact therewith are dissolved and removed using a chemical etc. to thereby form the desired pattern. Next, the through hole or the blind hole is filled with an electrically conductive paste by, for example, a screen printing method, and the electrically conductive paste is heated to provide electrical continuity between the front and back sides.

The temporary support (A) may remain stacked on the plating seed layer (B). In this case, organic and inorganic dust (smears) generated in the step of forming a through hole extending between both sides described later in the printed wiring board production method of the invention is prevented from adhering to the surface of the plating seed layer (B). Moreover, in the step of imparting electrical conductivity to the inner wall surface of the through hole formed, palladium, an electrically conductive polymer, carbon, or an electrically conductive paste is prevented from adhering to the electrically conductive plating seed layer (B), and the plating seed layer (B) is thereby protected.

A method for forming the through hole or the blind hole in the semi-additive process may be appropriately selected from well-known commonly used methods. Examples of the method include drilling, laser processing, and a combination of laser processing and chemical etching of an insulating substrate using a oxidizer, an alkaline chemical, an acidic chemical, etc.

The hole diameter (diameter) of the hole formed by the hole forming process is preferably in the range of 0.01 to 1 mm, more preferably in the range of 0.02 to 0.5 mm, and still more preferably in the range of 0.03 to 0.1 mm.

Organic and inorganic dust (smears) generated during the hole forming process may cause breakage of the electrical connection between both sides, faulty plating deposited in the metal plating step for forming the metal plating layer (E), a reduction in adhesion of the plating, and deterioration of the appearance of the plating. It is therefore preferable to remove the dust (perform desmearing). Examples of the desmearing method include: dry treatment such as plasma treatment and reverse sputtering treatment; and wet treatment such as cleaning treatment using an aqueous solution of an oxidizer such as potassium permanganate, cleaning treatment using an aqueous solution of an alkali or an acid, and cleaning treatment using an organic solvent.

Next, palladium, an electrically conductive polymer, an electrically conductive paste, or carbon is applied to the surface of the thorough or blind hole to impart electrical conductivity to the surface of the through or blind hole.

Electrical conductivity can be imparted to the surface of the through hole with reference to, for example, a method described in "Direct plating" by TOYONAGA Minoru, Circuit Technology, vol. 8, No. 1 (1993) pp. 47-59.

To impart electrical conductivity to the surface of the through hole, one of four systems: (1) a palladium-tin colloidal system, (2) a tin free-palladium system, (3) an electrically conductive polymer system, and (4) a graphite system described in the above reference may be used. An electrically conductive paste may be used to impart electrical conductivity to the surface of the through hole.

In the method for imparting electrical conductivity to the surface of the through hole using a palladium-tin colloid, the surface of the laminate with the through hole formed therein is subjected to cleaner-conditioner treatment. Then the tin-palladium colloid is caused to adsorb on the surface, and the surface is subjected to accelerator treatment to remove tin. A method in which palladium is converted to palladium sulfide may be also used to increase the electrical conductivity.

To impart electrical conductivity to the surface of the through hole using an electrically conductive polymer, a method in which a monomer of a pyrrole derivative is subjected to oxidative polymerization can be used. The surface of the laminate with the through hole formed therein is treated with a conditioner and then treated with an aqueous permanganate solution to form $MnO_2$ on the surface of the through hole formed in the support (D). The surface of the substrate is immersed in an aqueous monomer solution containing high-boiling point alcohol dissolved therein and then immersed in an aqueous dilute sulfuric acid solution. Then polymerization proceeds on the surface coated with $MnO_2$, and an electrically conductive polymer is thereby formed to impart electrical conductivity.

To impart electrical conductivity to the surface of the through hole using graphite, the surface of the laminate having the through hole formed therein is treated with a carbon black suspension solution to cause carbon to adsorb onto the entire surface of the substrate. By treating the surface of the laminate having the through hole formed therein with a conditioner, the surface of the substrate is positively charged. Then negatively charged carbon black is allowed to adsorb onto the surface to impart electrical conductivity.

To impart electrical conductivity to the surface of the through hole using an electrically conductive paste, the following method is used. The electrically conductive paste is applied to the surface of the laminate having the through hole formed therein to thereby impart electrical conductivity to the wall of the through hole and is used as a seed layer for electroplating performed in the subsequent step.

To impart electrical conductivity to the surface of the through hole, any of the methods using palladium, the electrically conductive polymer, carbon, and the electrically conductive paste can be used, or a well-known commonly used commercial process can be used. In the tin-palladium process, a method known as a crimson process, for example, can be used. In the graphite system, a process known as a black hole process or a shadow process, for example, can be used. Among these methods, the method using carbon to impart electrical conductivity is preferably used from the viewpoint of material cost and process cost.

In one method to impart electrical conductivity to the surface of the through hole or the blind hole, the surface of the laminate with the through hole formed therein is treated by a dry plating method. For example, a method in which a film is formed on the surface of the through hole by a vacuum deposition method, an ion plating method, or a sputtering method to impart electrical conductivity can be preferably used. When a dry plating method is used to impart electrical conductivity, no particular limitation is imposed on the metal used for imparting electrical conductivity so long as electrical conductivity can be imparted to the surface of the through hole and connection between both sides by the copper electroplating in the subsequent step is not impaired, and various metals and metal oxides can be used. For example, one of metals such as titanium, nickel, copper, silver, gold, and platinum or a combination of a plurality of metals can be used. When a combination of a plurality of metals is used, the plurality of metals may be deposited simultaneously or sequentially to form a film. Among these metals, copper or silver is preferably used from the viewpoint of electrical conductivity.

Next, the temporary support (A) is removed to expose the plating seed layer (B). This step is the step of exposing the plating seed layer (B) serving as a plating seed layer for forming the metal plating layer (E) in the subsequent step, and the purpose of this step is to remove palladium, the electrically conductive polymer, the electrically conductive paste, carbon, the sputtered metal, or the metal oxide used to impart electrical conductivity to the through hole from the surface other than the through hole.

To remove the temporary support layer (A), it may be removed mechanically, or any commercial removal apparatus may be used. When an alkali soluble resin is used for the temporary support (A), the temporary support (A) can be removed by immersing it in an alkaline solution. A removing solution for a patterned resist described later can be appropriately used as the alkaline solution used for removal, and the removing conditions for the patterned resist can be appropriately used.

Next, after the removal of the temporary support (A), a patterned resist for a circuit pattern is formed on the exposed plating seed layer (B).

In the step of forming the patterned resist, the surface of the plating seed layer (B) may be subjected to surface treatment such as cleansing treatment using an acidic or alkaline cleaning solution, corona treatment, plasma treatment, UV treatment, vapor phase ozone treatment, liquid phase ozone treatment, treatment with a surface treatment agent, etc. before the formation of the resist for the purpose of improving the adhesion to the resist layer. The surface treatment may be performed using one method or a combination of two or more methods.

Examples of the treatment with the surface treatment agent that can be used include: a method described in Japanese Unexamined Patent Application Publication No. 7-258870 in which the treatment is performed using an anticorrosive containing a triazole-based compound, a silane coupling agent, and an organic acid; a method described in Japanese Unexamined Patent Application Publication No. 2000-286546 in which the treatment is performed using an organic acid, a benzotriazole-based anticorrosive, and a silane coupling agent; a method described in Japanese Unexamined Patent Application Publication No. 2002-363189 in which the treatment is performed using a material having a structure in which a nitrogen-containing heterocycle such as triazole or thiadiazole and a silyl group such as a trimethoxysilyl group or a triethoxysilyl group are bonded via an organic group having a thioether (sulfide) bond etc.; a method described in International Publication No. WO2013/186941 in which the treatment is performed using a silane compound having a triazine ring and an amino group; a method described in Japanese Unexamined Patent Application Publication No. 2015-214743 in which the treatment is performed using an imidazole silane compound obtained by reacting a formylimidazole compound and an aminopropylsilane compound; a method described in Japanese Unexamined Patent Application Publication No. 2016-134454 in which the treatment is performed using an azole silane compound; a method described in Japanese Unexamined Patent Application Publication No. 2017-203073 in which the treatment is performed using a solution containing an aromatic compound having an amino group and an aromatic ring in one molecule, a polybasic acid having two or more carboxyl group, and a halide ion; and a method described in Japanese Unexamined Patent Application Publication No. 2018-16865 in which the treatment is performed using a surface treatment agent containing a triazole silane compound.

Next, to form a metal pattern on the surface, the photosensitive resist in the resist layer is patterned by exposure to active light through a photomask or using a direct exposure machine. The amount of exposure may be appropriately set as needed. The latent image formed on the photosensitive resist by exposure to light is removed using a developer to form a patterned resist.

Examples of the developer include a diluted alkaline aqueous solution such as a 0.3% to 2% by mass aqueous sodium carbonate or potassium carbonate solution. A surfactant and an antifoaming agent may be added to the diluted alkaline aqueous solution, and a small amount of organic solvent may be added to facilitate development. The resist is developed by immersing the substrate exposed to light in the developer or spraying the developer onto the resist using a sprayer. As a result of the development, a patterned resist in which the resist in pattern forming portions has been removed can be formed.

When the patterned resist is formed, descumming treatment using plasma may be performed, or a commercial resist residue remover may be used to remove resist residues such as resist deposits remaining on footings formed at the boundary between the cured resist and the substrate and on the surface of the substrate.

The photosensitive resist used in the present invention may be a commercial resist ink, a liquid resist, or a dry film resist and can be appropriately selected according to the resolution of the target pattern, the type of exposure device used, the type of chemical used for plating treatment in the subsequent step, its pH, etc.

Examples of the commercial resist ink include: "Plating resist MA-830" and "Etching resist X-87" manufactured by Taiyo Ink Mfg. Co., Ltd.; etching resists and plating resists manufactured by NAZDAR; and the "Etching resist PLAS FINE PER" series and "Plating resist PLAS FINE PPR" series manufactured by GOO CHEMICAL CO., LTD. Examples of the electrodeposition resist include the "Eagle series" and "PEPR series" available from Dow Chemical Company. Examples of the commercial dry film include: the "PHOTEC" series manufactured by Hitachi Chemical Company, Ltd.; the "ALPHO" series manufactured by Nikko-Materials Co., Ltd.; the "SUNFORT" series manufactured by Asahi Kasei Corporation; and the "RISTON" series manufactured by DuPont.

To produce printed wiring boards efficiently, it is convenient to use a dry resist film. In particular, when a fine circuit is formed, a dry film for a semi-additive process may be used. Examples of the commercial dry film used for this purpose include: "ALFO LDF500" and "NIT2700" manufactured by Nikko-Materials Co., Ltd.; "SUNFORT UFG-258" manufactured by Asahi Kasei Corporation; the "RD series (RD-2015 and 1225)" and the "RY series (RY-5319 and 5325)" manufactured by Hitachi Chemical Company, Ltd.; and the "PlateMaster series (PM200 and 300)" manufactured by DuPont.

Next, a metal plating layer (E) is formed on the plating seed layer (B) with the plating resist formed thereon. The metal plating layer is formed using a wet plating method such as an electroplating method or an electroless plating method. A combination of two or more plating methods may be used. When the photosensitive resist is immersed in an alkaline aqueous solution, the photosensitive resist is removed. It is therefore preferable to form the metal plating layer (E) by an electroplating method.

By using the plating seed layer (B) as a cathode electrode for copper electroplating to perform copper electroplating treatment on the plating seed layer (B) exposed by the development in the manner described above, connection via the copper plating in the through hole in the laminate can be achieved, and at the same time an electrically conductive pattern can be formed.

Before the electrically conductive pattern is formed by the copper electroplating method, the surface of the plating seed layer (B) may be optionally subjected to surface treatment. Examples of the surface treatment that does not cause damage to the surface of the plating seed layer (B) and the resist pattern formed include cleaning treatment using an acidic or alkaline cleaning solution, corona treatment, plasma treatment, UV treatment, vapor phase ozone treatment, liquid phase ozone treatment, and treatment using a surface treatment agent. The surface treatment may be performed using one of these methods or using a combination of two or more methods.

When the electrically conductive pattern is formed after the copper plating, annealing may be performed after the plating for the purpose of relaxing stress in the plating film and improving the adhesion. The annealing may be performed before an etching step described later, after the etching step, or before and after the etching step.

The annealing temperature may be appropriately selected within the temperature range of 40 to 300° C. according to the heat resistance of the substrate used or the intended use purpose. The annealing temperature is preferably in the range of 40 to 250° C. and is more preferably in the range of 40 to 200° C. for the purpose of preventing oxidative deterioration of the plating film. The annealing time may be 10 minutes to 10 days when the annealing temperature is in the range of 40 to 200° C. and may be 5 minutes to 10 hours when the annealing is performed at a temperature exceeding 200° C. When the plating film is annealed, an anticorrosive may be optionally applied to the surface of the plating film.

Next, the patterned resist is removed. After the formation of the electrically conductive pattern by plating as described above, the patterned resist formed using the photosensitive resist is removed, and the plating seed layer (B) in non-pattern-formed portions is removed using an etching solution. The patterned resist may be removed under the recommended conditions described in the brochure or instructions of the photosensitive resist used. The resist remover used to remove the patterned resist may be a commercial resist remover or a 1.5 to 3% by mass aqueous sodium hydroxide or potassium hydroxide solution set to 45 to 60° C. The resist can be removed by immersing the substrate with the pattern formed thereon in the remover or spraying the remover using a sprayer etc.

Preferably, the etching solution used to remove the plating seed layer (B) in the non-pattern-formed portions selectively etches only the plating seed layer (B) and does not etch copper forming the metal plating layer (E). Examples of the etching solution when silver is used for the plating seed layer (B) include a mixture of carboxylic acid and hydrogen peroxide.

Examples of the carboxylic acid include acetic acid, citric acid, formic acid, propionic acid, butyric acid, valeric acid, caproic acid, enanthic acid, caprylic acid, pelargonic acid, capric acid, lauric acid, myristic acid, palmitic acid, margaric acid, stearic acid, oleic acid, linoleic acid, linolenic acid, arachidonic acid, eicosapentaenoic acid, docosahexaenoic acid, oxalic acid, malonic acid, succinic acid, benzoic acid, salicylic acid, phthalic acid, isophthalic acid, terephthalic acid, gallic acid, mellitic acid, cinnamic acid, pyruvic acid, lactic acid, malic acid, citric acid, fumaric acid, maleic acid, aconitic acid, glutaric acid, adipic acid, and amino acid. One of these carboxylic acids may be used alone, or a combination of two or more may be used. It is preferable that, among these carboxylic acids, acetic acid or citric acid is mainly used because the etching solution can be easily produced and can be easily handled.

When the etching solution used is a mixture of carboxylic acid and hydrogen peroxide, the hydrogen peroxide and the carboxylic acid are considered to react with each other to generate percarboxylic acid (peroxycarboxylic acid). It is inferred that the percarboxylic acid generated may preferentially dissolve the silver forming the plating seed layer (B) while dissolution of the copper forming the electrically conductive pattern is prevented.

As for the ratio of the carboxylic acid to the hydrogen peroxide in the mixture, the amount of the hydrogen peroxide with respect to 1 mole of the carboxylic acid is preferably in the range of 2 to 100 moles and more preferably in the range of 2 to 50 moles because dissolution of the copper electrically conductive pattern can be prevented.

The mixture of the carboxylic acid and hydrogen peroxide is preferably an aqueous solution diluted with water. The ratio of the mixture of the carboxylic acid and hydrogen peroxide in the aqueous solution is preferably in the range of preferably 2 to 65% by mass and more preferably in the range of 2 to 30% by mass because the influence of the increase in the temperature of the etching solution can be reduced.

The water used for the dilution is preferably water from which ionic substances and impurities have been removed such as ion exchanged water, pure water, or ultrapure water.

A protective agent for protecting the copper electrically conductive pattern to prevent its dissolution may be further added to the etching solution. The protective agent used is preferably an azole compound.

Examples of the azole compound include imidazole, pyrazole, triazole, tetrazole, oxazole, thiazole, selenazole, oxadiazole, thiadiazole, oxatriazole, and thiatriazole.

Specific examples of the azole compound include 2-methylbenzimidazole, aminotriazole, 1,2,3-benzotriazole, 4-aminobenzotriazole, 1-bisaminomethylbenzotriazole, aminotetrazole, phenyltetrazole, 2-phenylthiazole, and benzothiazole. One of these azole compounds may be used alone, or a combination of two or more may be used.

The concentration of the azole compound in the etching solution is preferably in the range of 0.001 to 2% by mass and more preferably in the range of 0.01 to 0.2% by mass.

Preferably, polyalkylene glycol serving as a protective agent is added to the etching solution because the amount of dissolution of the copper electrically conductive pattern can be reduced.

Examples of the polyalkylene glycol include water-soluble polymers such as polyethylene glycol, polypropylene glycol, and a polyoxyethylene polyoxypropylene block copolymer. Of these, polyethylene glycol is preferred. The number average molecular weight of the polyalkylene glycol is preferably in the range of 200 to 20,000.

The concentration of the polyethylene glycol in the etching solution is preferably in the range of 0.001 to 2% by mass and more preferably in the range of 0.01 to 1% by mass.

An additive such as a sodium, potassium, or ammonium salt of an organic acid may be optionally added to the etching solution in order to reduce the change in pH.

After the electrically conductive pattern is formed, the plating seed layer (B) in the non-pattern-formed portions is removed by immersing the substrate from which the patterned resist formed using the photosensitive resist has been removed in the etching solution or by spraying the etching solution onto the substrate using, for example, a sprayer.

When an etching apparatus is used to remove the plating seed layer (B) in the non-pattern-formed portions, for example, the etching solution with the amounts of all the components adjusted to the desired composition values may be supplied to the etching apparatus. Alternatively, the components of the etching solution may be independently supplied to the etching apparatus and mixed in the apparatus such that the etching solution has the desired composition.

Preferably, the etching solution is used in the temperature range of 10 to 35° C. In particular, when the etching solution used contains hydrogen peroxide, it is preferable to use the etching solution in the temperature range of 30° C. or lower because the decomposition of hydrogen peroxide can be prevented.

After the removal of the plating seed layer (B) using the etching solution, a cleaning operation other than cleaning with water may be performed for the purpose of preventing the silver component dissolved in the etching solution from adhering to and remaining on the printed wiring board. Preferably, a cleaning solution that can dissolve silver oxide, silver sulfide, and silver chloride but dissolves almost no silver is used for the cleaning operation. Specifically, the cleaning chemical used is preferably an aqueous solution containing a thiosulfate or a tris(3-hydroxyalkyl)phosphine or an aqueous solution containing a mercapto carboxylic acid or a salt thereof.

Examples of the thiosulfate include ammonium thiosulfate, sodium thiosulfate, and potassium thiosulfate. Examples of the tris(3-hydroxyalkyl)phosphine include tris (3-hydroxymethyl)phosphine, tris(3-hydroxyethyl)phosphine, and tris(3-hydroxypropyl)phosphine. One of these thiosulfates or tris(3-hydroxyalkyl)phosphines may be used alone, or a combination of two or more may be used.

When an aqueous solution containing a thiosulfate is used, the concentration of the thiosulfate may be appropriately set according to the time of the process, the characteristics of the cleaning apparatus, etc. The concentration is preferably in the range of 0.1 to 40% by mass and is more preferably in the range of 1 to 30% by mass from the viewpoint of the cleaning efficiency and the stability of the chemical during continuous use.

When an aqueous solution containing a tris(3-hydroxyalkyl)phosphine is used, the concentration of the tris(3-hydroxyalkyl)phosphine may be appropriately set according to the time of the process, the characteristics of the cleaning apparatus, etc. The concentration is preferably in the range of 0.1 to 50% by mass and is more preferably in the range of 1 to 40% by mass from the viewpoint of the cleaning efficiency and the stability of the chemical during continuous use.

Examples of the mercapto carboxylic acid include thioglycolic acid, 2-mercaptopropionic acid, 3-mercaptopropionic acid, thiomalic acid, cysteine, and N-acetylcysteine. Examples of the salt of the mercapto carboxylic acid include alkali metal salts, ammonium salts, and amine salts.

When an aqueous solution containing a mercapto carboxylic acid or a salt thereof is used, the concentration of the mercapto carboxylic acid or the salt thereof is preferably in the range of 0.1 to 20% by mass and is more preferably in the range of 0.5 to 15% from the viewpoint of the cleaning efficiency and the process cost when a large amount of the aqueous solution is used.

Examples of the method for performing the cleaning operation include: a method in which the printed wiring board obtained by removing the plating seed layer (B) in the non-pattern-formed portions by etching is immersed in the cleaning chemical; and a method in which the cleaning chemical is sprayed onto the printed wiring board using a sprayer etc. The temperature of the cleaning chemical used may be room temperature (25° C.) and may be set to, for example, 30° C. because the printed wiring board can be cleaned stably without any influence by the outside temperature.

The step of removing the plating seed layer (B) in the non-pattern-formed portions using the etching solution and the cleaning operation may be repeatedly performed as needed.

For the purpose of further improving insulation of the non-pattern-formed portions, the printed wiring board of the invention may be optionally further subjected to a cleaning operation after the removal of the plating seed layer (B) in the non-pattern-formed portions using the etching solution. For example, an alkaline permanganic acid solution obtained by dissolving potassium permanganate or sodium permanganate in an aqueous solution of potassium hydroxide or sodium hydroxide can be used for the cleaning operation.

Examples of the cleaning using the alkaline permanganic acid solution include: a method in which the printed wiring board obtained by the method described above is immersed in the alkaline permanganic acid solution set to 20 to 60° C.; and a method in which the alkaline permanganic acid solution is sprayed onto the printed wiring board using a sprayer etc. For the purpose of improving the alkaline permanganic acid solution wettability of the surface of the substrate to thereby improve the cleaning efficiency, the printed wiring board may be brought into contact with a water-soluble organic solvent having an alcoholic hydroxy group before the cleaning. Examples of the organic solvent include methyl alcohol, ethyl alcohol, n-propyl alcohol, and isopropyl alcohol. One of these organic solvents may be used alone, or a combination of two or more may be used.

The concentration of the alkaline permanganic acid solution may be appropriately selected as needed. It is preferable to use an alkaline permanganic acid solution obtained by dissolving 0.1 to 10 parts by mass of potassium permanganate or sodium permanganate in 100 parts by mass of a 0.1 to 10% by mass aqueous solution of potassium hydroxide or sodium hydroxide. From the viewpoint of cleaning efficiency, it is more preferable to use an alkaline permanganic acid solution obtained by dissolving 1 to 6 parts by mass of potassium permanganate or sodium permanganate in 100 parts by mass of a 1 to 6% by mass aqueous solution of potassium hydroxide or sodium hydroxide.

When the cleaning using the alkaline permanganic acid solution is performed, it is preferable that, after the cleaning with the alkaline permanganic acid solution, the cleaned printed wiring board is treated with a liquid having a neutralization-reduction action. Examples of the liquid having the neutralization-reduction action include 0.5 to 15% by mass dilute sulfuric acid and an aqueous solution containing an organic acid. Examples of the organic acid include formic acid, acetic acid, oxalic acid, citric acid, ascorbic acid, and methionine.

The cleaning with the alkaline permanganic acid solution may be performed before the cleaning performed for the purpose of preventing the silver component dissolved in the etching solution from adhering to and remaining on the printed wiring board, or only the cleaning with the alkaline permanganic acid solution may be performed instead of the cleaning performed for the purpose of preventing the silver component dissolved in the etching solution from adhering to and remaining on the printed wiring board.

The laminate of the invention may be used to obtain a printed wiring board. If necessary, the printed wiring board obtained may be appropriately subjected to nickel/gold plating, nickel/palladium/gold plating, or palladium/gold plating for the purpose of depositing a cover lay film on the circuit pattern or of forming a solder resist layer, or as final surface treatment of the circuit pattern.

Next, drawings for a method for producing a transfer layered body and a method for producing electrically conductive patterns will be described.

Figure 3:
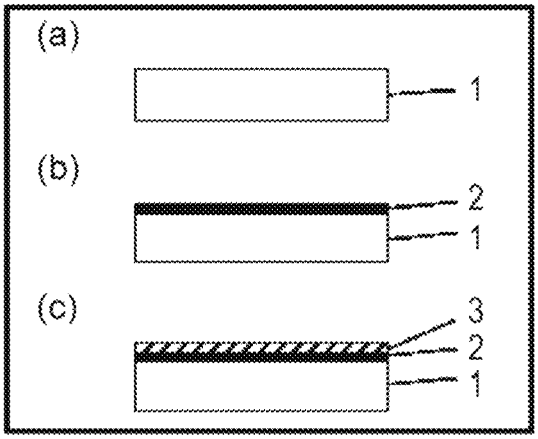
FIG. 3 shows cross-sectional views of sequential steps in a transfer layered body production method of the invention.

FIG. 3 shows a method for producing a transfer layered body. The transfer layered body is obtained by forming a plating seed layer (B) over the entire surface of a temporary support (A) and then forming a resin layer (C).

Figure 4:
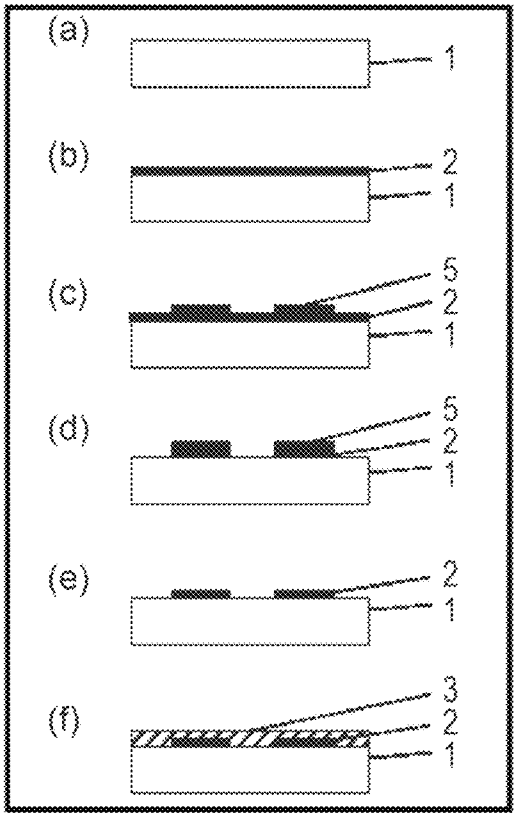
FIG. 4 shows cross-sectional views of sequential steps in a transfer layered body production method of the invention.

FIG. 4 shows a method for producing a transfer layered body. The transfer layered body is obtained by forming a plating seed layer (B) on a surface of a temporary support (A), forming an electrically conductive pattern using a patterned resist by etching, removing the patterned resist, and then forming a resin (C) over the entire surface of the temporary support (A).

Figure 5:
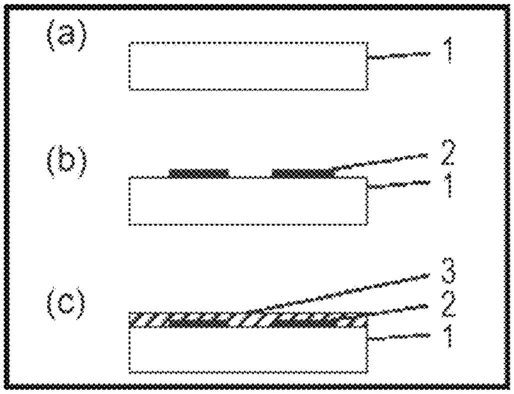
FIG. 5 shows cross-sectional views of sequential steps in a transfer layered body production method of the invention.

FIG. 5 shows a method for producing a transfer layered body. The transfer layered body is obtained by forming a pattered plating seed layer (B) on a surface of a temporary support (A) using a printing method and then forming a resin (C) over the entire surface of the temporary support (A).

Figure 6:
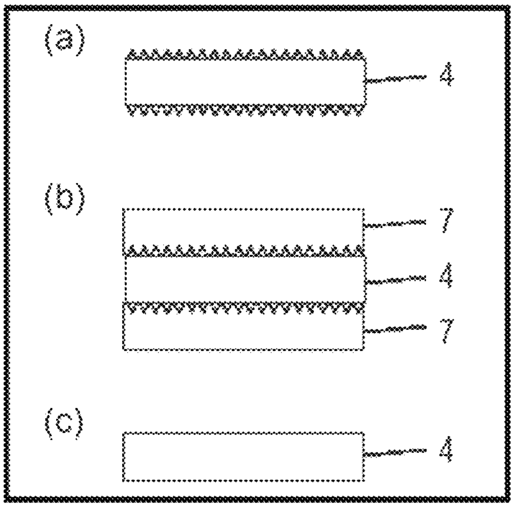
FIG. 6 shows cross-sectional views of sequential steps in a production method for smoothing surfaces of a support (D).

FIG. 6 shows the step of smoothing the surfaces of a support (D). When the surfaces of the support (D) are sufficiently smooth, it is not always necessary to perform this step. Smoothing treatment substrates such as smooth metal foils or smooth heat resistant films are laminated to a support (D) having large surface irregularities using a hot press or a vacuum press such that their smooth surfaces face the support (D). Then the laminated metal foils or the laminated heat resistant films are physically or chemically removed, and a smooth support (D) can thereby be obtained.

Figure 7:
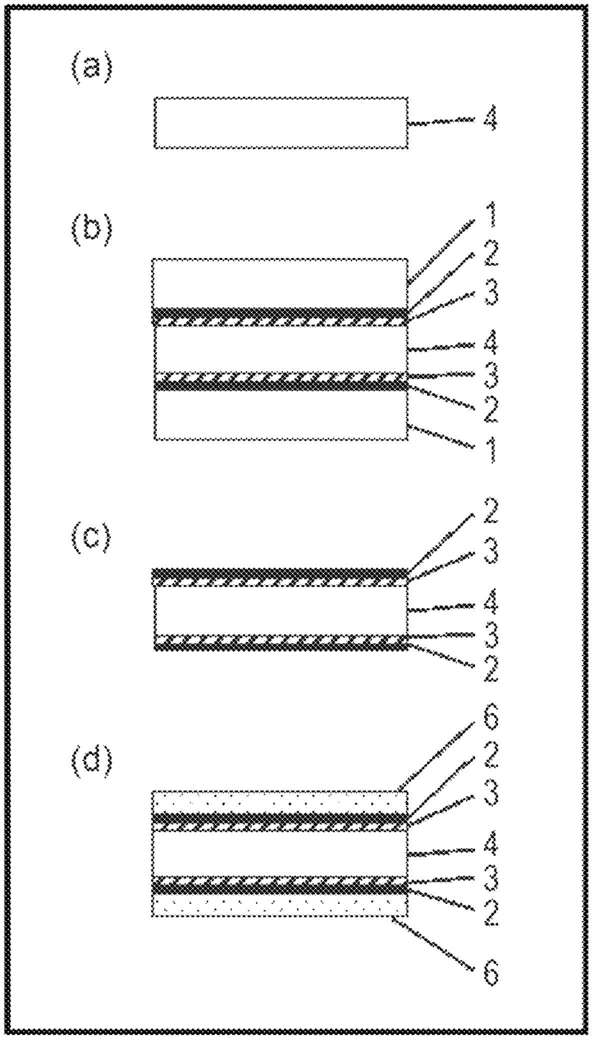
FIG. 7 shows cross-sectional views of sequential steps in an electrically conductive pattern production method including laminating transfer layered bodies to both sides of a support (D), removing temporary supports (A), and forming a metal plating layer (E).

FIG. 7 shows a method for producing electrically conductive patterns using transfer layered bodies obtained in the manner shown in FIG. 3. In this electrically conductive pattern production method, the transfer layered bodies each having a plating seed layer (B) and a resin layer (C) formed over the entire surface of a temporary support (A) are laminated to both sides of a support (D) such that the surfaces of the transfer layered bodies that are formed by the resin layers (C) face the support (D). Then the temporary supports (A) of the laminated transfer layered bodies are removed to form the resin layers (C) and the plating seed layers (B) on both sides of the support (D), and then a metal plating layer (E) is formed. In FIG. 7, the transfer layered bodies are laminated to both sides of the support (D). However, a transfer layered body may be laminated to only one side.

Figure 8:
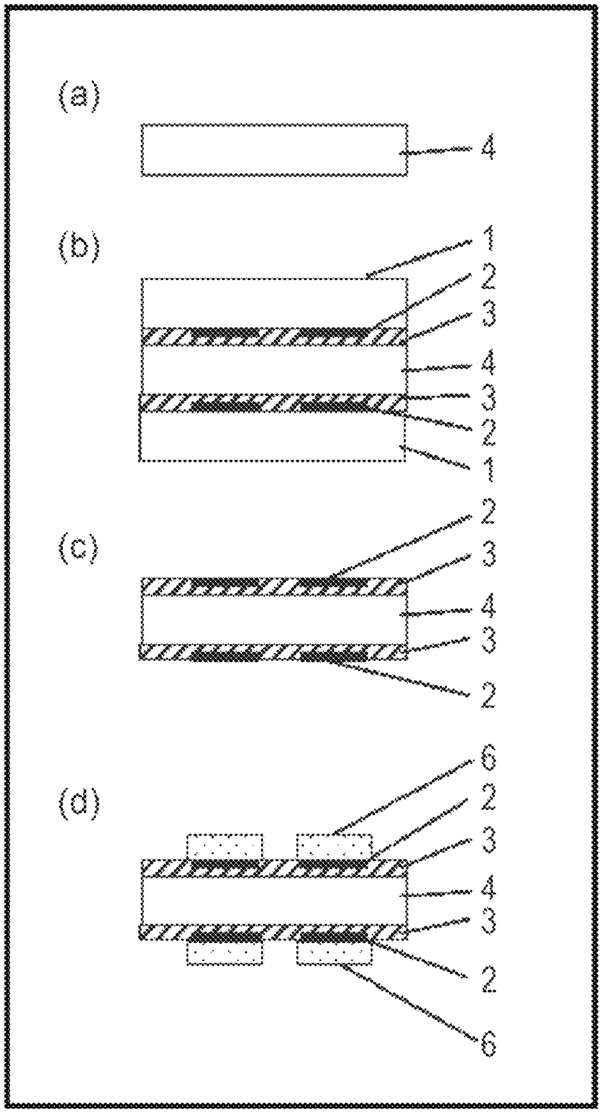
FIG. 8 shows cross-sectional views of sequential steps in an electrically conductive pattern production method including laminating transfer layered bodies to both sides of a support (D), removing temporary supports (A), and forming a metal plating layer (E).

FIG. 8 shows a method for producing electrically conductive patterns using transfer layered bodies obtained in the manner shown in FIG. 4 or 5. In this electrically conductive pattern production method, each of the transfer layered bodies used is prepared by forming a patterned plating seed layer (B) on part of a surface of a temporary support (A) using a patterned resist or a printing method and forming a resin (C) over the entire surface of the temporary support (A), and the surfaces of the transfer layered bodies that are formed by the resin layers (C) are laminated to a support (D). Then the temporary supports (A) of the laminated transfer layered bodies are removed to form the resin layers (C) and the plating seed layers (B) on both sides of the support (D), and then a metal plating layer (E) is formed. In FIG. 8, the transfer layered bodies are laminated to both sides of the support (D). However, a transfer layered body may be laminated to only one side.

Figure 9:
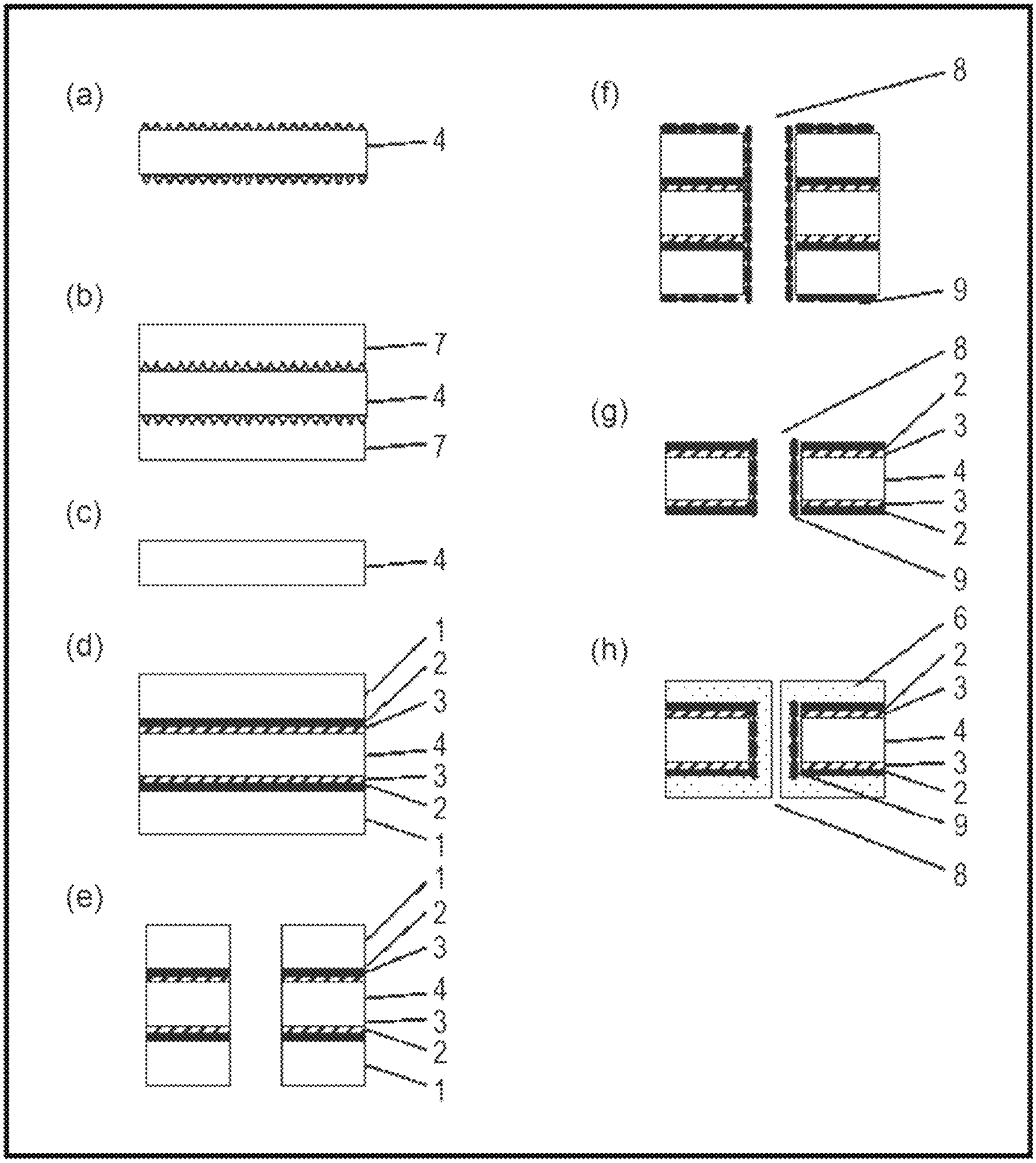
FIG. 9 shows cross-sectional views of sequential steps in an electrically conductive pattern production method including laminating transfer layered bodies to both sides of a support (D), forming a through hole, subjecting the through hole to treatment for imparting electrical conductivity, then removing temporary supports (A), and forming a metal plating layer (E).

FIG. 9 shows a method for producing electrically conductive patterns using transfer layered bodies obtained in the manner shown in FIG. 3, and electrical continuity is provided between the front and back sides of the support (D) using a through hole.

In this electrically conductive pattern production method, at least one side of an irregular support (D) is laminated with a smooth metal foil or a smooth heat resistant film using a hot press etc. such that its smooth surface faces the support (D), and the laminated metal foil or heat resistant film is removed to smoothen the support (D). Then the transfer layered bodies each having a plating seed layer (B) and a resin layer (C) formed over the entire surface of a temporary support (A) are laminated to the support (D) such that the surfaces of the transfer layered bodies that are formed by the resin layers (C) face the smoothed surfaces of the support (D). Then a through hole passing through the temporary supports (A) of the transfer layered bodies on both sides is formed, and palladium, an electrically conductive polymer, an electrically conductive paste, or carbon is applied to the transfer layered bodies and the surface of the through hole to impart electrical conductivity to the surface of the through hole. Then the temporary supports (A) are removed, and a metal plating layer (E) is formed on the plating seed layers (B) and in the through hole. In FIG. 9, the support (D) is subjected to the smoothing treatment. However, when the surfaces of the support (D) are sufficiently smooth, it is not always necessary to perform the smoothing treatment. In this example, the transfer layered bodies obtained in the manner shown in FIG. 3 are used. However, transfer layered bodies each having a patterned plating seed layer (B) formed thereon and obtained in the manner shown in FIG. 4 or 5 may also be used. In this example, the transfer layered bodies are laminated to both sides of the support (D). However, a transfer layered body may be laminated to only one side, and another electrically conductive pattern such as a copper foil may be laminated to the other side.

Figure 10:
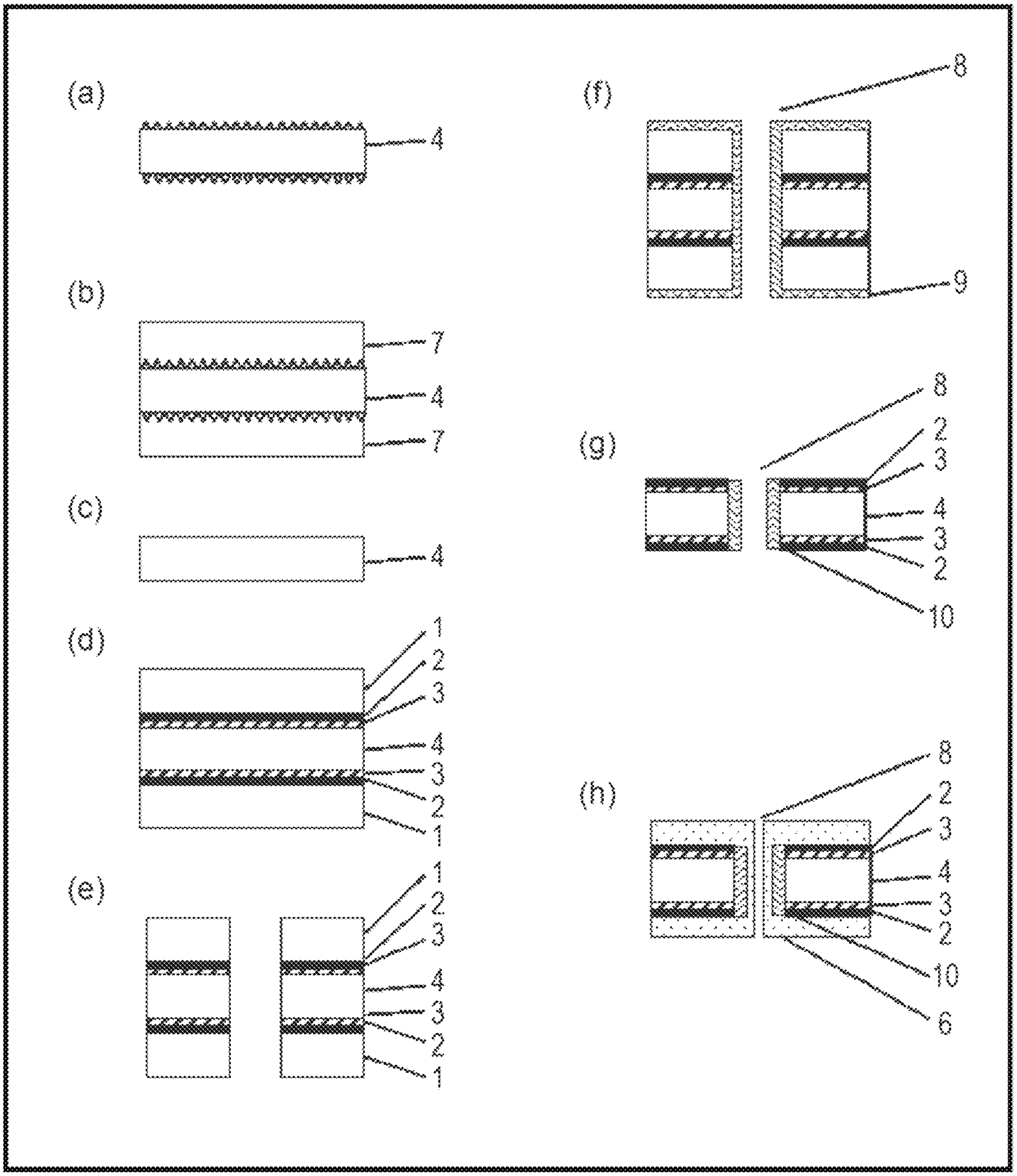
FIG. 10 shows cross-sectional views of sequential steps in an electrically conductive pattern production method including laminating transfer layered bodies to both sides of a support (D), forming a through hole, subjecting the through hole to treatment for imparting electrical conductivity, then removing temporary supports (A), and forming a metal plating layer (E).

FIG. 10 shows a method for producing electrically conductive patterns using transfer layered bodies obtained in the manner shown in FIG. 3, and electrical continuity is provided between the front and back sides of a support (D) via a through hole.

In this electrically conductive pattern production method, at least one side of an irregular support (D) is laminated with a smooth metal foil or a smooth heat resistant film using a hot press etc. such that its smooth surface faces the support (D), and the laminated metal foil or heat resistant film is removed to smoothen the support (D). Then the transfer layered bodies each having a plating seed layer (B) and a resin layer (C) formed over the entire surface of a temporary support (A) are laminated to the support (D) such that the surfaces of the transfer layered bodies that are formed by the resin layers (C) face the smoothed surfaces of the support (D). Then a through hole passing through the temporary supports (A) of the transfer layered bodies on both sides is formed, and a metal film is formed on the transfer layered bodies and the surface of the through hole using a dry plating method such as a vapor deposition method or a sputtering method to impart electrical conductivity to the surface of the through hole. Next, the temporary supports (A) are removed, and a metal plating layer (E) is formed on the plating seed layers (B) and in the through hole. In FIG. 10, the support (D) is subjected to the smoothing treatment. However, when the surfaces of the support (D) are sufficiently smooth, it is not always necessary to perform the smoothing treatment. In this example, the transfer layered bodies obtained in the manner shown in FIG. 3 are used. However, transfer layered bodies each having a patterned plating seed layer (B) formed thereon and obtained in the manner shown in FIG. 4 or 5 may also be used. In this example, the transfer layered bodies are laminated to both sides of the support (D). However, a transfer layered body may be laminated to only one side, and another electrically conductive pattern such as a copper foil may be laminated to the other side.

Figure 11:
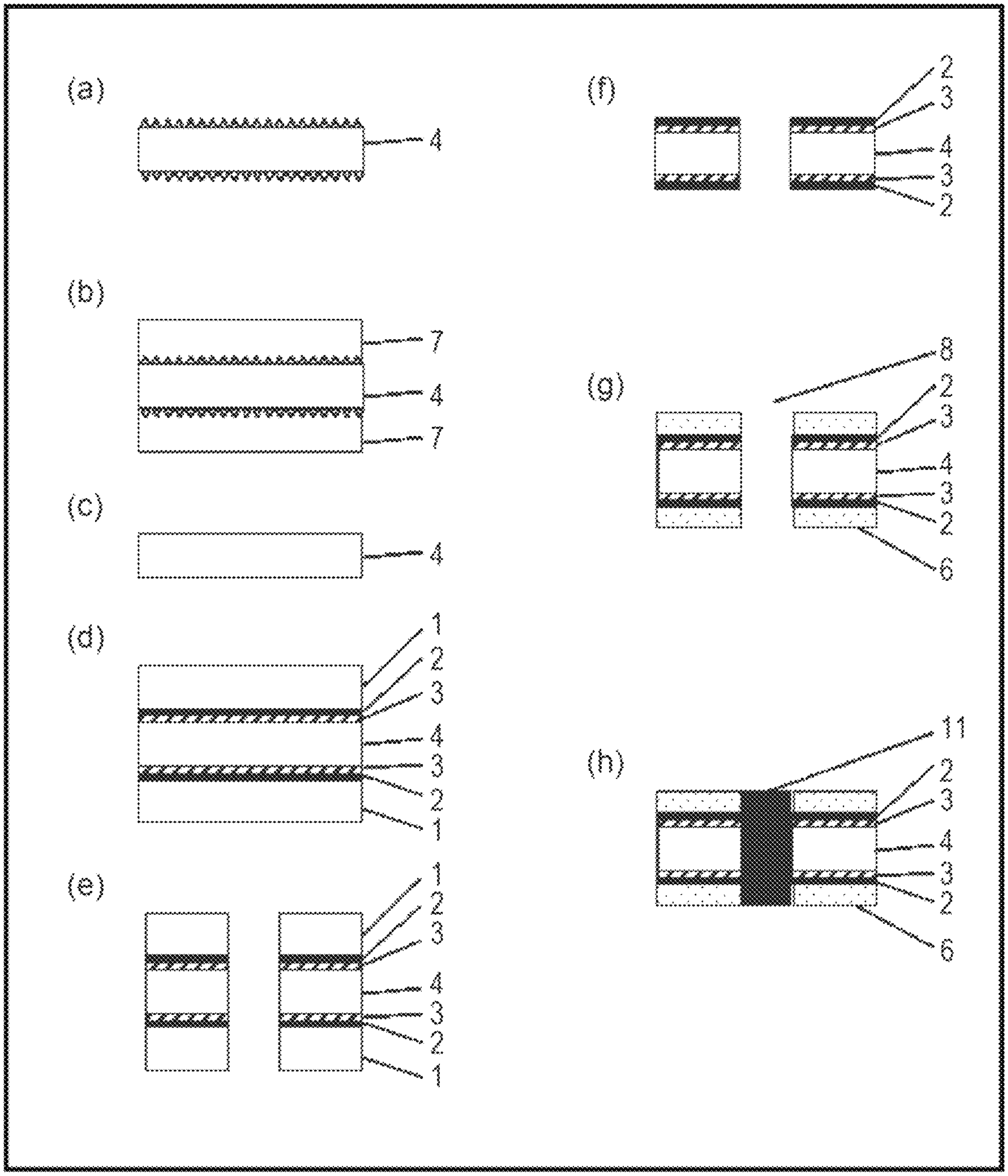
FIG. 11 shows cross-sectional views of sequential steps in an electrically conductive pattern production method including laminating transfer layered bodies to both sides of a support (D), then forming a through hole, forming a metal plating layer (E), and filling the through hole with an electrically conductive paste.

FIG. 11 shows a method for producing electrically conductive patterns using transfer layered bodies obtained in the manner shown in FIG. 3, and electrical continuity is provided between the front and back sides of a support (D) via a through hole.

In this electrically conductive pattern production method, at least one side of an irregular support (D) is laminated with a smooth metal foil or a smooth heat resistant film using a hot press etc. such that its smooth surface faces the support (D), and the laminated metal foil or heat resistant film is removed to smoothen the support (D). Then the transfer layered bodies each having a plating seed layer (B) and a resin layer (C) formed over the entire surface of a temporary support (A) are laminated to the support (D) such that the surfaces of the transfer layered bodies that are formed by the resin layers (C) face the smoothed surfaces of the support (D). Then a through hole passing through the temporary supports (A) of the transfer layered bodies on both sides is formed. Then the temporary supports (A) are removed, and a metal plating layer (E) is formed on the surfaces of the plating seed layers (B). Then the through hole is filled with an electrically conductive paste to impart electrical conductivity to the through hole. In FIG. 11, the support (D) is subjected to the smoothing treatment. However, when the surfaces of the support (D) are sufficiently smooth, it is not always necessary to perform the smoothing treatment. In this example, the transfer layered bodies obtained in the manner shown in FIG. 3 are used. However, transfer layered bodies each having a patterned plating seed layer (B) formed thereon and obtained in the manner shown in FIG. 4 or 5 may also be used. In this example, the transfer layered bodies are laminated to both sides of the support (D). However, a transfer layered body may be laminated to only one side, and another electrically conductive pattern such as a copper foil may be laminated to the other side.

Figure 12:
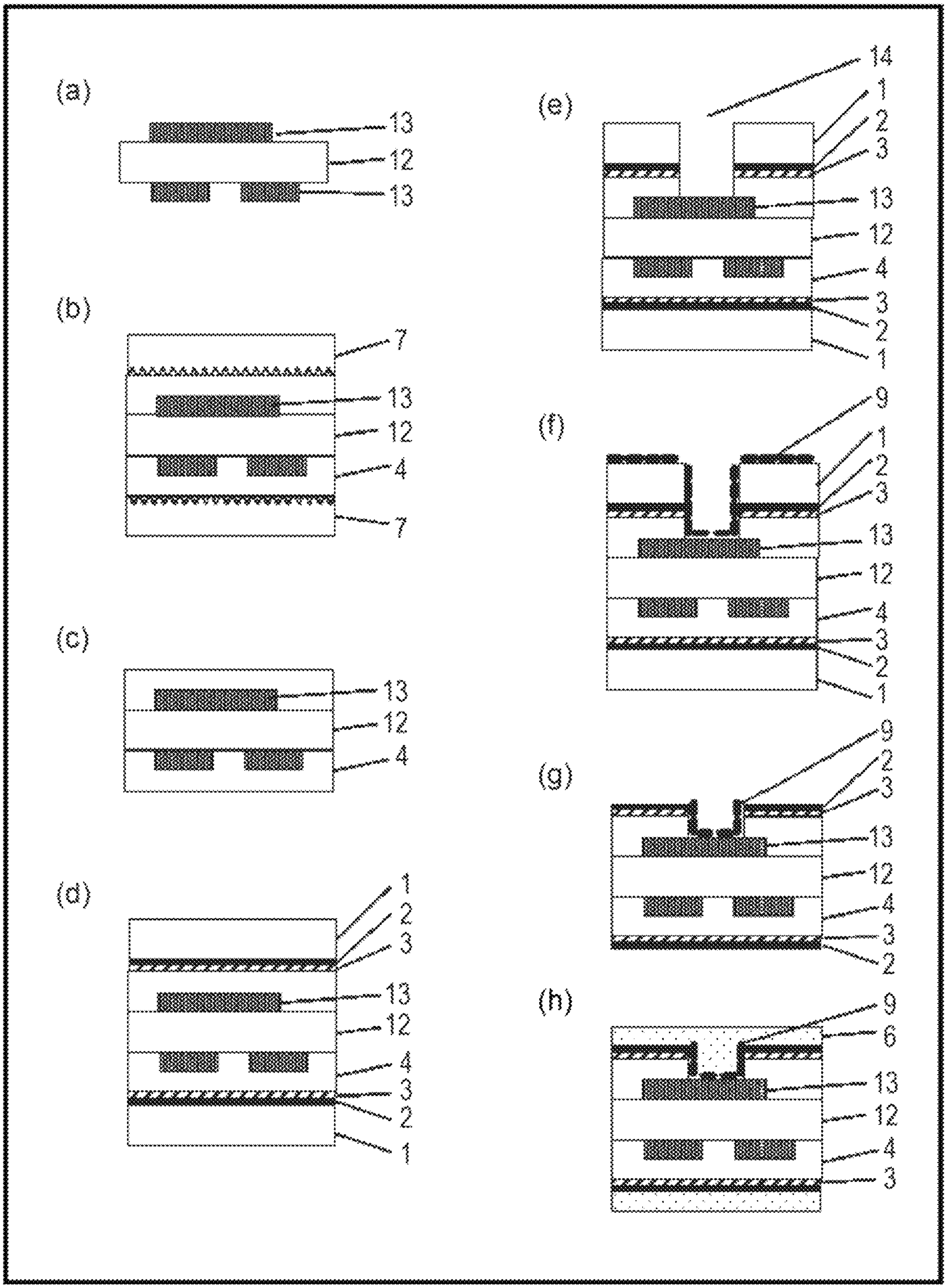
FIG. 12 shows cross-sectional views of sequential steps in an electrically conductive pattern production method including stacking supports (D) on electrically conductive patterns, laminating transfer layered bodies thereto, then forming a blind hole, subjecting the blind hole to treatment for imparting electrical conductivity, removing temporary supports (A), and forming a metal plating layer (E).

FIG. 12 shows a method for producing electrically conductive patterns using transfer layered bodies obtained in the manner shown in FIG. 3. Supports (D) are laminated to a substrate having electrically conductive patterns formed thereon, and surfaces of the supports (D) are subjected to smoothing treatment. Electrical continuity is provided between the surface of one of the supports (D) and one of the electrically conductive patterns on the substrate via a blind hole.

In this electrically conductive pattern production method, a support (D) and a smooth metal foil or heat resistant film are sequentially stacked on at least one side of the substrate with the electrically conductive patterns formed thereon and are laminated together by thermocompression bonding, and the metal foil or heat resistant film is removed to smoothen the support (D). Then the transfer layered bodies each having a plating seed layer (B) and a resin layer (C) formed on the entire surface of a temporary support (A) are laminated to the surfaces of the supports (D) such that the surfaces of the transfer layered bodies that are formed by the resin layers (C) face the smoothened surfaces of the supports (D). Then a blind hole extending from the temporary support (A) of one of the transfer layered bodies to one of the electrically conductive patterns on the substrate is formed. Then palladium, an electrically conductive polymer, an electrically conductive paste, or carbon is applied to the one of the transfer layered bodies and the surface of the blind hole to impart electrical conductivity to the surface of the blind hole. Then the temporary supports (A) are removed, and a metal plating layer (E) is formed on the plating seed layers (B) and in the blind hole. In FIG. 12, the supports (D) are subjected to the smoothing treatment. However, when the surfaces of the supports (D) are sufficiently smooth, it is not always necessary to perform the smoothing treatment. In the example in FIG. 12, the transfer layered bodies obtained in the manner shown in FIG. 3 are used. However, transfer layered bodies each having a patterned plating seed layer (B) formed thereon and obtained in the manner shown in FIG. 4 or 5 may be used. In FIG. 12, the supports (D) are laminated to both sides of the substrate with the electrically conductive patterns formed thereon, and the transfer layered bodies are further laminated thereto. However, a support (D) and a transfer layered body may be laminated only to one side, and a support (D) and another electrically conductive pattern such as a copper foil may be laminated to the other side.

Figure 13:
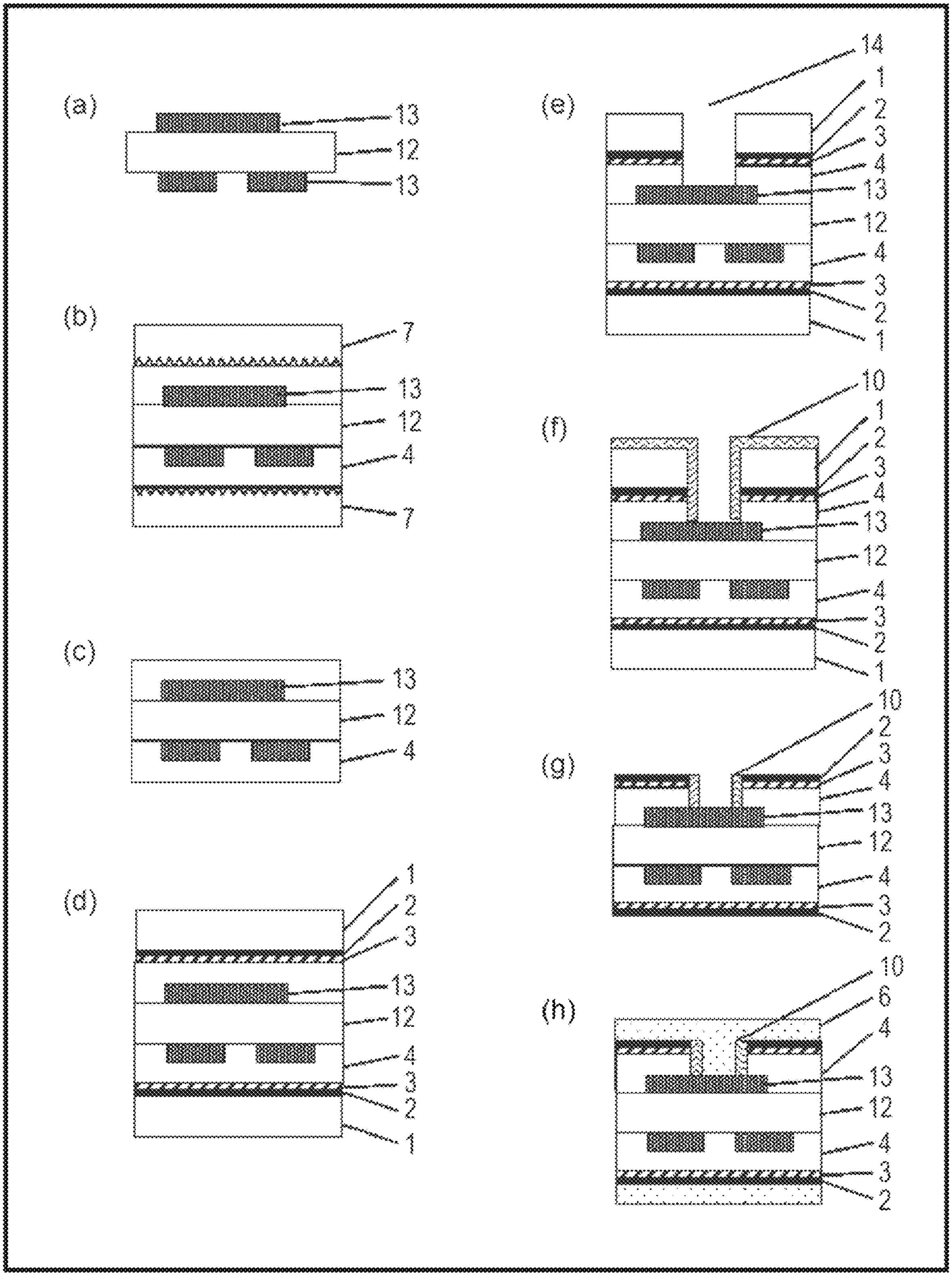
FIG. 13 shows cross-sectional views of sequential steps in an electrically conductive pattern production method including stacking supports (D) on electrically conductive patterns, laminating transfer layered bodies thereto, forming a blind hole, subjecting the blind hole to treatment for imparting electrical conductivity, removing temporary supports (A), and forming a metal plating layer (E).

FIG. 13 shows a method for producing electrically conductive patterns using transfer layered bodies obtained in the manner shown in FIG. 3. Supports (D) are laminated to a substrate having electrically conductive patterns formed thereon, and surfaces of the supports (D) are subjected to smoothing treatment. Electrical continuity is provided between the surface of one of the supports (D) and one of the electrically conductive patterns on the substrate via a blind hole.

In this electrically conductive pattern production method, a support (D) and a smooth metal foil or heat resistant film are sequentially stacked on at least one side of the substrate with the electrically conductive patterns formed thereon and are laminated together by thermocompression bonding, and the metal foil or heat resistant film is removed to smoothen the support (D). Then the transfer layered bodies each having a plating seed layer (B) and a resin layer (C) formed on the entire surface of a temporary support (A) are laminated to the surfaces of the support (D) such that the surfaces of the transfer layered bodies that are formed by the resin layers (C) face the smoothened surfaces of the supports (D). Then a blind hole extending from the temporary support (A) of one of the transfer layered bodies to one of the electrically conductive patterns on the substrate is formed. A metal film is formed on the one of the transfer layered bodies and the surface of the blind hole using a dry plating method such as a vapor deposition method or a sputtering method to impart electrical conductivity to the surface of the blind hole. Then the temporary supports (A) are removed, and a metal plating layer (E) is formed on the plating seed layers (B) and in the blind hole. In FIG. 13, the supports (D) are subjected to the smoothing treatment. However, when the surfaces of the supports (D) are sufficiently smooth, it is not always necessary to perform the smoothing treatment. In the example shown in FIG. 13, the transfer layered bodies obtained in the manner shown in FIG. 3 are used. However, transfer layered bodies each having a patterned plating seed layer (B) formed thereon and obtained in the manner shown in FIG. 4 or 5 may be used. In FIG. 13, the supports (D) are laminated to both sides of the substrate with the electrically conductive patterns formed thereon, and the transfer layered bodies are further laminated thereto. However, a support (D) and a transfer layered body may be laminated only to one side, and a support (D) and another electrically conductive pattern such as a copper foil may be laminated to the other side.

Figure 14:
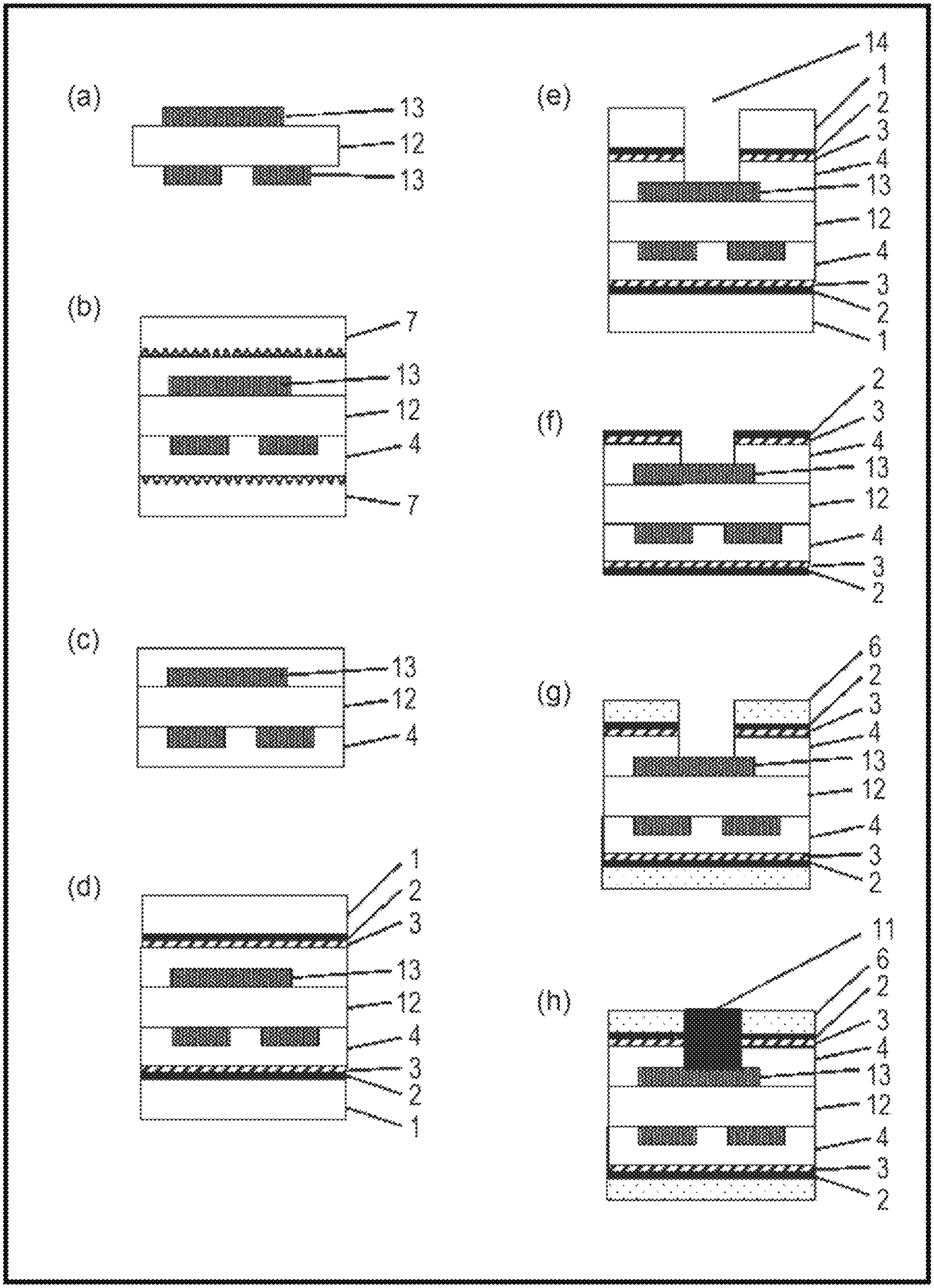
FIG. 14 shows cross-sectional views of sequential steps in an electrically conductive pattern production method including stacking supports (D) on electrically conductive patterns, laminating transfer layered bodies thereto, then forming a blind hole, forming a metal plating layer (E), and filling the blind hole with an electrically conductive paste.

FIG. 14 shows a method for producing electrically conductive patterns using transfer layered bodies obtained in the manner shown in FIG. 3. Supports (D) are laminated to a substrate having electrically conductive patterns formed thereon, and surfaces of the supports (D) are subjected to smoothing treatment. Electrical continuity is provided between the surface of one of the supports (D) and one of the electrically conductive patterns on the substrate via a blind hole.

In this electrically conductive pattern production method, a support (D) and a smooth metal foil or heat resistant film are sequentially stacked on at least one side of the substrate with the electrically conductive patterns formed thereon and are laminated together by thermocompression bonding, and the metal foil or heat resistant film is removed to smoothen the support (D). Then the transfer layered bodies each having a plating seed layer (B) and a resin layer (C) formed on the entire surface of a temporary support (A) are laminated to the surfaces of the support (D) such that the surfaces of the transfer layered bodies that are formed by the resin layers (C) face the smoothened surfaces of the supports (D). Then a blind hole extending from the temporary support (A) of one of the transfer layered bodies to one of the electrically conductive patterns on the substrate is formed. Then the temporary supports (A) are removed, and a metal plating layer (E) is formed on the surfaces of the plating seed layers (B). Then the blind hole is filled with an electrically conductive paste to impart electrical conductivity to the blind hole. In FIG. 14, the supports (D) are subjected to the smoothing treatment. However, when the surfaces of the supports (D) are sufficiently smooth, it is not always necessary to perform the smoothing treatment. In the example shown in FIG. 14, the transfer layered bodies obtained in the manner shown in FIG. 3 are used. However, transfer layered bodies each having a patterned plating seed layer (B) formed thereon and obtained in the manner shown in FIG. 4 or 5 may also be used. In FIG. 14, the supports (D) are laminated to both sides of the substrate with the electrically conductive patterns formed thereon, and the transfer layered bodies are further laminated thereto. However, a support (D) and a transfer layered body may be laminated only to one side, and a support (D) and another electrically conductive pattern such as a copper foil may be laminated to the other side.

Figure 15:
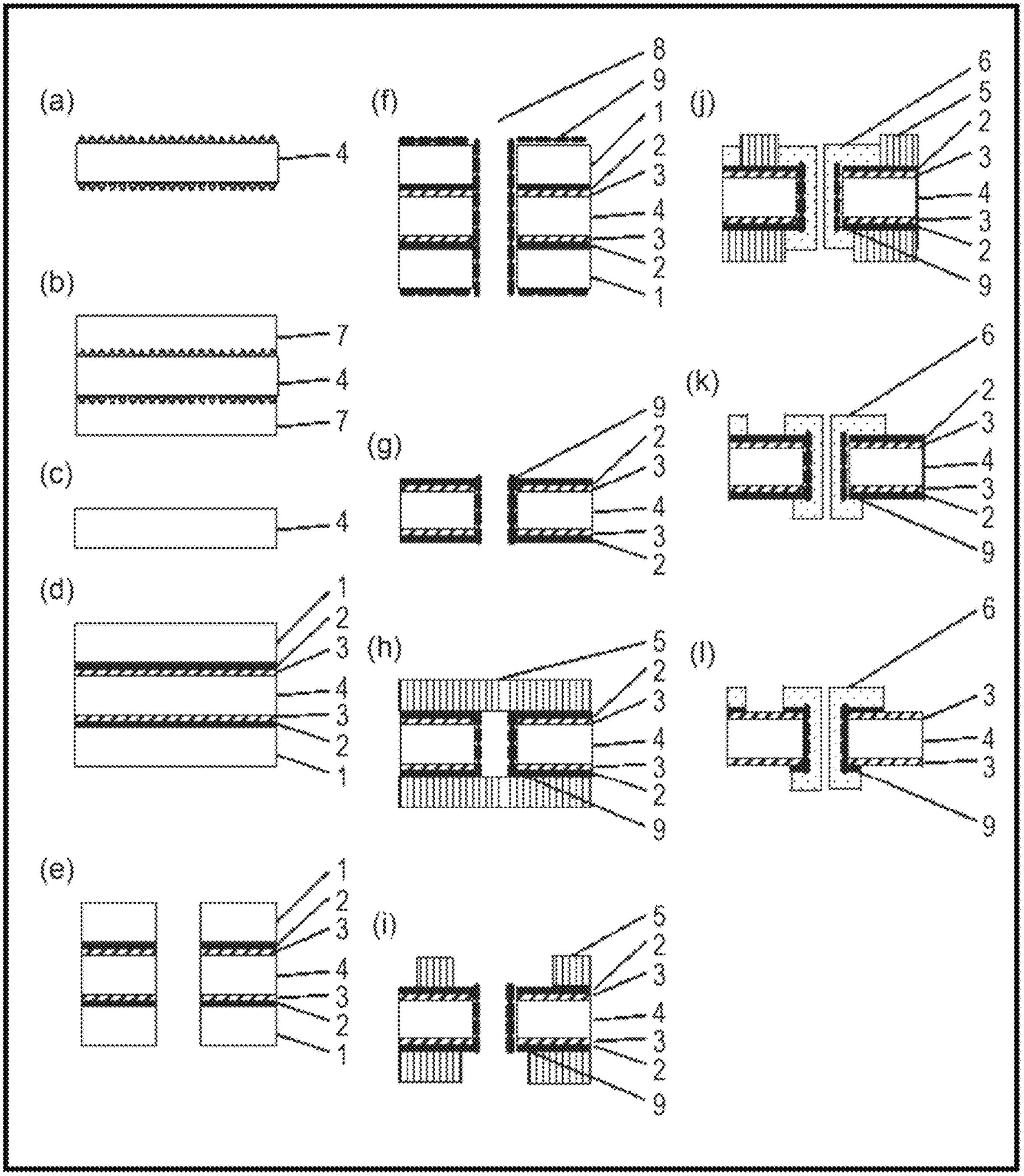
FIG. 15 shows cross-sectional views of sequential steps in an electrically conductive pattern production method including laminating transfer layered bodies to both sides of a support (D), then forming a through hole, subjecting the through hole to treatment for imparting electrical conductivity, removing temporary supports (A), and forming a metal plating layer (E) using a semi-additive process.

FIG. 15 shows a method for producing electrically conductive patterns by a semi-additive process using transfer layered bodies obtained in the manner shown in FIG. 3, and electrical continuity is provided between the front and back sides of a support (D) via a through hole.

In this electrically conductive pattern production method, at least one side of an irregular support (D) is laminated with a smooth metal foil or a smooth heat resistant film using a hot press etc. such that its smooth surface faces the support (D), and the laminated metal foil or heat resistant film is removed to smoothen the support (D). Then the transfer layered bodies each having a plating seed layer (B) and a resin layer (C) formed over the entire surface of a temporary support (A) are laminated to the support (D) such that the surfaces of the transfer layered bodies that are formed by the resin layers (C) face the smoothed surfaces of the support (D). Then a through hole passing through the temporary supports (A) of the transfer layered bodies on both sides is formed. Then palladium, an electrically conductive polymer, an electrically conductive paste, or carbon is applied to the transfer layered bodies and the surface of the through hole to impart electrical conductivity to the surface of the through hole. Next, the temporary supports (A) are removed, and a patterned resist is formed on the surfaces of the plating seed layers (B). Then a metal plating layer (E) is formed on the plating seed layers (B) and in the through hole. Then the patterned resist is removed, and an etching solution is used to remove the plating seed layers (B) from portions other than portions in which the metal plating layer (E) serving as electrically conductive patterns is formed. In FIG. 15, the support (D) is subjected to the smoothing treatment. However, when the surfaces of the support (D) are sufficiently smooth, it is not always necessary to perform the smoothing treatment. In FIG. 15, the transfer layered bodies are laminated to both sides of the support (D). However, a transfer layered body may be laminated only to one side, and another electrically conductive pattern such as a copper foil may be laminated to the other side.

Figure 16:
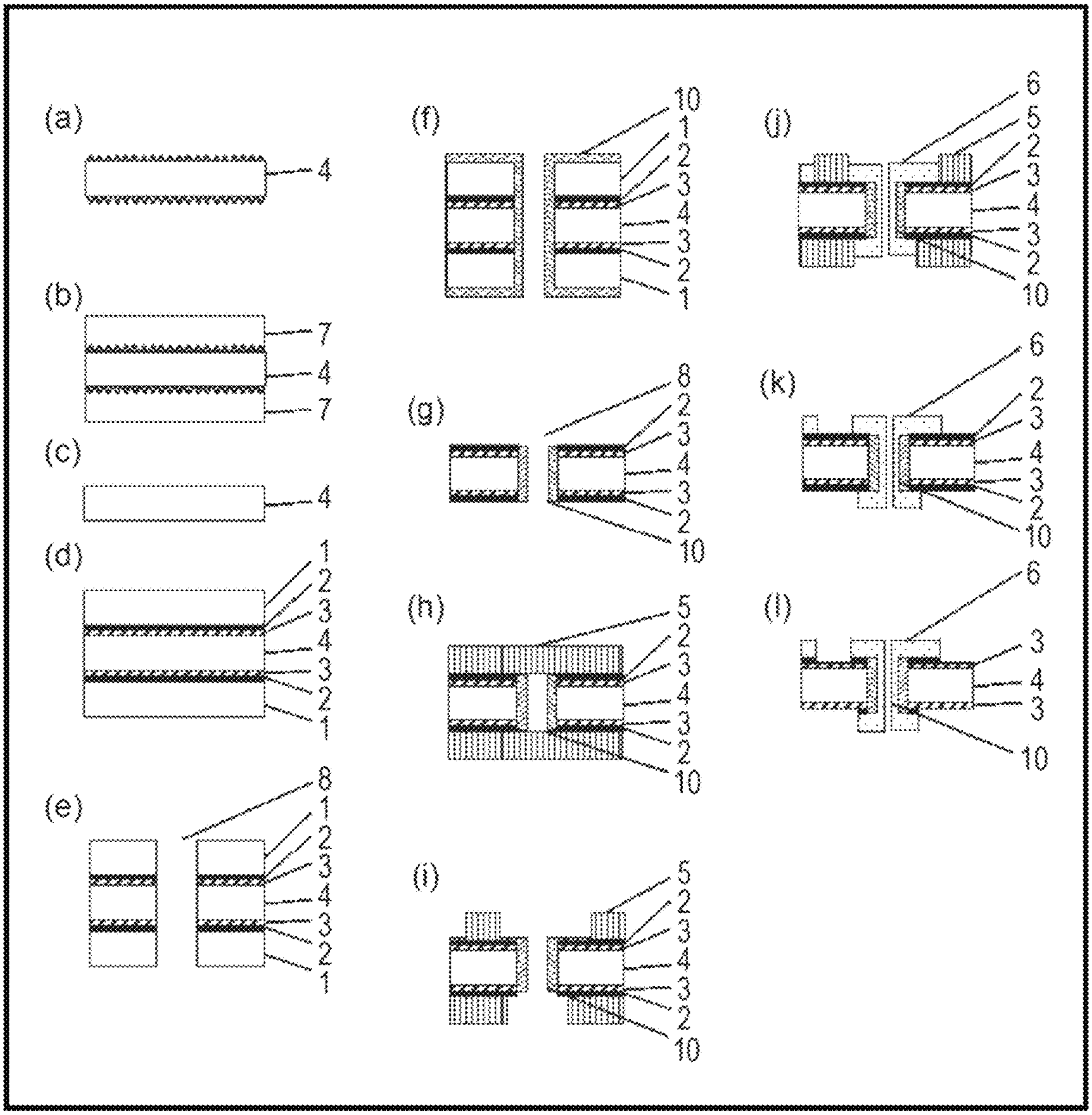
FIG. 16 shows cross-sectional views of sequential steps in an electrically conductive pattern production method including laminating transfer layered bodies on both sides of a support (D), then forming a through hole, subjecting the through hole to treatment for imparting electrical conductivity, removing temporary supports (A), and forming a metal plating layer (E) using a semi-additive process.

FIG. 16 shows a method for producing electrically conductive patterns by a semi-additive process using transfer layered bodies obtained in the manner shown in FIG. 3, and electrical continuity is provided between the front and back sides of a support (D) via a through hole.

In this electrically conductive pattern production method, at least one side of an irregular support (D) is laminated with a smooth metal foil or a smooth heat resistant film using a hot press etc. such that its smooth surface faces the support (D), and the laminated metal foil or heat resistant film is removed to smoothen the support (D). Then the transfer layered bodies each having a plating seed layer (B) and a resin layer (C) formed over the entire surface of a temporary support (A) are laminated to the support (D) such that the surfaces of the transfer layered bodies that are formed by the resin layers (C) face the smoothed surfaces of the support (D). Then a through hole passing through the temporary supports (A) of the transfer layered bodies on both sides is formed. A metal film is formed on the transfer layered bodies and the surface of the through hole using a dry plating method to impart electrical conductivity to the surface of the through hole. Then the temporary supports (A) are removed, and a patterned resist is formed on the surfaces of the plating seed layers (B). Then a metal plating layer (E) is formed on the plating seed layers (B) and in the through hole. Then the patterned resist is removed, and an etching solution is used to remove the plating seed layers (B) from portions other than portions in which the metal plating layer (E) serving as electrically conductive patterns is formed. In FIG. 16, the support (D) is subjected to the smoothing treatment. However, when the surfaces of the support (D) are sufficiently smooth, it is not always necessary to perform the smoothing treatment. In FIG. 16, the transfer layered bodies are laminated to both sides of the support (D). However, a transfer layered body may be laminated only to one side, and another electrically conductive pattern such as a copper foil may be laminated to the other side.

Figure 17:
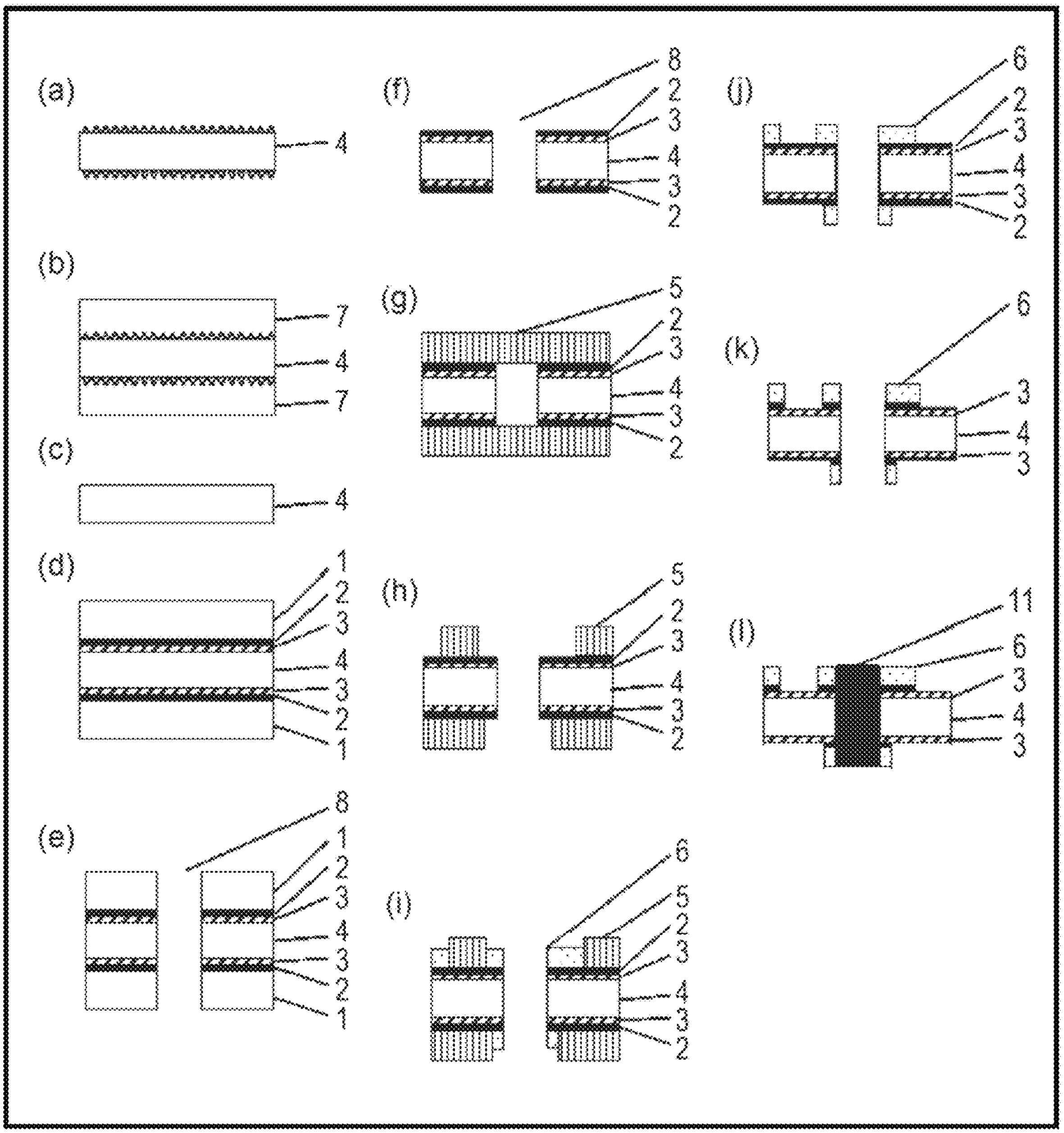
FIG. 17 shows cross-sectional views of sequential steps in an electrically conductive pattern production method including laminating transfer layered bodies to both sides of a support (D), then forming a through hole, removing temporary supports (A), forming a metal plating layer (E) using a semi-additive process, and filling the through hole with an electrically conductive paste.

FIG. 17 shows a method for producing electrically conductive patterns by a semi-additive process using transfer layered bodies obtained in the manner shown in FIG. 3, and electrical continuity is provided between the front and back sides of a support (D) via a through hole.

In this electrically conductive pattern production method, at least one side of an irregular support (D) is laminated with a smooth metal foil or a smooth heat resistant film using a hot press etc. such that its smooth surface faces the support (D), and the laminated metal foil or heat resistant film is removed to smoothen the support (D). Then the transfer layered bodies each having a plating seed layer (B) and a resin layer (C) formed over the entire surface of a temporary support (A) are laminated to the support (D) such that the surfaces of the transfer layered bodies that are formed by the resin layers (C) face the smoothed surfaces of the support (D). Then a through hole passing through the temporary supports (A) of the transfer layered bodies on both sides is formed. Then the temporary supports (A) are removed, and a patterned resist is formed on the surfaces of the plating seed layers (B). Then a metal plating layer (E) is formed on the plating seed layers (B). Then the patterned resist is removed, and an etching solution is used to remove the plating seed layers (B) from portions other than portions in which the metal plating layer (E) serving as electrically conductive patterns is formed. Then the through hole is filled with an electrically conductive paste to impart electrical conductivity to the through hole. In FIG. 17, the support (D) is subjected to the smoothing treatment. However, when the surfaces of the support (D) are sufficiently smooth, it is not always necessary to perform the smoothing treatment. In FIG. 17, the transfer layered bodies are laminated to both sides of the support (D). However, a transfer layered body may be laminated only to one side, and another electrically conductive pattern such as a copper foil may be laminated to the other side.

Figure 18:
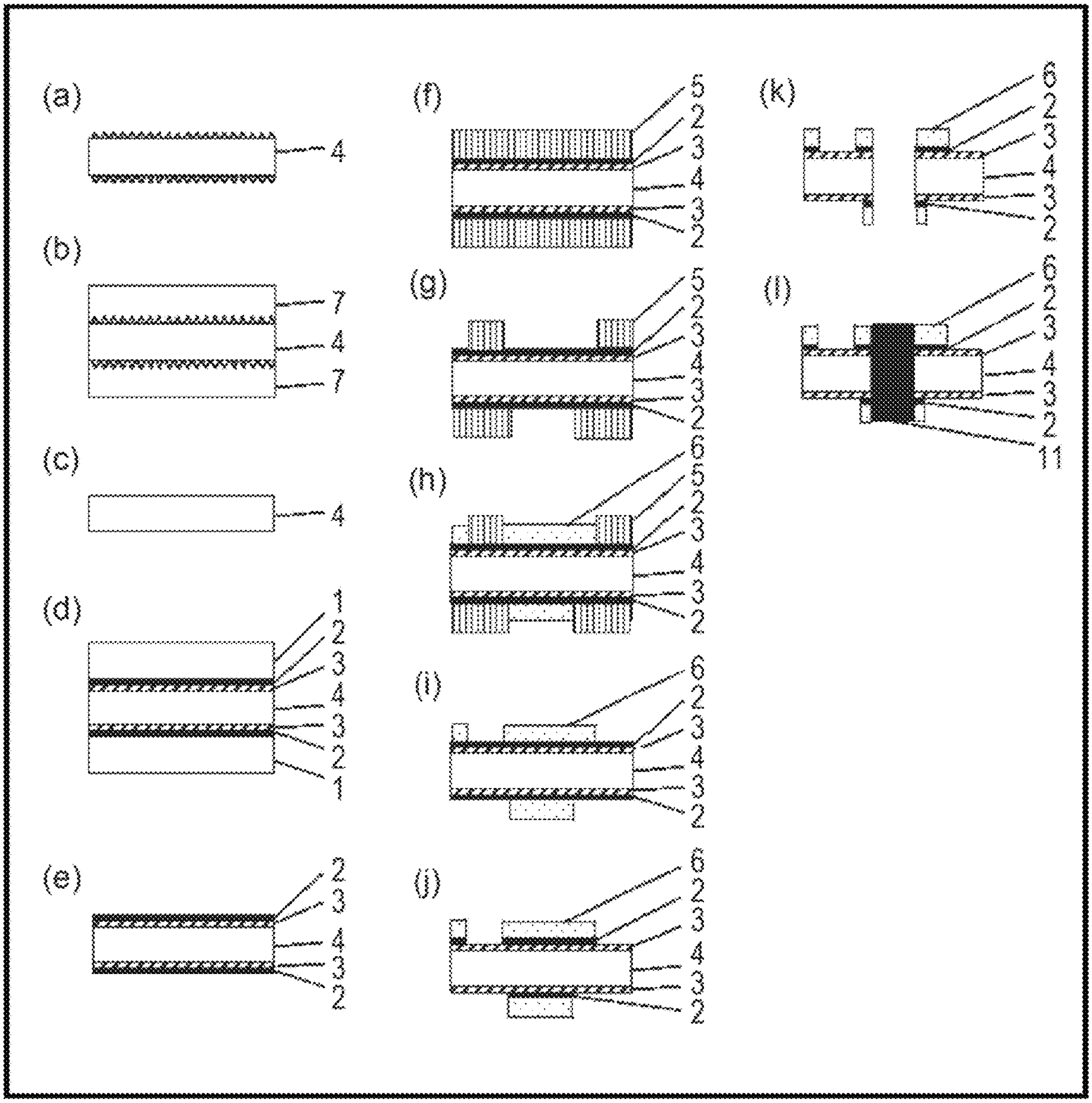
FIG. 18 shows cross-sectional views of sequential steps in an electrically conductive pattern production method including laminating transfer layered bodies to both sides of a support (D), removing temporary supports (A), forming a metal plating layer (E) using a semi-additive process, forming a through hole, and filling the through hole with an electrically conductive paste.

FIG. 18 shows a method for producing electrically conductive patterns by a semi-additive process using transfer layered bodies obtained in the manner shown in FIG. 3, and electrical continuity is provided between the front and back sides of a support (D) via a through hole.

In this electrically conductive pattern production method, at least one side of an irregular support (D) is laminated with a smooth metal foil or a smooth heat resistant film using a hot press etc. such that its smooth surface faces the support (D), and the laminated metal foil or heat resistant film is removed to smoothen the support (D). Then the transfer layered bodies each having a plating seed layer (B) and a resin layer (C) formed over the entire surface of a temporary support (A) are laminated to the support (D) such that the surfaces of the transfer layered bodies that are formed by the resin layers (C) face the smoothed surfaces of the support (D). Then the temporary supports (A) are removed to form the resins (C) and the plating seed layers (B) on the surfaces of the support (D). Then a patterned resist is formed on the surfaces of the plating seed layers (B), and a metal plating layer (E) is formed on the plating seed layers (B). Then the patterned resist is removed, and an etching solution is used to remove the plating seed layers (B) from portions other than portions in which the metal plating layer (E) serving as electrically conductive patterns is formed. Then a through hole passing through the surfaces of the metal plating layer (E) on both sides is formed. Then the through hole is filled with an electrically conductive paste to impart electrical conductivity to the through hole. In FIG. 18, the support (D) is subjected to the smoothing treatment. However, when the surfaces of the support (D) are sufficiently smooth, it is not always necessary to perform the smoothing treatment. In FIG. 18, the transfer layered bodies are laminated to both sides of the support (D). However, a transfer layered body may be laminated only to one side, and another electrically conductive pattern such as a copper foil may be laminated to the other side.

Figure 19:
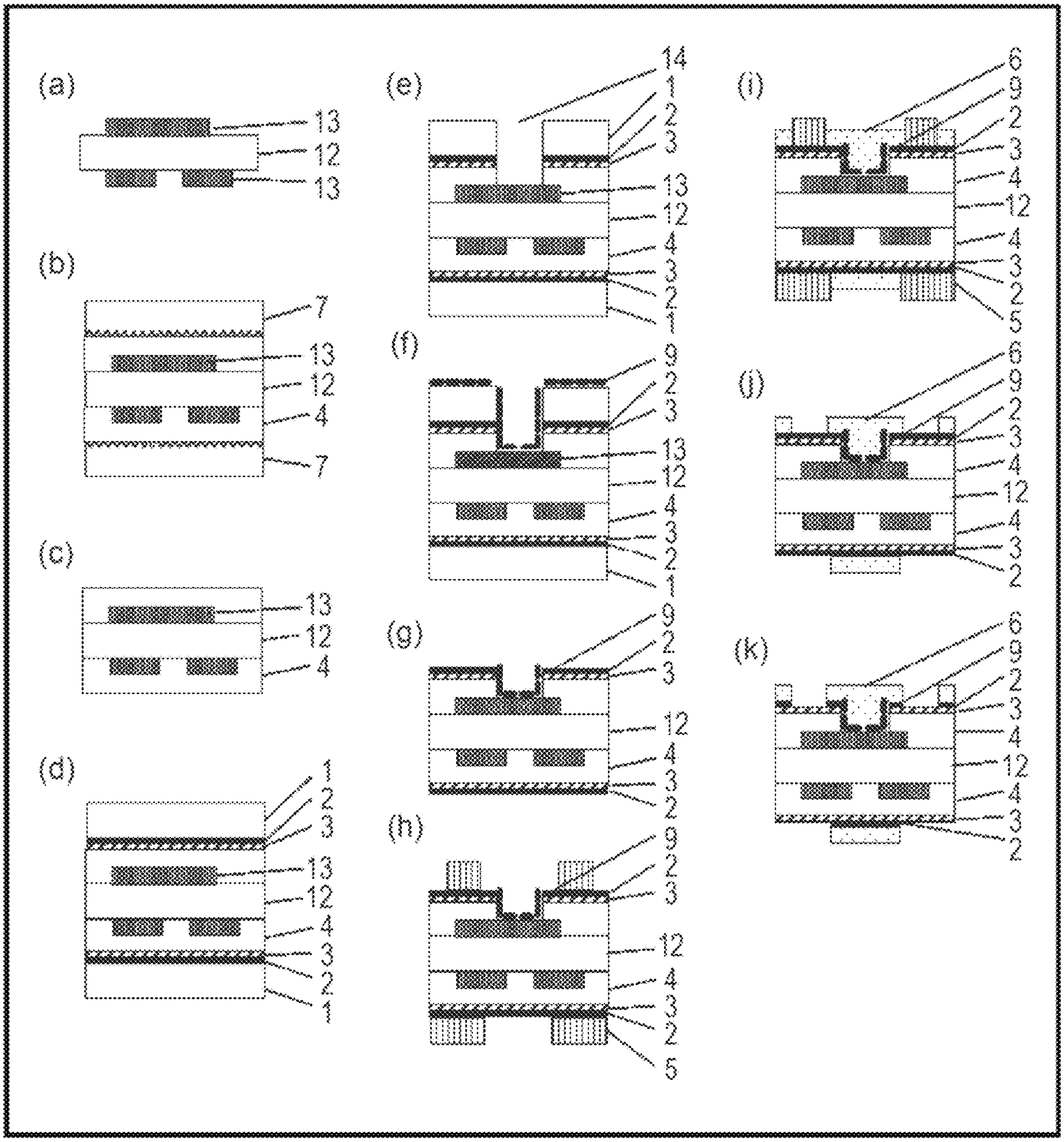
FIG. 19 shows cross-sectional views of sequential steps in an electrically conductive pattern production method including stacking supports (D) on electrically conductive patterns disposed on opposite sides, laminating transfer layered bodies thereto, forming a blind hole, subjecting the blind hole to treatment for imparting electrical conductivity, removing temporary supports (A), and forming a metal plating layer (E) using a semi-additive process.

FIG. 19 shows a method for producing electrically conductive patterns by a semi-additive process using transfer layered bodies obtained in the manner shown in FIG. 3. In this method, supports (D) are laminated to a substrate having electrically conductive patterns formed thereon, and the surfaces of the supports (D) are subjected to smoothing treatment. Electrical continuity is provided between the surface of one of the supports (D) and one of the electrically conductive patterns on the substrate via a blind hole.

In this electrically conductive pattern production method, a support (D) and a smooth metal foil or heat resistant film are sequentially stacked on at least one side of the substrate with the electrically conductive patterns formed thereon and are laminated together by thermocompression bonding, and the metal foil or heat resistant film is removed to smoothen the support (D). Then the transfer layered bodies each having a plating seed layer (B) and a resin layer (C) formed on the entire surface of a temporary support (A) are laminated to the surfaces of the support (D) such that the surfaces of the transfer layered bodies that are formed by the resin layers (C) face the smoothened surfaces of the supports (D). Then a blind hole extending from the temporary support (A) of one of the transfer layered bodies to one of the electrically conductive patterns on the substrate is formed. Then palladium, an electrically conductive polymer, carbon, or an electrically conductive paste is applied to the one of the transfer layered bodies and the surface of the blind hole to impart electrical conductivity to the surface of the blind hole. Then the temporary supports (A) are removed. Then a patterned resist is formed on the surfaces of the plating seed layers (B), and a metal plating layer (E) is formed on the plating seed layers (B) and in the blind hole. Then the patterned resist is removed, and an etching solution is used to remove the plating seed layers (B) from portions other than portions in which the metal plating layer (E) serving as electrically conductive patterns is formed. In FIG. 19, the supports (D) are subjected to the smoothing treatment. However, when the surfaces of the supports (D) are sufficiently smooth, it is not always necessary to perform the smoothing treatment. In FIG. 19, the supports (D) are laminated to both sides of the substrate with the electrically conductive patterns formed thereon, and the transfer layered bodies are further laminated thereto. However, a support (D) and a transfer layered body may be laminated only to one side, and a support (D) and another electrically conductive pattern such as a copper foil may be laminated to the other side.

Figure 20:
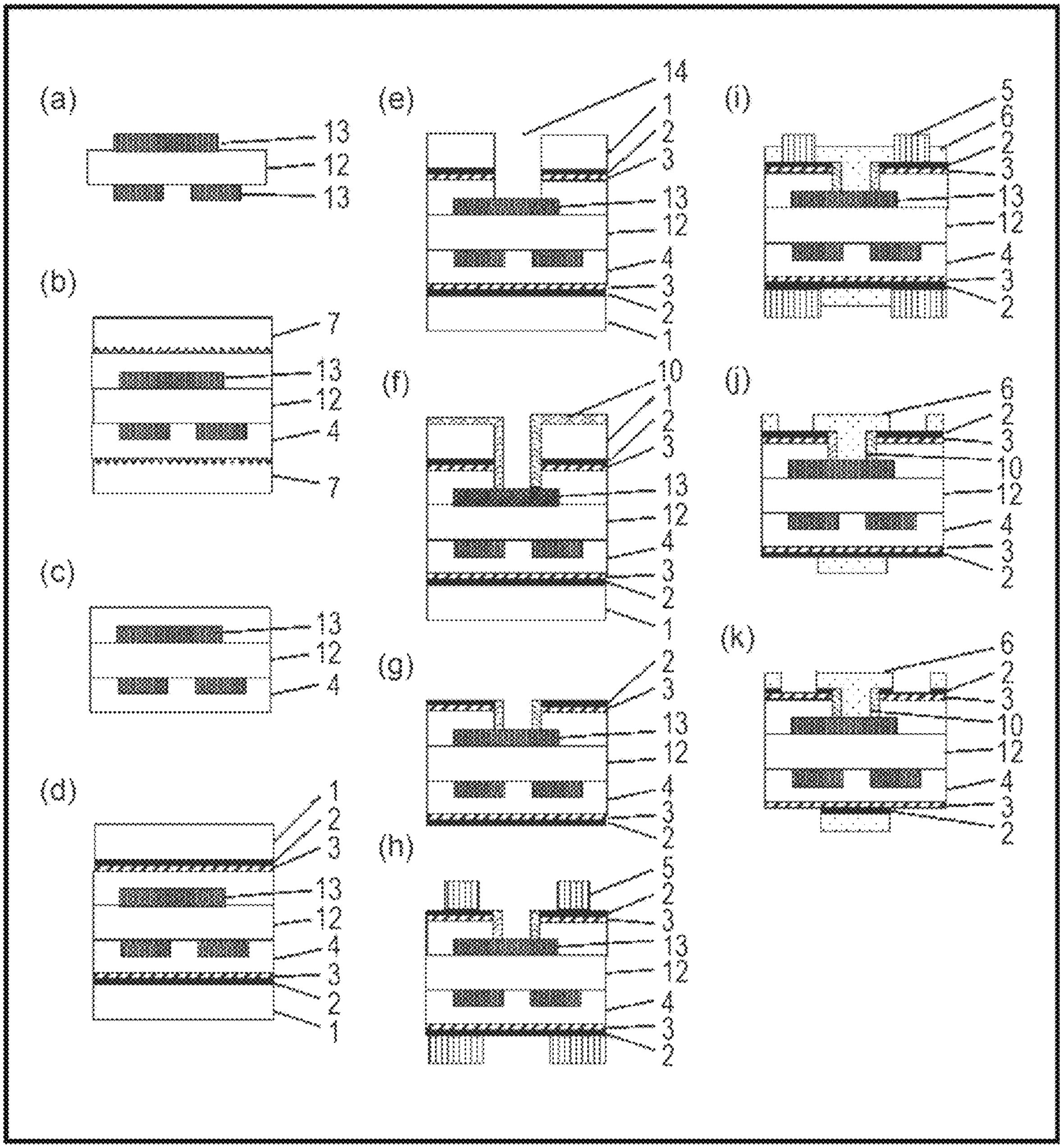
FIG. 20 shows cross-sectional views of sequential steps in an electrically conductive pattern production method including stacking supports (D) on electrically conductive patterns disposed on opposite sides, laminating transfer layered bodies thereto, forming a blind hole, subjecting the blind hole to treatment for imparting electrical conductivity, removing temporary supports (A), and forming a metal plating layer (E) using a semi-additive process.

FIG. 20 shows a method for producing electrically conductive patterns by a semi-additive process using transfer layered bodies obtained in the manner shown in FIG. 3. In this method, supports (D) are laminated to a substrate having electrically conductive patterns formed thereon, and the surfaces of the supports (D) are subjected to smoothing treatment. Electrical continuity is provided between the surface of one of the supports (D) and one of the electrically conductive patterns on the substrate via a blind hole.

In this electrically conductive pattern production method, a support (D) and a smooth metal foil or heat resistant film are sequentially stacked on at least one side of the substrate with the electrically conductive patterns formed thereon and are laminated together by thermocompression bonding, and the metal foil or heat resistant film is removed to smoothen the surface of the support (D). Then the transfer layered bodies each having a plating seed layer (B) and a resin layer (C) formed on the entire surface of a temporary support (A) are laminated to the surfaces of the supports (D) such that the surfaces of the transfer layered bodies that are formed by the resin layers (C) face the smoothened surfaces of the supports (D). Then a blind hole extending from the temporary support (A) of one of the transfer layered bodies to one of the electrically conductive patterns on the substrate is formed. A metal film is formed on the one of the transfer layered bodies and the surface of the blind hole using a dry plating method such as a vapor deposition method or a sputtering method to impart electrical conductivity to the surface of the blind hole. Then the temporary supports (A) are removed. A patterned resist is formed on the surfaces of the plating seed layers (B), and a metal plating layer (E) is formed on the plating seed layers (B) and in the blind hole. Then the patterned resist is removed, and an etching solution is used to remove the plating seed layers (B) from portions other than portions in which the metal plating layer (E) serving as electrically conductive patterns is formed. In FIG. 20, the supports (D) are subjected to the smoothing treatment. However, when the surfaces of the supports (D) are sufficiently smooth, it is not always necessary to perform the smoothing treatment. In FIG. 20, the supports (D) are laminated to both sides of the substrate with the electrically conductive patterns formed thereon, and the transfer layered bodies are further laminated thereto. However, a support (D) and a transfer layered body may be laminated only to one side, and a support (D) and another electrically conductive pattern such as a copper foil may be laminated to the other side.

Figure 21:
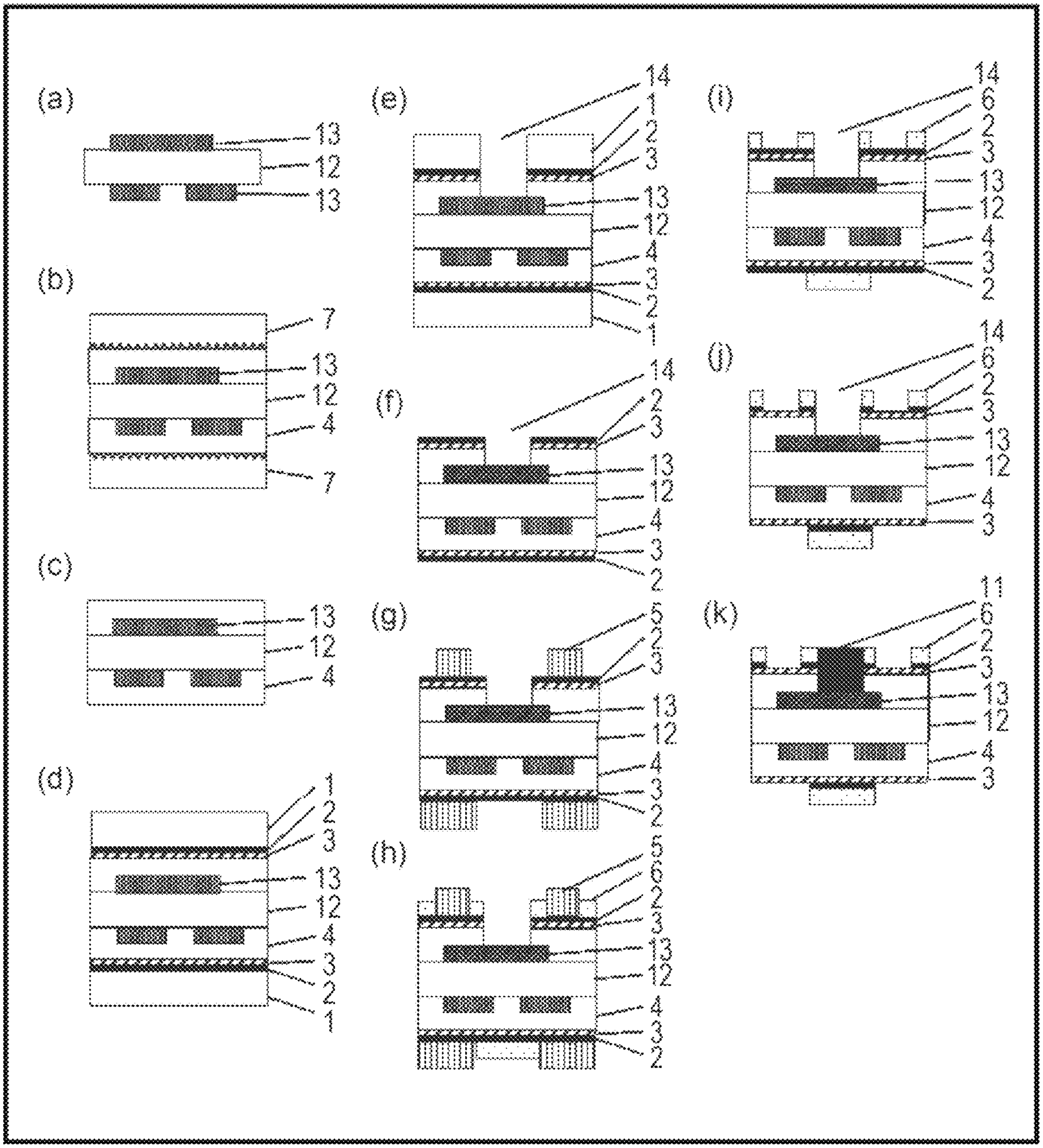
FIG. 21 shows cross-sectional views of sequential steps in an electrically conductive pattern production method including stacking supports (D) on electrically conductive patterns disposed on opposite sides, laminating transfer layered bodies thereto, forming a blind hole, removing temporary supports (A), forming a metal plating layer (E) using a semi-additive process, and filling the blind hole with an electrically conductive paste.

FIG. 21 shows a method for producing electrically conductive patterns by a semi-additive process using transfer layered bodies obtained in the manner shown in FIG. 3. In this method, supports (D) are laminated to a substrate having electrically conductive patterns formed thereon, and the surfaces of the supports (D) are subjected to smoothing treatment. Electrical continuity is provided between the surface of one of the supports (D) and one of the electrically conductive patterns on the substrate via a blind hole.

In this electrically conductive pattern production method, a support (D) and a smooth metal foil or heat resistant film are sequentially stacked on at least one side of the substrate with the electrically conductive patterns formed thereon and are laminated together by thermocompression bonding, and the metal foil or heat resistant film is removed to smoothen the support (D). Then the transfer layered bodies each having a plating seed layer (B) and a resin layer (C) formed on the entire surface of a temporary support (A) are laminated to the surfaces of the supports (D) such that the surfaces of the transfer layered bodies that are formed by the resin layers (C) face the smoothened surfaces of the supports (D). Then a blind hole extending from the temporary support (A) of one of the transfer layered bodies to one of the electrically conductive patterns on the substrate is formed. Then the temporary supports (A) are removed, and a patterned resist is formed on the surfaces of the plating seed layers (B). Then a metal plating layer (E) is formed on the plating seed layers (B). Then the patterned resist is removed, and an etching solution is used to remove the plating seed layers (B) from portions other than portions in which the metal plating layer (E) serving as electrically conductive patterns is formed. Then the blind hole is filled with an electrically conductive paste to impart electrical conductivity to the blind hole. In FIG. 21, the supports (D) are subjected to the smoothing treatment. However, when the surfaces of the supports (D) are sufficiently smooth, it is not always necessary to perform the smoothing treatment. In FIG. 21, the supports (D) are laminated to both sides of the substrate with the electrically conductive patterns formed thereon, and the transfer layered bodies are further laminated thereto. However, a support (D) and a transfer layered body may be laminated only to one side, and a support (D) and another electrically conductive pattern such as a copper foil may be laminated to the other side.

Figure 22:
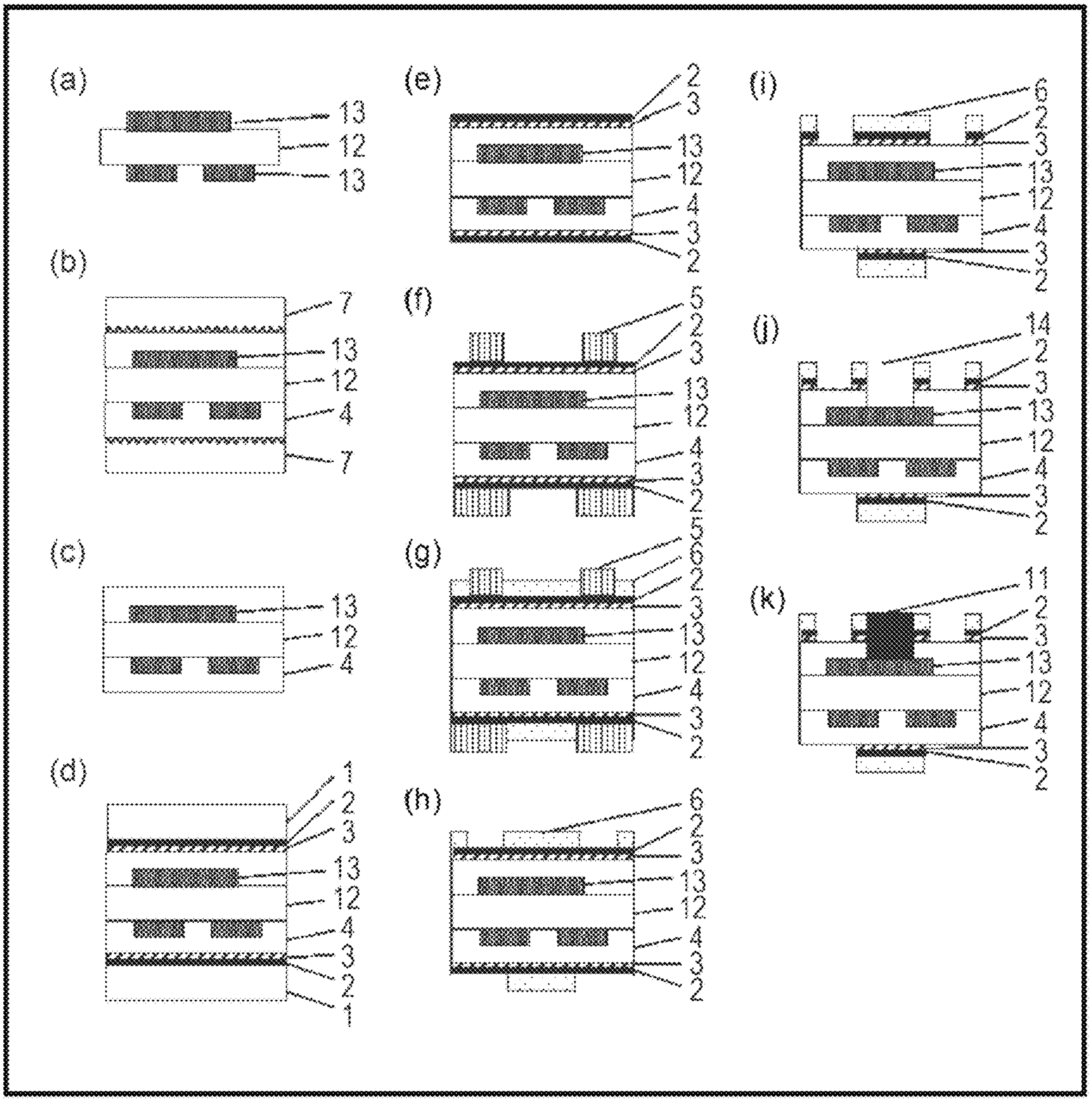
FIG. 22 shows cross-sectional views of sequential steps in an electrically conductive pattern production method including stacking supports (D) on electrically conductive patterns disposed on opposite sides, laminating transfer layered bodies thereto, removing temporary supports (A), forming a metal plating layer (E) using a semi-additive process, forming a blind hole, and filling the blind hole with an electrically conductive paste.

FIG. 22 shows a method for producing electrically conductive patterns by a semi-additive process using transfer layered bodies obtained in the manner shown in FIG. 3. In this method, supports (D) are laminated to a substrate having electrically conductive patterns formed thereon, and the surfaces of the supports (D) are subjected to smoothing treatment. Electrical continuity is provided between the surface of one of the supports (D) and one of the electrically conductive patterns on the substrate via a blind hole.

In this electrically conductive pattern production method, a support (D) and a smooth metal foil or heat resistant film are sequentially stacked on at least one side of the substrate with the electrically conductive patterns formed thereon and are laminated together by thermocompression bonding, and the metal foil or heat resistant film is removed to smoothen the support (D). Then the transfer layered bodies each having a plating seed layer (B) and a resin layer (C) formed on the entire surface of a temporary support (A) are laminated to the surfaces of the support (D) such that the surfaces of the transfer layered bodies that are formed by the resin layers (C) face the smoothened surfaces of the supports (D). Then the temporary supports (A) are removed to form the resins (C) and the plating seed layers (B) on the surfaces of the supports (D). Then a patterned resist is formed on the surfaces of the plating seed layers (B), and a metal plating layer (E) is formed on the plating seed layers (B). Then the patterned resist is removed, and an etching solution is used to remove the plating seed layers (B) from portions other than portions in which the metal plating layer (E) serving as electrically conductive patterns is formed. Then a blind hole extending from the metal plating layer (E) to one of the electrically conductive patterns on the substrate is formed, and the blind hole is filled with an electrically conductive paste to impart electrical conductivity to the blind hole. In FIG. 22, the supports (D) are subjected to the smoothing treatment. However, when the surfaces of the supports (D) are sufficiently smooth, it is not always necessary to perform the smoothing treatment. In FIG. 22, the supports (D) are laminated to both sides of the substrate with the electrically conductive patterns formed thereon, and the transfer layered bodies are further laminated thereto. However, a support (D) and a transfer layered body may be laminated only to one side, and a support (D) and another electrically conductive pattern such as a copper foil may be laminated to the other side.

Provided are the laminates including the transfer layered bodies of the invention described above and the electrically conductive pattern production methods using the transfer layered bodies. With the production methods, a seed layer that serves as a base for plating and has stable quality can be formed because the occurrence of scratches on the plating seed layer due to contact with a coating apparatus during application and contact with conveyor rollers is prevented, and the plating seed layer can provide good adhesion between a support and a metal layer (metal plating layer). Moreover, a substrate whose front and back sides connected to each other and which has circuit patterns each having a smooth surface and a good rectangular cross-sectional shape can be produced. The circuit patterns can be formed on various smooth substrates with high design reproducibility. Therefore, by using the layered bodies of the invention for a semi-additive process, substrates for high-density high-performance printed wiring boards having various shapes and sizes and these printed wiring boards can be preferably provided at low cost, and the industrial applicability in the field of printed wiring boards is high. The laminates including the transfer layered bodies of the invention and the electrically conductive pattern production methods using the transfer layered bodies are preferably used for electronic members such as high-speed transmission printed wiring boards, rigid printed wiring boards, flexible printed wiring boards, electrically conductive films for touch panels, metal meshes for touch panels, organic solar cells, organic EL devices, organic transistors, RFIDs such as contactless IC cards, electromagnetic shields, LED light substrates, digital signage, package substrates, ceramic substrates, glass substrates, silicon wafer substrates, and metal substrates. The invention can also be preferably used for decorative plating for molded articles and molded interconnect devices (MIDs). In particular, the invention is optimal for high-speed rigid printed wiring board and high-speed flexible printed wiring board applications that require high-frequency transmission.

EXAMPLES

The present invention will be described in detail by way of Examples. However, the invention is not limited to the following Examples.

Preparation Example 1: Preparation of Coating Solution (1) for Forming Plating Seed Layer (B)

A chloroform solution (30 mL) containing 9.6 parts by mass of p-toluenesulfonyl chloride was added dropwise to a mixture containing 20 parts by mass of methoxypolyethylene glycol (number average molecular weight: 2,000), 8.0 parts by mass of pyridine, and 20 mL of chloroform over 30 minutes under ice-cooled stirring in a nitrogen atmosphere. The mixture was stirred for 4 hours at a bath temperature of 40° C., and 50 mL of chloroform was mixed into the resulting mixture.

Next, the resulting product was washed with 100 mL of a 5% by mass aqueous hydrochloric acid solution, with 100 mL of a saturated aqueous sodium hydrogencarbonate solution, and then with 100 mL of saturated brine, dried over magnesium sulfate, filtered, concentrated under reduced pressure, washed several times with hexane, filtered, and dried under reduced pressure at 80° C. to thereby obtain methoxypolyethylene glycol having a p-toluenesulfonyloxy group.

5.39 Parts by mass of the methoxypolyethylene glycol having a p-toluenesulfonyloxy group, 20 parts by mass of polyethyleneimine (manufactured by Aldrich, molecular weight: 25,000), 0.07 parts by mass of potassium carbonate, and 100 mL of N,N-dimethylacetamide were mixed, and the mixture was stirred at 100° C. for 6 hours in a nitrogen atmosphere.

Next, 300 mL of a solution mixture of ethyl acetate and hexane (volume ratio of acetate/hexane=1/2) was added. The resulting mixture was vigorously stirred at room temperature, and a solid product was collected by filtration. The solid was washed with 100 mL of a solution mixture of ethyl acetate and hexane (volume ratio of acetate/hexane=1/2) and dried under reduced pressure to thereby obtain a compound including polyethylene glycol bonded to polyethyleneimine.

138.8 Parts by mass of an aqueous solution containing 0.592 parts by mass of the above-obtained compound including polyethylene glycol bonded to polyethyleneimine and 10 parts by mass of silver oxide were mixed, and the mixture was stirred at 25° C. for 30 minutes. Next, 46 parts by mass of dimethylethanolamine was gradually added under stirring, and the resulting mixture was stirred at 25° C. for 30 minutes. Next, 15.2 parts by mass of a 10% by mass aqueous ascorbic acid solution was gradually added under stirring, and the mixture was further stirred for 20 hours to thereby obtain a silver dispersion.

A solvent mixture of 200 mL of isopropyl alcohol and 200 mL of hexane was added to the above-obtained silver dispersion, and the resulting mixture was stirred for 2 minutes and subjected to centrifugal concentration at 3000 rpm for 5 minutes. Then the supernatant was removed, and a solvent mixture of 50 mL of isopropyl alcohol and 50 mL of hexane was added to the precipitate. The resulting mixture was stirred for 2 minutes and subjected to centrifugal concentration at 2000 rpm for 10 minutes. Then the supernatant was removed, and 20 parts by mass of water was further added to the precipitate. The resulting mixture was stirred for 2 minutes, and the organic solvent was removed under reduced pressure. 10 Parts by mass of water was further added, and the mixture was subjected to dispersion under stirring. The dispersion obtained was left to stand in a refrigerator at −40° C. for 24 hours to freeze the dispersion, and the frozen dispersion was treated for 24 hours in a freeze dryer (FDU-2200 manufactured by TOKYO RIKAKIKAI Co., Ltd.) to obtain silver particles containing a dispersant having a basic nitrogen atom-containing group as flake-like greenish-gray clusters having a metallic luster.

The powder of the obtained silver particles having a basic nitrogen atom-containing group was dispersed in a solvent mixture of 45 parts by mass of ethanol and 55 parts by mass of ion exchanged water to prepare a 5% by mass coating solution (1) for forming a plating seed layer (B). The ratio of the dispersant in the obtained silver particles was computed using ashes obtained by heating the silver particles at 500° C. for 1 hour in an electric furnace and was found to be 5% by mass with respect to 100% by mass of the solid silver.

Preparation Example 2: Preparation of Coating Solution (2) for Forming Plating Seed Layer (B)

A reaction vessel equipped with a stirrer, a reflux condenser tube, a nitrogen introduction tube, a thermometer, and dropping funnels was charged with 32 parts by mass of methyl ethyl ketone and 32 parts by mass of ethanol, and the mixture was heated to 80° C. in a nitrogen flow. Next, a mixture of 20 parts by mass of 2-(methacryloyloxy)ethyl phosphate, 70 parts by mass of methoxypolyethylene glycol methacrylate (molecular weight: 1,000), 10 parts by mass of glycidyl methacrylate, 4.1 parts by mass of methyl mercaptopropionate, and 80 parts by mass of methyl ethyl ketone and a mixture of 0.5 parts by mass of a polymerization initiator ("V-65" manufactured by Wako Pure Chemical Industries, Ltd., 2,2'-azobis(2,4-dimethylvaleronitrile)) and 5 parts by mass of methyl ethyl ketone were added dropwise from different dropping funnels over 2 hours under stirring in a nitrogen atmosphere.

Next, 0.3 parts by mass of a polymerization initiator ("PERBUTYL O" manufactured by NOF CORPORATION, t-butylperoxy-2-ethylhexanoate) was added twice at 4 hour interval, and the resulting mixture was stirred at 80° C. for 12 hours. Deionized water was added to the obtained resin solution to allow the solution to undergo phase-inversion emulsification, and the solvent was removed under reduced pressure. Then deionized water was added to adjust the concentration to thereby obtain a 76.8% by mass aqueous solution of a non-volatile acrylic resin having a phosphate group and an epoxy group. The weight average molecular weight of the acrylic resin was 4,200, and its acid value was 96.2 mgKOH/g.

Next, 5.56 g (53 mmol) of an 85% by mass aqueous solution of N,N-diethylhydroxylamine, 138 mg of the 76.8% by mass water dispersion of the acrylic resin having a phosphate group and an epoxy group, and 15 g of deionized water were mixed to prepare a reducing agent solution.

200 mg of the 76.8% by mass water dispersion of the acrylic resin having a phosphate group and an epoxy group was dissolved in 5 g of water. A solution prepared by dissolving 6.00 g (35.3 mmol) of silver nitrate in 10 g of water was added to the above solution, and the mixture was stirred. The reducing agent solution prepared above was added dropwise to the mixite at 25° C. over 2 hours. After completion of the dropwise addition, the mixture was stirred for 3 hours to complete the reaction. Then the resulting solution was filtrated using a membrane filter (pore diameter: 0.45 μm). Next, ion exchanged water was added to adjust the nonvolatile content to 5% by mass, and a coating solution (2) for forming a plating seed layer (B) was thereby obtained. The ratio of the dispersant in the obtained silver particles was computed using ashes obtained by heating the silver particles at 500° C. for 1 hour in an electric furnace and was found to be 8% by mass with respect to 100% by mass of the solid silver.

Preparation Example 3: Preparation of Coating Solution (1) for Forming Resin Layer (C)

60 Parts by mass of phenoxy resin 4250 (manufactured by Mitsubishi Chemical Corporation, bisphenol A/bisphenol F mixture type, molecular weight: 60,000, solid content: 100% by mass), 33 parts by mass of an aminotriazine novolac resin ("PHENOLITE LA-7052" manufactured by DIC Corporation, solid content: 60% by mass), 17 parts by mass of an epoxy resin ("EPICLON EXA-830CRP" manufactured by DIC Corporation, bisphenol F-type epoxy resin, epoxy equivalent: 162 g/eq), 3 parts by mass of trimellitic anhydride, and 0.5 parts by mass of "TBZ" manufactured by SHIKOKU CHEMICALS CORPORATION and used as a curing catalyst were mixed and diluted with cyclohexanone such that the non-volatile content was 2% by mass. Then these components were uniformly mixed to obtain a coating solution (1) for forming a resin layer (C).

Preparation Example 4: Preparation of Coating Solution (2) for Forming Resin Layer (C)

In a container equipped with a thermometer, a nitrogen gas introduction tube, and a stirrer and purged with nitrogen, 100 parts by mass of polyester polyol (polyester polyol obtained by the reaction of 1,4-cyclohexanedimethanol, neopentyl glycol, and adipic acid), 17.6 parts by mass of 2,2-dimethylolpropionic acid, 21.7 parts by mass of 1,4-cyclohexanedimethanol, and 106.2 parts by mass of dicyclohexylmethane-4,4'-diisocyanate were allowed to react in a solvent mixture of 178 parts by mass of methyl ethyl ketone to thereby obtain a solution of a urethane prepolymer having an isocyanate group at a terminal end.

Next, 13.3 parts by mass of triethylamine was added to the urethane prepolymer solution to neutralize carboxyl groups included in the urethane prepolymer. 380 Parts by mass of water was further added, and the mixture was sufficiently stirred to thereby obtain a water dispersion of the urethane prepolymer.

8.8 Parts by mass of a 25% by mass aqueous ethylenediamine solution was added to the above-obtained water dispersion of the urethane prepolymer, and the resulting mixture was stirred to subject the urethane prepolymer to chain elongation. Then aging and removal of the solvent were performed to obtain a water dispersion of a urethane resin (non-volatile content: 30% by mass). The weight average molecular weight of the urethane resin was 53,000.

Next, a reaction vessel equipped with a stirrer, a reflux condenser tube, a nitrogen introduction tube, a thermometer, a dropping funnel for dropwise addition of a monomer, and a dropping funnel for dropwise addition of a polymer was charged with 140 parts by mass of deionized water and 100 parts by mass of the above-obtained water dispersion of the urethane resin, and the mixture was heated to 80° C. while nitrogen was blown into the mixture. Then a monomer mixture of 60 parts by mass of methyl methacrylate, 30 parts by mass of n-butyl acrylate, and 10 parts by mass of N-n-butoxymethylacrylamide and 20 parts by mass of a 0.5% by mass aqueous ammonium persulfate solution were added dropwise from different dropping funnels over 120 minutes under stirring while the temperature inside the reaction vessel was maintained at 80° C.

After completion of the dropwise addition, the mixture was further stirred at 80° C. for 60 minutes, and the temperature inside the reaction vessel was reduced to 40° C. Then the mixture was diluted with deionized water such that the non-volatile content was 2% by mass, and the resulting mixture was filtered using a 200 mesh filter cloth to thereby obtain a coating solution (2) used to form a resin layer (C) and containing a core-shell type composite resin having a shell layer formed of the urethane resin and a core layer formed of a vinyl resin prepared using methyl methacrylate etc. as raw materials.

Preparation Example 5: Preparation of Transfer Layered Body (1)

The coating solution (1) for forming a plating seed layer (B) obtained in Preparation Example 1 was applied using a desktop compact coater ("K Printing Proofer" manufactured by RK Print Coat Instruments) to the surface of a release film (release PET film "TN-200" manufactured by TOYOBO CO., LTD., thickness: 38 μm) on which a release layer had been formed. Specifically, the coating solution (1) was applied such that the dry thickness of the silver layer corresponding to the plating seed layer (B) was 0.1 μm and was then dried at 150° C. for 5 minutes. The plating seed layer (B) on the release film was analyzed using a glow discharge optical emission spectrometer. The signal intensity of carbon atoms present at the interface between air and the plating seed layer (B) was 0.89, and the signal intensity of carbon atoms present at the interface between the plating seed layer (B) and the release film was 0.43.

Then the coating solution (1) used to form a resin layer (C) and obtained in Preparation Example 3 was applied using a desktop compact coater ("K Printing Proofer" manufactured by RK Print Coat Instruments) and dried at 180° C. for 3 minutes such that the dry thickness of a layer corresponding to the resin layer (C) was 0.3 μm. The plating seed layer (B) and the resin layer (C) were thereby formed on the surface of the release film corresponding to the temporary support (A), and a transfer layered body (1) was obtained. Cuts were made on the surface with the resin layer (C) formed thereon using a cutter to form 100 squares with a side of 1 mm, and a cross-cut peel test using an adhesive tape was performed. All the 100 squares were peeled off at the interface between the release film and the plating seed layer (B), showing that the basic nitrogen atom-containing groups included in the dispersant (b1) contained in the plating seed layer (B) reacted with the epoxy groups included in the epoxy resin and carboxylic acid derived from trimellitic acid that were contained in the resin layer (C) to thereby form chemical bonds.

Preparation Example 6: Preparation of Transfer Layered Body (2)

The coating solution (1) used to form a plating seed layer (B) and obtained in Preparation Example 1 was applied using a desktop compact coater ("K Printing Proofer" manufactured by RK Print Coat Instruments) to a glossy surface (non-roughened surface) of a copper foil ("F2-WS" copper foil manufactured by Furukawa Electric Co., Ltd., thickness: 18 μm). Specifically, the coating solution (1) was applied such that the dry thickness of the silver layer corresponding to the plating seed layer (B) was 0.1 μm and then dried at 200° C. for 5 minutes. The plating seed layer (B) on the copper foil was analyzed using a glow discharge optical emission spectrometer. The signal intensity of carbon atoms present at the interface between air and the plating seed layer (B) was 0.85, and the signal intensity of carbon atoms present at the interface between the plating seed layer (B) and the copper foil was 0.3.

Then the coating solution (1) used to form a resin layer (C) and obtained in Preparation Example 3 was applied using a desktop compact coater ("K Printing Proofer" manufactured by RK Print Coat Instruments) and dried at 180° C. for 3 minutes such that the dry thickness of the layer corresponding to the resin layer (C) was 0.3 μm. Then the coating solution (2) used to form a resin layer (C) and obtained in Preparation Example 4 was applied using a desktop compact coater ("K Printing Proofer" manufactured by RK Print Coat Instruments) and dried at 120° C. for 5 minutes such that the dry thickness of the layer corresponding to the resin layer (C) was 0.2 μm. In this manner, the plating seed layer (B) and the resin layers (C) were formed on the surface of the copper foil corresponding to the temporary support (A), and a transfer layered body (2) was obtained. Cuts were made on the surface with the resin layers (C) formed thereon using a cutter to form 100 squares with a side of 1 mm, and a cross-cut peel test using an adhesive tape was performed. All the 100 squares were peeled off at the interface between the copper foil and the plating seed layer (B), showing that the basic nitrogen atom-containing groups included in the dispersant (b1) contained in the plating seed layer (B) reacted with the epoxy groups included in the epoxy resin and carboxylic acid derived from trimellitic anhydride that were contained in the resin layers (C) to thereby form chemical bonds.

Preparation Example 7: Preparation of Transfer Layered Body (3)

The coating solution (2) used to form a plating seed layer (B) and obtained in Preparation Example 2 was used to form a lattice pattern with a line width of 5 mm and a line spacing of 5 mm on the surface of a release film (release PRT film "TN-200" manufactured by TOYOBO CO., LTD., thickness: 38 μm) on which a release layer had been formed. Specifically, the coating solution (2) was printed using an inkjet printer ("inkjet tester EB100" manufactured by KONICA MINOLTA, INC., evaluation printer head KM512L, ejection amount: 42 pL) such that the dry thickness of the silver layer corresponding to the plating seed layer (B) was 0.1 μm and was then dried at 150° C. for 5 minutes. The plating seed layer (B) on the copper foil was analyzed using a glow discharge optical emission spectrometer. The signal intensity of carbon atoms present at the interface between air and the plating seed layer (B) was 0.5, and the signal intensity of carbon atoms present at the interface between the plating seed layer (B) and the release film was 0.1.

Then the coating solution (1) used to form a resin layer (C) and obtained in Preparation Example 3 was applied using a desktop compact coater ("K Printing Proofer" manufactured by RK Print Coat Instruments) and dried at 180° C. for 3 minutes such that the dry thickness of the layer corresponding to the resin layer (C) was 0.3 μm. In this manner, the plating seed layer (B) and the resin layer (C) were formed on the surface of the release film corresponding to the support (A), and a transfer layered body (3) was obtained. Cuts were made on the surface with the resin layer (C) formed thereon using a cutter to form 100 squares with a side of 1 mm, and a cross-cut peel test using an adhesive tape was performed. All the 100 squares were peeled off at the interface between the release film and the plating seed layer (B), showing that the phosphate groups included in the dispersant (b1) contained in the plating seed layer (B) reacted with amino groups derived from the aminotriazine novolac resin contained in the resin layer (C) to thereby form chemical bonds.

Preparation Examples 8: Preparation of Build-Up Film

3 Parts by mass of a bisphenol-type epoxy resin ("ZX059" manufactured by Nippon Steel Chemical Co., Ltd., mixture of bisphenol A-type: bisphenol F-type=1:1, epoxy equivalent: about 169), 3 parts by mass of a naphthalene-type epoxy resin ("HP-4032D" manufactured by DIC Corporation, epoxy equivalent: about 144), 12 parts by mass of a crystalline bifunctional epoxy resin ("YX4000HK" manufactured by Mitsubishi Chemical Corporation, epoxy equivalent: about 185), 9 parts by mass of a dicyclopentadiene-type epoxy resin ("HP7200H" manufactured by DIC Corporation, epoxy equivalent: about 275), and 10 parts by mass of a phenoxy resin ("YX7200B35" manufactured by Mitsubishi Chemical Corporation, an MEK solution with a solid content of 35% by mass) were dissolved in 30 parts by mass of solvent naphtha under heating and stirring. The mixture was cooled to room temperature, and 40 parts by mass of an active ester compound ("HPC-8000-65T" manufactured by DIC Corporation, a toluene solution with an active group equivalent of about 223 and a non-volatile content of 65% by mass), 3 parts by mass of a curing accelerator (4-dimethylaminopyridine, an MEK solution with a solid content of 5% by mass), and 140 parts by mass of spherical silica ("SO-C1" manufactured by Admatechs Company Limited, average particle diameter: 0.25 μm, the amount of carbon per unit surface area: 0.36 mg/m$^2$) subjected to surface treatment with a phenylaminosilane-based coupling agent ("KBM573" manufactured by Shin-Etsu Chemical Co., Ltd.) were mixed into the cooled mixture and uniformly dispersed using a high-speed rotary mixer to thereby produce a resin varnish. Next, the resin vanish was uniformly applied to a release surface of a release PET film (thickness: 38 μm) such that the dry thickness of the resin composition layer was 30 μm and dried at 80 to 120° C. (average: 100° C.) for 4 minutes to thereby produce a build-up film.

Preparation Example 9: Preparation of Etching Solution (1) for Silver 2.6 Parts by mass of acetic acid was added to 47.4 parts by mass of water, and 50 parts by mass of 35% by mass hydrogen peroxide water was further added to prepare an etching solution (1) for silver. The molar ratio of hydrogen peroxide to carboxylic acid (hydrogen peroxide/carboxylic acid) in the etching solution (1) for silver was 13.6, and the content of the mixture of hydrogen peroxide and carboxylic acid in the etching solution (1) for silver was 22.4% by mass.

Example 1

Both sides of a polyimide film (Kapton 150EN-A manufactured by DU PONT-TORAY CO., LTD.) were subjected to corona treatment ("Corona surface modification test equipment TEC-4AX" manufactured by KASUGA DENKI, INC., electrode-substrate distance: 0.5 mm, 100 W). Then the transfer layered bodies (1) obtained in Preparation Example 5 were laminated to the polyimide film such that the surfaces of the transfer layered bodies that were formed by the resin layers (C) faced the respective sides of the polyimide film, and a laminator ("compact desktop test laminator" manufactured by TESTER SANGYO CO., LTD.) was used to thermocompression-bond them using metal-metal rolls under the laminating conditions of a roll temperature of 160° C., an air input pressure of 0.4 MPa, and a roll speed of 1 m/minute. Next, only the release films of the transfer layered bodies (1) thermocompression-bonded to both sides of the polyimide film were removed to thereby form the resin layers (C) and the plating seed layers (B) on both sides of the polyimide film. The surface resistances of the plating seed layers (B) on the front and back sides were each 20Ω/□. Then the plating seed layers (B) were dried at 250° C. for 5 minutes, and the surface resistances of the plating seed layers (B) on the front and back sides were each reduced to 1Ω/□.

Then an electroplating solution containing copper sulfate was used to perform electroplating for 27 minutes at a current density of 2 $A/dm^2$ with the above-obtained plating seed layers (B) used as a cathode and phosphorus-containing copper used as an anode, and a copper plating layer (thickness: 12 μm) corresponding to the metal plating layer (E) was thereby formed on the plating seed layers (B). The electroplating solution used was 70 g/L of copper sulfate, 200 g/L of sulfuric acid, 50 mg/L of chlorine ions, and 5 mL/L of an additive (TOP LUCINA SF-M manufactured by OKUNO CHEMICAL INDUSTRIES CO., LTD.).

In this manner, a laminate (1) was obtained in which the resin layers (C), the plating seed layers (B), and the metal plating layers (E) were sequentially stacked on both sides of the support (D).

Example 2

The same procedure as in Example 1 was repeated except that the transfer layered bodies (2) produced in Preparation Example 6 were used instead of the transfer layered bodies (1) used in Example 1 to thereby obtain a laminate (2) in which the resin layers (C), the plating seed layers (B), and the metal plating layers (E) were sequentially stacked on both sides of the support (D). The surface resistances of the plating seed layers (B) on the front and back sides after the thermocompression bonding of the transfer layered bodies and removal of the temporary supports (A) were each 10Ω/□. The surface resistances of the plating seed layers (B) on the front and back sides after drying at 250° C. for 5 minutes were each 0.5Ω/□.

Example 3

The same procedure as in Example 1 was repeated except that the transfer layered bodies (3) produced in Preparation Example 7 were used instead of the transfer layered bodies (1) used in Example 1 to thereby obtain a laminate (3) in which the resin layers (C), the plating seed layers (B), and the metal plating layers (E) were sequentially stacked on both sides of the support (D). The metal plating layers (E) were each formed in the same lattice pattern as the electrically conductive pattern of the plating seed layers (B). The surface resistances of the plating seed layers (B) on the front and back sides after the thermocompression bonding of the transfer layered bodies and removal of the temporary supports (A) were each 50Ω/□. The surface resistances of the plating seed layers (B) on the front and back sides after drying at 250° C. for 5 minutes were each 10 Ω/□.

Example 4

Glossy surfaces (non-roughened surfaces) of copper foils (F2-WS manufactured by Furukawa Electric Co., Ltd., thickness: 18 μm) were laminated to both sides of a prepreg (R-5670KG containing glass fibers and manufactured by Panasonic Corporation, thickness: 0.1 mm, surface roughness Sz: 20.815 μm), and the copper foils and the prepreg were thermocompression-bonded at 195° C. for 90 minutes using a hand press ("Mini Test Press" manufactured by Toyo Seiki Seisaku-sho, Ltd.). Then the resulting laminate was immersed in a ferric chloride etching solution (content: 40% by mass) at 40° C. for 3 minutes to etch the entire surfaces of the copper foils, and a rigid substrate including the cured prepreg corresponding to a support (D) was thereby obtained. The surface roughness Sz of the rigid substrate was 4.215 μm, and the rigid substrate was found to be smoothened. Then both sides of the rigid substrate were subjected to corona treatment ("Corona surface modification test equipment TEC-4AX" manufactured by KASUGA DENKI, INC., electrode-substrate distance: 0.5 mm, 100 W). Next, the transfer layered bodies (2) obtained in Preparation Example 6 were laminated to both sides of the rigid substrate such that the surfaces of the transfer layered bodies that were formed by the resin layers (C) faced the rigid substrate, and they were compression-bonded at 175° C. for 1 minute using a hand press ("Mini Test Press" manufactured by Toyo Seiki Seisaku-sho, Ltd.).

Then a through hole having a diameter of 100 μm was formed using a drill so as to extend from the surface of the copper foil serving as the temporary support (A) of the transfer layered body (2) on one side to the copper foil serving as the temporary support on the other side. Next, plasma treatment was performed for desmearing in order to remove dust (smears) generated by drilling. Then the thus-obtained through hole substrate was subjected to a black hole process (conditioning-carbon adsorption treatment-etching) by MacDermid to cause carbon to adhere to the surface of the through hole, and then the film was dried. Then the copper foils corresponding to the temporary supports (A) with carbon adhering thereto were removed, and a laminate with the resin layers (C) and the plating seed layers (B) formed on the surfaces of the rigid substrate and with carbon adhering to the through hole was thereby produced. The plating seed layers (B) on the front and back sides of the rigid substrate were inspected using a tester. It was found that electrical connection was established between the front and back sides to provide electrical continuity. The surface resistances of the plating seed layers (B) on the front and back sides were each 10Ω/□.

Then an electroplating solution containing copper sulfate was used to perform electroplating for 27 minutes at a current density of 2 $A/dm^2$ with the above-obtained plating seed layers (B) used as a cathode and phosphorus-containing copper used as an anode, and a copper plating layer (thickness: 12 μm) corresponding to a metal plating layer (E) was thereby formed on the plating seed layers (B) and in the through hole. The electroplating solution used was 70 g/L of copper sulfate, 200 g/L of sulfuric acid, 50 mg/L of chlorine ions, and 5 mL/L of an additive (TOP LUCINA SF-M manufactured by OKUNO CHEMICAL INDUSTRIES CO., LTD.).

In this manner, a laminate (4) was obtained in which electrical conductivity was imparted to the through hole and the resin layers (C), the plating seed layers (B), and the metal plating layers (E) were sequentially stacked on both sides of the support (D).

Example 5

The same procedure as in Example 4 was repeated except that a sputtering method was used instead of the black hole process (conditioning-carbon adsorption treatment-etching) by MacDermid used to impart electrical conductivity to the through hole in Example 4. As for the sputtering conditions, the through hole substrate was placed in a sputtering apparatus, and copper used as a sputtering target was attached. Then the chamber was evacuated until the pressure inside the chamber reached $1.0\times10^{-3}$ Pa or lower, and argon gas used as a sputtering gas was supplied to the chamber at a flow rate of 200 sccm to adjust the chamber pressure to 0.3 Pa. While the temperature of the through hole substrate was maintained at 75° C., the copper target was sputtered to deposit a 100 nm-thick metal layer formed of copper. The surface resistances of the plating seed layers (B) on the front and back sides after the thermocompression bonding of the transfer layered bodies and removal of the temporary supports (A) were each 10Ω/□. In this manner, a laminate (5) was obtained in which electrical conductivity was imparted to the through hole and the resin layers (C), the plating seed layers (B), and the metal plating layers (E) were sequentially stacked on both sides of the support (D).

Example 6

Glossy surfaces (non-roughened surfaces) of copper foils (F2-WS manufactured by Furukawa Electric Co., Ltd., thickness: 18 μm) were laminated to both sides of a prepreg (R-5670KG containing glass fibers and manufactured by Panasonic Corporation, thickness: 0.1 mm, surface roughness Sz: 20.815 μm), and the copper foils and the prepreg were thermocompression-bonded at 195° C. for 90 minutes using a hand press ("Mini Test Press" manufactured by Toyo Seiki Seisaku-sho, Ltd.). Then the resulting laminate was immersed in a ferric chloride etching solution (content: 40% by mass) at 40° C. for 3 minutes to etch the entire surfaces of the copper foils, and a rigid substrate including the cured prepreg corresponding to a support (D) was thereby obtained. The surface roughness Sz of the rigid substrate was 4.215 μm, and the rigid substrate was found to be smoothened. Then both sides of the rigid substrate were subjected to corona treatment ("Corona surface modification test equipment TEC-4AX" manufactured by KASUGA DENKI, INC., electrode-substrate distance: 0.5 mm, 100 W). Next, the transfer layered bodies (1) obtained in Preparation Example 5 were laminated to both sides of the rigid substrate such that the surfaces of the transfer layered bodies that were formed by the resin layers (C) faced the rigid substrate, and they were compression-bonded at 175° C. for 1 minute using a hand press ("Mini Test Press" manufactured by Toyo Seiki Seisaku-sho, Ltd.).

Then a through hole having a diameter of 100 μm was formed using a drill so as to extend from the surface of the release film corresponding to the temporary support (A) of the transfer layered body (1) on one side to the release film corresponding to the temporary support (A) on the other side. Next, plasma treatment was performed for desmearing in order to remove dust (smears) generated by drilling. Then only the release films corresponding to the temporary supports (A) were removed from the thus-obtained through hole substrate to form the resin layers (C) and the plating seed layers (B) on the surfaces of the rigid substrate. The surface resistances of the plating seed layers (B) on the front and back sides were each 20Ω/□. Then the plating seed layers (B) were dried at 250° C. for 5 minutes, and the surface resistances of the plating seed layers (B) on the front and back sides were each reduced to 1Ω/□.

Then an electroplating solution containing copper sulfate was used to perform electroplating for 27 minutes at a current density of 2 A/dm$^2$ with the above-obtained plating seed layers (B) used as a cathode and phosphorus-containing copper used as an anode, and a copper plating layer (thickness: 12 μm) corresponding to a metal plating layer (E) was thereby formed on the plating seed layers (B). The electroplating solution used was 70 g/L of copper sulfate, 200 g/L of sulfuric acid, 50 mg/L of chlorine ions, and 5 mL/L of an additive (TOP LUCINA SF-M manufactured by OKUNO CHEMICAL INDUSTRIES CO., LTD.).

Next, to impart electrical conductivity to the through hole in the through hole substrate, an electrically conductive paste ("LS-411MK" manufactured by Asahi Chemical Research Laboratory Co., Ltd.) was used to fill the through hole by printing using a screen printing method and was dried at 150° C. for 30 minutes.

In this manner, a laminate (6) was obtained in which electrical conductivity was imparted to the through hole and the resin layers (C), the plating seed layers (B), and the metal plating layers (E) were sequentially stacked on both sides of the support (D).

Example 7

A core material ("CCL-HL832NB" manufactured by MITSUBISHI GAS CHEMICAL Company, Inc., substrate thickness: 0.1 mm, copper foils: 12 μm) with copper foils laminated on both sides was prepared, and an inner layer plate with electrically conductive patterns formed thereon was produced. Then the build-up films produced in Preparation Example 8 were placed on the surfaces of the electrically conductive patterns on the inner layer plate. Specifically, the surface of each build-up film on the side opposite to the release PET film was placed on a corresponding electrically conductive pattern. Then they were laminated together using a batch-type vacuum pressure laminator. Decompression was performed for 30 seconds to reduce the pressure to 13 hPa or less, and the resulting laminate was compression-bonded at 100° C. and 0.7 MPa for 30 seconds. Then the laminate was heated at 170° C. for 15 minutes, and the release PET films were removed. The surface roughness Sz was 8.010 μm.

Next, glossy surfaces (non-roughened surfaces) of copper foils (F2-WS manufactured by Furukawa Electric Co., Ltd., thickness: 18 μm) were laminated to the surfaces of the build-up films, and the copper foils and the build-up films were thermocompression-bonded at 195° C. for 90 minutes using a hand press ("Mini Test Press" manufactured by Toyo Seiki Seisaku-sho, Ltd.). Then the resulting laminate was immersed in a ferric chloride etching solution (content: 40% by mass) at 40° C. for 3 minutes to etch the entire surfaces of the copper foils, and the cured build-up films corresponding to supports (D) were thereby obtained. The surface roughness Sz of the build-up films was 2.125 μm, and the build-up films were found to be smoothened.

Then the surfaces of the build-up films were subjected to corona treatment ("Corona surface modification test equipment TEC-4AX" manufactured by KASUGA DENKI, INC., electrode-substrate distance: 0.5 mm, 100 W), and the transfer layered bodies (2) obtained in Preparation Example 6 were laminated to the surfaces of the build-ups. Specifically, the surfaces of the transfer layered bodies (2) that were formed by the resin layers (C) were laminated to the surfaces of the build-up films. Then they were compression-bonded at 175° C. for 1 minute using a hand press ("Mini Test Press" manufactured by Toyo Seiki Seisaku-sho, Ltd.).

Next, to form a blind hole extending from the surface of the copper foil corresponding to the temporary support (A) of one of the transfer layered bodies (2) to one of the electrically conductive patterns on the inner layer plate, a laser was used to form the blind via hole having a diameter of 100 μm. Next, to remove dust (smears) generated by the laser processing, plasma treatment was performed for desmearing. Next, the thus-obtained substrate with the blind hole was subjected to a shadow process (conditioning-carbon adsorption treatment-etching) by MacDermid to cause carbon to adhere to the surface of the blind hole, and the film was dried. Next, the copper foils corresponding to the temporary supports (A) and having the carbon adhering thereto were removed, and a laminate was thereby produced in which the carbon adhered to the blind hole and the resin layers (C) and the plating seed layers (B) were formed on the surfaces of the build-up films. The plating seed layers (B) on the build-up films and the electrically conductive patterns on the inner layer plate were inspected using a tester. It was found that electrical connection was established between the surface of one of the plating seed layers (B) and the inner layer plate to provide electrical continuity. The surface resistance of the plating seed layers (B) was 10Ω/□.

Then an electroplating solution containing copper sulfate was used to perform electroplating for 27 minutes at a current density of 2 $A/dm^2$ with the above-obtained plating seed layers (B) used as a cathode and phosphorus-containing copper used as an anode, and a copper plating layer (thickness: 12 μm) corresponding to a metal plating layer (E) was thereby formed on the plating seed layers (B) and on the surface of the blind hole. The electroplating solution used was 70 g/L of copper sulfate, 200 g/L of sulfuric acid, 50 mg/L of chlorine ions, and 5 mL/L of an additive (TOP LUCINA SF-M manufactured by OKUNO CHEMICAL INDUSTRIES CO., LTD.).

In this manner, a laminate (7) was obtained in which electrical conductivity was imparted to the blind hole and the supports (D), the resin layers (C), the plating seed layers (B), and the metal plating layers (E) were sequentially stacked.

Example 8

The same procedure as in Example 7 was repeated except that a sputtering method was used instead of the shadow process (conditioning-carbon adsorption treatment-etching) by MacDermid used in Example 7. As for the sputtering conditions, the substrate with the blind hole was placed in a sputtering apparatus, and copper used as a sputtering target was attached. Then the chamber was evacuated until the pressure inside the chamber reached $1.0\times10^{-3}$ Pa or lower, and argon gas used as a sputtering gas was supplied to the chamber at a flow rate of 200 sccm to adjust the chamber pressure to 0.3 Pa. While the temperature of the substrate with the blind hole was maintained at 75° C., the copper target was sputtered to deposit a 100 nm-thick metal layer formed of copper. The temporary supports (A) were removed, and the surface resistance of the plating seed layers (B) before the formation of the metal plating layer (E) was measured and found to be 10Ω/□. In this manner, a laminate (8) was obtained in which electrical conductivity was imparted to the through hole and the supports (D), the resin layers (C), the plating seed layers (B), and the metal plating layers (E) were sequentially stacked.

Example 9

A core material ("R-5775KH" manufactured by Panasonic Corporation, substrate thickness: 0.1 mm, copper foils: 18 μm) with copper foils laminated on both sides was prepared, and an inner layer plate with electrically conductive patterns formed thereon was produced. Then prepregs ("R-5670KG" containing glass fibers and manufactured by Panasonic Corporation, thickness: 0.1 mm, surface roughness Sz: 20.815 μm) and glossy surfaces (non-roughen surfaces) of copper foils (F2-WS manufactured by Furukawa Electric Co., Ltd., thickness: 18 μm) were sequentially laminated to the surfaces the inner layer plate, and they were thermocompression-bonded at 195° C. for 90 minutes using a hand press ("Mini Test Press" manufactured by Toyo Seiki Seisaku-sho, Ltd.). Then the resulting laminate was immersed in a ferric chloride etching solution (content: 40% by mass) at 40° C. for 3 minutes to etch the entire surfaces of the copper foils, and a rigid substrate including the cured prepregs corresponding to supports (D) was thereby obtained. The surface roughness Sz of the rigid substrate was 4.215 μm, and the rigid substrate was found to be smoothened. Then both sides of the rigid substrate were subjected to corona treatment ("Corona surface modification test equipment TEC-4AX" manufactured by KASUGA DENKI, INC., electrode-substrate distance: 0.5 mm, 100 W). Next, the transfer layered bodies (2) obtained in Preparation Example 6 were laminated to both sides of the rigid substrate such that the surfaces of the transfer layered bodies that were formed by the resin layers (C) faced the rigid substrate, and they were compression-bonded at 175° C. for 1 minute using a hand press ("Mini Test Press" manufactured by Toyo Seiki Seisaku-sho, Ltd.).

Next, a blind via hole (blind hole) having a diameter of 100 μm was formed using a laser so as to extend from the surface of the copper foil corresponding to the temporary support (A) of one of the transfer layered bodies (2) to one of the electrically conductive patterns on the inner layer plate. Next, to remove dust (smears) generated by the laser drilling processing, plasma treatment was performed for desmearing. Then only the copper foils corresponding to the temporary supports (A) were removed from the substrate with the blind hole to form the resin layers (C) and the plating seed layers (B) on the surfaces of the rigid substrate. The plating seed layers (B) and the electrically conductive patterns on the inner layer plate were inspected using a tester. It was found that electrical connection was established between the surface of one of the plating seed layers (B) and the inner layer plate to provide electrical continuity. The surface resistance of the plating seed layers (B) was 10Ω/□.

Then an electroplating solution containing copper sulfate was used to perform electroplating for 40 minutes at a current density of 2 A/dm$^2$ with the above-obtained plating seed layers (B) used as a cathode and phosphorus-containing copper used as an anode, and a copper plating layer (thickness: 18 μm) corresponding to a metal plating layer (E) was thereby formed on the plating seed layers (B). The electroplating solution used was 70 g/L of copper sulfate, 200 g/L of sulfuric acid, 50 mg/L of chlorine ions, and 5 mL/L of an additive (TOP LUCINA SF-M manufactured by OKUNO CHEMICAL INDUSTRIES CO., LTD.).

Then, to impart electrical conductivity to the blind via hole in the substrate with the blind hole, an electrically conductive paste ("LS-411MK" manufactured by Asahi Chemical Research Laboratory Co., Ltd.) was used to fill the blind hole by printing using a screen printing method and was dried at 150° C. for 30 minutes.

In this manner, a laminate (9) was obtained in which electrical conductivity was imparted to the blind hole and the supports (D), the resin layers (C), the plating seed layers (B), and the metal plating layers (E) were sequentially stacked.

Example 10

Glossy surfaces (non-roughened surfaces) of copper foils (F2-WS manufactured by Furukawa Electric Co., Ltd., thickness: 18 μm) were laminated to both sides of a prepreg (R-5670KG containing glass fibers and manufactured by Panasonic Corporation, thickness: 0.1 mm, surface roughness Sz: 20.815 μm), and the copper foils and the prepreg were thermocompression-bonded at 195° C. for 90 minutes using a hand press ("Mini Test Press" manufactured by Toyo Seiki Seisaku-sho, Ltd.). Then the resulting laminate was immersed in a ferric chloride etching solution (content: 40% by mass) at 40° C. for 5 minutes to etch the entire surfaces of the copper foils, and a rigid substrate including the cured prepreg corresponding to a support (D) was thereby obtained. The surface roughness Sz of the rigid substrate was 4.215 μm, and the rigid substrate was found to be smoothened. Then both sides of the rigid substrate were subjected to corona treatment ("Corona surface modification test equipment TEC-4AX" manufactured by KASUGA DENKI, INC., electrode-substrate distance: 0.5 mm, 100 W). Next, the transfer layered bodies (1) obtained in Preparation Example 5 were laminated to both sides of the rigid substrate such that the surfaces of the transfer layered bodies that were formed by the resin layers (C) faced the rigid substrate, and they were compression-bonded at 175° C. for 1 minute using a hand press ("Mini Test Press" manufactured by Toyo Seiki Seisaku-sho, Ltd.).

Then a through hole having a diameter of 100 μm was formed using a drill so as to extend from the surface of the release film corresponding to the temporary support (A) of the transfer layered body (1) on one side to the release film corresponding to the temporary support (A) on the other side. Next, to remove dust (smears) generated by drilling, plasma treatment was performed for desmearing. Then electrical conductivity was imparted to the thus-obtained through hole substrate by a palladium method. As for the treatment conditions for the palladium method, the substrate was immersed in a catalyst solution containing 1 g/L of palladium chloride, 1 ml/L of hydrochloric acid, and 1 g/L of dimethylthiourea at 25° C. for 3 minutes. Next, the substrate was washed with water and treated with a reducing solution containing 10 g/L of dimethylamine borane and 5 g/L of sodium hydroxide at 50° C. for 2 minutes to thereby impart electrical conductivity to the through hole with palladium. Next, the palladium-adhering release films corresponding to the temporary supports (A) were removed to thereby form the resin layers (C) and the plating seed layers (B) on the surfaces of the rigid substrate, and a laminate with palladium adhering to the through hole was thereby produced. The plating seed layers (B) on the front and back sides of the rigid substrate were inspected using a tester. It was found that electrical connection was established between the front and back sides to provide electric continuity. The surface resistances of the plating seed layers (B) on the front and back sides were each 20Ω/□.

Then electrically conductive patterns were formed by a semi-additive process. A plating resist ("RY-5125" manufactured by Showa Denko Materials Co., Ltd., thickness: 25 μm) was applied to the surface of each plating seed layer (B) at 110° C., 0.4 MPa, and 1 m/minute, and exposure treatment (316 mJ/cm$^2$) was performed using an exposure machine ("BOX-W10" manufactured by Sunhayato Corp.) for 2 minutes. Then the resulting substrate was immersed in a developer (a 1% by mass aqueous sodium carbonate solution) for 5 minutes to perform development treatment, and a patterned resist was thereby formed. The through hole was not clogged with the plating resist.

Then the plating seed layers (B) on which the patterned resist was formed and the through hole were subjected to copper plating treatment. An electroplating solution containing copper sulfate was used to perform electroplating for 40 minutes at a current density of 2 A/dm$^2$ with the above-obtained plating seed layers (B) with the patterned resist formed thereon used as a cathode and phosphorus-containing copper used as an anode, and a copper plating layer (thickness: 18 μm) corresponding to a metal plating layer (E) was thereby formed on the plating seed layers (B). The electroplating solution used was 70 g/L of copper sulfate, 200 g/L of sulfuric acid, 50 mg/L of chlorine ions, and 5 mL/L of an additive (TOP LUCINA SF-M manufactured by OKUNO CHEMICAL INDUSTRIES CO., LTD.).

Next, the resulting substrate was immersed in 3% by mass sodium hydroxide for 3 minutes to remove the plating resist. Then the substrate was immersed in the etching solution (1) for silver obtained in Preparation Example 9 at 25° C. for 30 seconds to remove the plating seed layers from portions other than portions in which the metal plating layer serving as the electrically conductive patterns was formed, and a printed wiring board was thereby obtained. Circuit-forming portions of the produced printed wiring board had a rectangular cross-sectional shape with no reduction in wiring height, no reduction in wiring width, and no undercut, and the electrically conductive patterns each had a smooth surface. In this manner, a laminate (10) was obtained in which electrical conductivity was imparted to the through hole and the resin layers (C), the plating seed layers (B), and the metal plating layers (E) were sequentially stacked on both sides of the support (D).

Example 11

The same procedure as in Example 10 was repeated except that a sputtering method was used instead of the palladium method in Example 10. As for the sputtering conditions, the through hole substrate was placed in a sputtering apparatus, and copper used as a sputtering target was attached. Then the chamber was evacuated until the pressure inside the chamber reached $1.0\times10^{-3}$ Pa or lower, and argon gas used as a sputtering gas was supplied to the chamber at a flow rate of 200 sccm to adjust the chamber pressure to 0.3 Pa. While the temperature of the substrate with the blind hole was maintained at 75° C., the copper target was sputtered to deposit a 100 nm-thick metal layer formed of copper. Then the temporary supports (A) were removed, and the surface resistances of the plating seed layers (B) on the front and back sides were each 20Ω/□.

In this manner, a laminate (11) was obtained in which electrical conductivity was imparted to the through hole and the resin layers (C), the plating seed layers (B), and the metal plating layers (E) were sequentially stacked on both sides of the support (D).

Example 12

Glossy surfaces (non-roughened surfaces) of copper foils (F2-WS manufactured by Furukawa Electric Co., Ltd., thickness: 18 μm) were laminated to both sides of a prepreg (R-5670KG containing glass fibers and manufactured by Panasonic Corporation, thickness: 0.1 mm, surface roughness Sz: 20.815 μm), and the copper foils and the prepreg were thermocompression-bonded at 195° C. for 90 minutes using a hand press ("Mini Test Press" manufactured by Toyo Seiki Seisaku-sho, Ltd.). Then the resulting laminate was immersed in a ferric chloride etching solution (content: 40% by mass) at 40° C. for 3 minutes to etch the entire surfaces of the copper foils, and a rigid substrate including the cured prepreg corresponding to a support (D) was thereby obtained. The surface roughness Sz of the rigid substrate was 4.215 μm, and the rigid substrate was found to be smoothened. Then both sides of the rigid substrate were subjected to corona treatment ("Corona surface modification test equipment TEC-4AX" manufactured by KASUGA DENKI, INC., electrode-substrate distance: 0.5 mm, 100 W). Next, the transfer layered bodies (1) obtained in Preparation Example 5 were laminated to both sides of the rigid substrate such that the surfaces of the transfer layered bodies that were formed by the resin layers (C) faced the rigid substrate, and they were compression-bonded at 175° C. for 1 minute using a hand press ("Mini Test Press" manufactured by Toyo Seiki Seisaku-sho, Ltd.).

Then a through hole having a diameter of 100 μm was formed using a drill so as to extend from the surface of the release film corresponding to the temporary support (A) of the transfer layered body (1) on one side to the release film corresponding to the temporary support (A) on the other side. Next, plasma treatment was performed for desmearing in order to remove dust (smears) generated by drilling. Then the release films corresponding to the temporary supports (A) were removed to thereby produce a laminate including the resin layers (C) and the plating seed layers (B) formed on the support (D). The surface resistances of the plating seed layers (B) on the front and back sides after removal of the temporary supports (A) were each 20 Ω/□.

Then electrically conductive patterns were formed by a semi-additive process. A plating resist ("RY-5125" manufactured by Showa Denko Materials Co., Ltd., thickness: 25 μm) was applied to the surface of each plating seed layer (B) at 110° C., 0.4 MPa, and 1 m/minute, and exposure treatment (316 mJ/cm$^2$) was performed using an exposure machine ("BOX-W10" manufactured by Sunhayato Corp.) for 2 minutes. Then the resulting substrate was immersed in a developer (a 1% by mass aqueous sodium carbonate solution) for 5 minutes to perform developing treatment, and a patterned resist was thereby formed.

Then the above-obtained plating seed layers (B) each having the patterned resist formed thereon were subjected to copper plating treatment. An electroplating solution containing copper sulfate was used to perform electroplating for 40 minutes at a current density of 2 A/dm$^2$ with the plating seed layers (B) with the patterned resist formed thereon used as a cathode and phosphorus-containing copper used as an anode, and a copper plating layer (thickness: 18 μm) corresponding to a metal plating layer (E) was thereby formed on the plating seed layers (B). The electroplating solution used was 70 g/L of copper sulfate, 200 g/L of sulfuric acid, 50 mg/L of chlorine ions, and 5 mL/L of an additive (TOP LUCINA SF-M manufactured by OKUNO CHEMICAL INDUSTRIES CO., LTD.).

Next, the resulting substrate was immersed in 3% by mass sodium hydroxide for 3 minutes to remove the plating resist. Then the substrate was immersed in the etching solution (1) for silver obtained in Preparation Example 9 at 25° C. for 30 seconds to remove the plating seed layers from portions other than portions in which the metal plating layer serving as the electrically conductive patterns was formed, and a printed wiring board was thereby obtained. Circuit-forming portions of the produced printed wiring board had a rectangular cross-sectional shape with no reduction in wiring height, no reduction in wiring width, and no undercut, and the electrically conductive patterns each had a smooth surface.

Then, to impart electrical conductivity to the through hole in the through hole substrate, an electrically conductive paste ("LS-411MK" manufactured by Asahi Chemical Research Laboratory Co., Ltd.) was used to fill the through hole by printing using a screen printing method and was dried at 150° C. for 30 minutes.

In this manner, a laminate (12) was obtained in which electrical conductivity was imparted to the through hole and the resin layers (C), the plating seed layers (B), and the metal plating layers (E) were sequentially stacked on both sides of the support (D).

Example 13

Glossy surfaces (non-roughened surfaces) of copper foils (F2-WS manufactured by Furukawa Electric Co., Ltd., thickness: 18 μm) were laminated to both sides of a prepreg (R-5670KG containing glass fibers and manufactured by Panasonic Corporation, thickness: 0.1 mm, surface roughness Sz: 20.815 μm), and the copper foils and the prepreg were thermocompression-bonded at 195° C. for 90 minutes using a hand press ("Mini Test Press" manufactured by Toyo Seiki Seisaku-sho, Ltd.). Then the resulting laminate was immersed in a ferric chloride etching solution (content: 40% by mass) at 40° C. for 3 minutes to etch the entire surfaces of the copper foils, and a rigid substrate including the cured prepreg corresponding to a support (D) was thereby obtained. The surface roughness Sz of the rigid substrate was 4.215 μm, and the rigid substrate was found to be smoothened. Then both sides of the rigid substrate were subjected to corona treatment ("Corona surface modification test equipment TEC-4AX" manufactured by KASUGA DENKI, INC., electrode-substrate distance: 0.5 mm, 100 W). Next, the transfer layered bodies (2) obtained in Preparation Example 6 were laminated to both sides of the rigid substrate such that the surfaces of the transfer layered bodies that were formed by the resin layers (C) faced the rigid substrate, and they were compression-bonded at 175° C. for 1 minute using a hand press ("Mini Test Press" manufactured by Toyo Seiki Seisaku-sho, Ltd.). Then the copper foils corresponding to the temporary supports (A) were removed to thereby produce a laminate including the resin layers (C) and the plating seed layers (B) formed on the support (D).

The surface resistances of the plating seed layers (B) on the front and back sides after removal of the temporary supports (A) were each 10Ω/□.

Then electrically conductive patterns were formed by a semi-additive process. A plating resist ("RY-5125" manufactured by Showa Denko Materials Co., Ltd., thickness: 25 μm) was applied to the surface of each plating seed layer (B) at 110° C., 0.4 MPa, and 1 m/minute, and exposure treatment (316 mJ/cm$^2$) was performed using an exposure machine ("BOX-W10" manufactured by Sunhayato Corp.) for 2 minutes. Then the resulting substrate was immersed in a developer (a 1% by mass aqueous sodium carbonate solution) for 5 minutes to perform developing treatment, and a patterned resist was thereby formed.

Then the above-obtained plating seed layers (B) each having the patterned resist formed thereon were subjected to copper plating treatment. An electroplating solution containing copper sulfate was used to perform electroplating for 40 minutes at a current density of 2 A/dm$^2$ with the plating seed layers (B) with the patterned resist formed thereon used as a cathode and phosphorus-containing copper used as an anode, and a copper plating layer (thickness: 18 μm) corresponding to a metal plating layer (E) was thereby formed on the plating seed layers (B). The electroplating solution used was 70 g/L of copper sulfate, 200 g/L of sulfuric acid, 50 mg/L of chlorine ions, and 5 mL/L of an additive (TOP LUCINA SF-M manufactured by OKUNO CHEMICAL INDUSTRIES CO., LTD.).

Next, the resulting substrate was immersed in 3% by mass sodium hydroxide for 3 minutes to remove the plating resist. Then the substrate was immersed in the etching solution (1) for silver obtained in Preparation Example 9 at 25° C. for 30 seconds to remove the plating seed layers from portions other than portions in which the metal plating layer serving as the electrically conductive patterns was formed, and a printed wiring board was thereby obtained. Circuit-forming portions of the produced printed wiring board had a rectangular cross-sectional shape with no reduction in wiring height, no reduction in wiring width, and no undercut, and the electrically conductive patterns each had a smooth surface.

Then a through hole having a diameter of 100 μm was formed using a laser so as to extend from the surface of the electrically conductive pattern of the metal plating layer (E) on one side obtained by the pattern etching described above to the electrically conductive pattern on the other side. Next, to remove dust (smears) generated by the laser processing, plasma treatment was performed for desmearing.

Then, to impart electrical conductivity to the through hole of the through hole substrate, an electrically conductive paste ("LS-411MK" manufactured by Asahi Chemical Research Laboratory Co., Ltd.) was used to fill the through hole by printing using a screen printing method and was dried at 160° C. for 30 minutes.

In this manner, a laminate (13) was obtained in which electrical conductivity was imparted to the through hole and the resin layers (C), the plating seed layers (B), and the metal plating layers (E) were sequentially stacked on both sides of the support (D).

Example 14

A core material ("R-5775KH" manufactured by Panasonic Corporation, substrate thickness: 0.1 mm, copper foils: 18 μm) with copper foils laminated on both sides was prepared, and an inner layer plate with electrically conductive patterns formed thereon was produced. Then prepregs ("R-5670KG" containing glass fibers and manufactured by Panasonic Corporation, thickness: 0.1 mm, surface roughness Sz: 20.815 μm) and glossy surfaces (non-roughened surfaces) of copper foils (F2-WS manufactured by Furukawa Electric Co., Ltd., thickness: 18 μm) were sequentially laminated to the surfaces of the inner layer plate, and they were thermocompression-bonded at 195° C. for 90 minutes using a hand press ("Mini Test Press" manufactured by Toyo Seiki Seisaku-sho, Ltd.). Then the resulting laminate was immersed in a ferric chloride etching solution (content: 40% by mass) at 40° C. for 3 minutes to etch the entire surfaces of the copper foils, and a rigid substrate including the cured prepregs corresponding to supports (D) was thereby obtained. The surface roughness Sz of the rigid substrate was 4.215 μm, and the rigid substrate was found to be smoothened. Then both sides of the rigid substrate were subjected to corona treatment ("Corona surface modification test equipment TEC-4AX" manufactured by KASUGA DENKI, INC., electrode-substrate distance: 0.5 mm, 100 W). Next, the transfer layered bodies (1) obtained in Preparation Example 5 were laminated to both sides of the rigid substrate such that the surfaces of the transfer layered bodies that were formed by the resin layers (C) faced the rigid substrate, and they were compression-bonded at 175° C. for 1 minute using a hand press ("Mini Test Press" manufactured by Toyo Seiki Seisaku-sho, Ltd.).

Next, to form a blind via hole (blind hole) extending from the surface of the release film corresponding to the temporary support (A) of one of the transfer layered bodies (1) to one of the electrically conductive patterns on the inner layer plate, a laser was used to form a blind via hole having a diameter of 100 μm. Next, to remove dust (smears) generated by the laser processing, plasma treatment was performed for desmearing. Next, the thus-obtained substrate with the blind hole was subjected to a shadow process (conditioning-carbon adsorption treatment-etching) by MacDermid to cause carbon to adhere to the surface of the blind hole, and the film was dried. Then the carbon-adhering release films corresponding to the temporary supports (A) were removed to form the resin layers (C) and the plating seed layers (B) on the surfaces of the rigid substrate, and a laminate with carbon adhering to the blind hole was thereby produced. The plating seed layers (B) on the rigid substrate and the electrically conductive patterns on the inner layer plate were inspected using a tester. It was found that electrical connection was established between the surface of one of the plating seed layers (B) and the inner layer plate to provide electrical continuity. After removal of the temporary supports (A), the surface resistances of the plating seed layers (B) were each 20Ω/□.

Then electrically conductive patterns were formed by a semi-additive process. A plating resist ("RY-5125" manufactured by Showa Denko Materials Co., Ltd., thickness: 25 μm) was applied to the surface of each plating seed layer (B) at 110° C., 0.4 MPa, and 1 m/minute, and exposure treatment (316 mJ/cm$^2$) was performed using an exposure machine ("BOX-W10" manufactured by Sunhayato Corp.) for 2 minutes. Then the resulting substrate was immersed in a developer (a 1% by mass aqueous sodium carbonate solution) for 5 minutes to perform developing treatment, and a patterned resist was thereby formed. After the development, the blind hole was not clogged with the plating resist.

Then the plating seed layers (B) on which the patterned resist was formed and the blind hole were subjected to copper plating treatment. An electroplating solution containing copper sulfate was used to perform electroplating for 40 minutes at a current density of 2 A/dm$^2$ with the above-obtained plating seed layers (B) with the patterned resist formed thereon used as a cathode and phosphorus-containing copper used as an anode, and a copper plating layer (thickness: 18 μm) corresponding to a metal plating layer (E) was thereby formed on the plating seed layers (B). The electroplating solution used was 70 g/L of copper sulfate, 200 g/L of sulfuric acid, 50 mg/L of chlorine ions, and 5 mL/L of an additive (TOP LUCINA SF-M manufactured by OKUNO CHEMICAL INDUSTRIES CO., LTD.).

Next, the substrate was immersed in 3% by mass sodium hydroxide for 3 minutes to remove the plating resist. Then the substrate was immersed in the etching solution (1) for silver obtained in Preparation Example 9 at 25° C. for 30 seconds to remove the plating seed layers from portions other than portions in which the metal plating layer serving as the electrically conductive patterns was formed, and a printed wiring board was thereby obtained. Circuit-forming portions of the produced printed wiring board had a rectangular cross-sectional shape with no reduction in wiring height, no reduction in wiring width, and no undercut, and the electrically conductive patterns each had a smooth surface. In this manner, a laminate (14) was obtained in which electrical conductivity was imparted to the blind hole and the supports (D), the resin layers (C), the plating seed layers (B), and the metal plating layers (E) were sequentially stacked.

Example 15

The same procedure as in Example 14 was repeated except that a sputtering method was used instead of the shadow process (conditioning-carbon adsorption treatment-etching) in Example 14. As for the sputtering conditions, the substrate with the blind hole was placed in a sputtering apparatus, and copper used as a sputtering target was attached. Then the chamber was evacuated until the pressure inside the chamber reached $1.0\times10^{-3}$ Pa or lower, and argon gas used as a sputtering gas was supplied to the chamber at a flow rate of 200 sccm to adjust the chamber pressure to 0.3 Pa. While the temperature of the substrate with the blind hole was maintained at 75° C., the copper target was sputtered to deposit a 100 nm-thick metal layer formed of copper. The plating seed layers (B) on the rigid substrate and the electrically conductive patterns on the inner layer plate were inspected using a tester. It was found that electrical connection was established between the surface of one of the plating seed layers (B) and the inner layer plate to provide electrical continuity. After removal of the temporary supports (A), the surface resistances of the plating seed layers (B) were 20Ω/□.

In this manner, a laminate (15) was obtained in which electrical conductivity was imparted to the through hole and the supports (D), the resin layers (C), the plating seed layers (B), and the metal plating layers (E) were sequentially stacked.

Example 16

A core material ("R-5775KH" manufactured by Panasonic Corporation, substrate thickness: 0.1 mm, copper foils: 18 μm) with copper foils laminated on both sides was prepared, and an inner layer plate with electrically conductive patterns formed thereon was produced. Then prepregs ("R-5670KG" containing glass fibers and manufactured by Panasonic Corporation, thickness: 0.1 mm, surface roughness Sz: 20.815 μm) and glossy surfaces (non-roughened surfaces) of copper foils (F2-WS manufactured by Furukawa Electric Co., Ltd., thickness: 18 μm) were sequentially laminated to the surfaces of the inner layer plate, and they were thermocompression-bonded at 195° C. for 90 minutes using a hand press ("Mini Test Press" manufactured by Toyo Seiki Seisaku-sho, Ltd.). Then the resulting laminate was immersed in a ferric chloride etching solution (content: 40% by mass) at 40° C. for 5 minutes to etch the entire surfaces of the copper foils, and a rigid substrate including the cured prepregs corresponding to supports (D) was obtained. The surface roughness Sz of the rigid substrate was 4.215 μm, and the rigid substrate was found to be smoothened. Then both sides of the rigid substrate were subjected to corona treatment ("Corona surface modification test equipment TEC-4AX" manufactured by KASUGA DENKI, INC., electrode-substrate distance: 0.5 mm, 100 W). Next, the transfer layered bodies (2) obtained in Preparation Example 6 were laminated to both sides of the rigid substrate such that the surfaces of the transfer layered bodies that were formed by the resin layers (C) faced the rigid substrate, and they were compression-bonded at 175° C. for 1 minute using a hand press ("Mini Test Press" manufactured by Toyo Seiki Seisaku-sho, Ltd.).

Next, to form a blind via hole (blind hole) extending from the surface of the copper foil corresponding to the temporary support (A) of one of the transfer layered bodies (2) to one of the electrically conductive patterns on the inner layer plate, a laser was used to form a blind via hole having a diameter of 100 μm. Next, to remove dust (smears) generated by the laser processing, plasma treatment was performed for desmearing. Then the copper foils corresponding to the temporary supports (A) were removed to produce a laminate having the resin layers (C) and the plating seed layers (B) on the surfaces of the rigid substrate. After removal of the temporary supports (A), the surface resistances of the plating seed layers (B) were 10 Ω/□.

Then electrically conductive patterns were formed by a semi-additive process. A plating resist ("RY-5125" manufactured by Showa Denko Materials Co., Ltd., thickness: 25 μm) was applied to the surface of each plating seed layer (B) at 110° C., 0.4 MPa, and 1 m/minute, and exposure treatment (316 $mJ/cm^2$) was performed using an exposure machine ("BOX-W10" manufactured by Sunhayato Corp.) for 2 minutes. Then the resulting substrate was immersed in a developer (a 1% by mass aqueous sodium carbonate solution) for 5 minutes to perform developing treatment, and a patterned resist was thereby formed. After the development, the blind hole was not clogged with the plating resist.

Then the above-obtained plating seed layers (B) each having the patterned resist formed thereon were subjected to copper plating treatment. An electroplating solution containing copper sulfate was used to perform electroplating for 40 minutes at a current density of 2 $A/dm^2$ with the plating seed layers (B) with the patterned resist formed thereon used as a cathode and phosphorus-containing copper used as an anode, and a copper plating layer (thickness: 18 μm) corresponding to a metal plating layer (E) was thereby formed on the plating seed layers (B). The electroplating solution used was 70 g/L of copper sulfate, 200 g/L of sulfuric acid, 50 mg/L of chlorine ions, and 5 mL/L of an additive (TOP LUCINA SF-M manufactured by OKUNO CHEMICAL INDUSTRIES CO., LTD.).

Next, the substrate was immersed in 3% by mass sodium hydroxide for 3 minutes to remove the plating resist. Then the substrate was immersed in the etching solution (1) for silver obtained in Preparation Example 9 at 25° C. for 30 seconds to remove the plating seed layers (B) from portions other than portions in which the metal plating layer serving as the electrically conductive patterns was formed, and a printed wiring board was thereby obtained. Circuit-forming portions of the produced printed wiring board had a rectangular cross-sectional shape with no reduction in wiring height, no reduction in wiring width, and no undercut, and the electrically conductive patterns each had a smooth surface.

Then, to impart electrical conductivity to the blind via hole in the substrate with the blind hole, an electrically conductive paste ("LS-411MK" manufactured by Asahi Chemical Research Laboratory Co., Ltd.) was used to fill the blind hole by printing using a screen printing method and dried at 160° C. for 30 minutes.

In this manner, a laminate (16) was obtained in which electrical conductivity was imparted to the blind hole and the supports (D), the resin layers (C), the plating seed layers (B), and the metal plating layers (E) were sequentially stacked.

Example 17

A core material ("R-5775KH" manufactured by Panasonic Corporation, substrate thickness: 0.1 mm, copper foils: 18 μm) with copper foils laminated on both sides was prepared, and an inner layer plate with electrically conductive patterns formed thereon was produced. Then prepregs ("R-5670KG" containing glass fibers and manufactured by Panasonic Corporation, thickness: 0.1 mm, surface roughness Sz: 20.815 μm) and glossy surfaces (non-roughened surfaces) of copper foils (F2-WS manufactured by Furukawa Electric Co., Ltd., thickness: 18 μm) were sequentially laminated to the surfaces of the inner layer plate, and they were thermocompression-bonded at 195° C. for 90 minutes using a hand press ("Mini Test Press" manufactured by Toyo Seiki Seisaku-sho, Ltd.). Then the resulting laminate was immersed in a ferric chloride etching solution (content: 40% by mass) at 40° C. for 5 minutes to etch the entire surfaces of the copper foils, and a rigid substrate including the cured prepregs corresponding to supports (D) was obtained. The surface roughness Sz of the rigid substrate was 4.215 μm, and the rigid substrate was found to be smoothened. Then both sides of the rigid substrate were subjected to corona treatment ("Corona surface modification test equipment TEC-4AX" manufactured by KASUGA DENKI, INC., electrode-substrate distance: 0.5 mm, 100 W). Next, the transfer layered bodies (2) obtained in Preparation Example 6 were laminated to both sides of the rigid substrate such that the surfaces of the transfer layered bodies that were formed by the resin layers (C) faced the rigid substrate, and they were compression-bonded at 175° C. for 1 minute using a hand press ("Mini Test Press" manufactured by Toyo Seiki Seisaku-sho, Ltd.). Next, the copper foils corresponding to the temporary supports (A) were removed to produce a laminate having the resin layers (C) and the plating seed layers (B) on the surfaces of the rigid substrate. After removal of the temporary supports (A), the surface resistances of the plating seed layers (B) were 10Ω/□.

Then electrically conductive patterns were formed by a semi-additive process. A plating resist ("RY-5125" manufactured by Showa Denko Materials Co., Ltd., thickness: 25 μm) was applied to the surface of each plating seed layer (B) at 110° C., 0.4 MPa, and 1 m/minute, and exposure treatment (316 mJ/cm$^2$) was performed using an exposure machine ("BOX-W10" manufactured by Sunhayato Corp.) for 2 minutes. Then the resulting substrate was immersed in a developer (a 1% by mass aqueous sodium carbonate solution) for 5 minutes to perform developing treatment, and a patterned resist was thereby formed. After the development, the blind hole was not clogged with the plating resist.

Then the above-obtained plating seed layers (B) each having the patterned resist formed thereon were subjected to copper plating treatment. An electroplating solution containing copper sulfate was used to perform electroplating for 40 minutes at a current density of 2 A/dm$^2$ with the plating seed layers (B) with the patterned resist formed thereon used as a cathode and phosphorus-containing copper used as an anode, and a copper plating layer (thickness: 18 μm) corresponding to a metal plating layer (E) was thereby formed on the plating seed layers (B). The electroplating solution used was 70 g/L of copper sulfate, 200 g/L of sulfuric acid, 50 mg/L of chlorine ions, and 5 mL/L of an additive (TOP LUCINA SF-M manufactured by OKUNO CHEMICAL INDUSTRIES CO., LTD.).

Next, the resulting substrate was immersed in 3% by mass sodium hydroxide for 3 minutes to remove the plating resist. Then the substrate was immersed in the etching solution (1) for silver obtained in Preparation Example 9 at 25° C. for 30 seconds to remove the plating seed layers (B) from portions other than portions in which the metal plating layer serving as the electrically conductive patterns was formed, and a printed wiring board was thereby obtained. Circuit-forming portions of the produced printed wiring board had a rectangular cross-sectional shape with no reduction in wiring height, no reduction in wiring width, and no undercut, and the electrically conductive patterns each had a smooth surface.

Then, to form a blind via hole (blind hole) extending from the surface of the metal plating layer (E) formed into a pattern to one of the electrically conductive patterns on the inner layer plate, a laser was used to form the blind via hole having a diameter of 100 μm. Next, to remove dust (smears) generated by the laser processing, plasma treatment was performed for desmearing.

Then, to impart electrical conductivity to the blind via hole in the substrate with the blind hole, an electrically conductive paste ("LS-411MK" manufactured by Asahi Chemical Research Laboratory Co., Ltd.) was used to fill the blind hole by printing using a screen printing method and was dried at 150° C. for 30 minutes.

In this manner, a laminate (17) was obtained in which electrical conductivity was imparted to the blind hole and the supports (D), the resin layers (C), the plating seed layers (B), and the metal plating layers (E) were sequentially stacked.

Comparative Example 1

The coating solution (1) used to form a resin layer (C) and obtained in Preparation Example 3 was applied to one side (the first coated side is referred to side A) of a polyimide film ("Kapton 150EN-A" manufactured by DU PONT-TORAY CO., LTD., thickness 38 μm) using a desktop compact coater ("K Printing Proofer" manufactured by RK Print Coat Instruments) and dried at 180° C. for 3 minutes. In this manner, a layer corresponding to a resin layer (C) was formed by application on the polyimide film such that the dry thickness of the layer was 0.3 μm. Then the polyimide film was turned over, and the coating solution (1) used to form a resin layer (C) and obtained in Preparation Example 3 was applied to the other side (the side coated at this time is referred to side B) using the desktop compact coater ("K Printing Proofer" manufactured by RK Print Coat Instruments) and dried at 180° C. for 3 minutes. In this manner, a layer corresponding to a resin layer (C) was formed by application such that the dry thickness of the layer was 0.3 μm. When the side B was coated with the coating solution (1) used to form a resin layer (C) and obtained in Preparation Example 3, the side A came into contact with the coating apparatus, and the coating film was scratched. Then the polyimide film was turned over, and the coating solution (1) used to form a plating seed layer (B) and obtained in Preparation Example 1 was applied to the side A using the desktop compact coater ("K Printing Proofer" manufactured by RK Print Coat Instruments) and dried at 180° C. for 3 minutes. In this manner, a silver layer corresponding to a plating seed layer (B) was formed by application such that the dry thickness of the silver layer was 0.1 μm. When the side A was coated with the coating solution (1) used to form a plating seed layer (B) and obtained in Preparation Example 1, the side B came into contact with the coating apparatus, and the coating film was scratched. Then the polyimide film was turned over, and the coating solution (1) obtained in Preparation Example 1 was applied to the side B using the desktop compact coater ("K Printing Proofer" manufactured by RK Print Coat Instruments) and dried at 180° C. for 3 minutes. In this manner, a silver layer corresponding to a plating seed layer (B) was formed by application such that the dry thickness of the silver layer was 0.1 μm. When the side B was coated with the coating solution (1) used to form a plating seed layer (B) and obtained in Preparation Example 1, the side A came into contact with the coating apparatus, and the coating film was scratched.

The surface resistance of the plating seed layer (B) on the side A was 10000Ω/□, and the surface resistance of the plating seed layer (B) on the side B was 20000Ω/□. The laminate was further dried at 250° C. for 5 minutes. Then the surface resistance of the plating seed layer (B) on the side A was reduced to 30Ω/□, and the surface resistance of the plating seed layer (B) on the side B was reduced to 500Ω/□.

Then the above-obtained plating seed layers (B) were subjected to copper plating treatment. An electroplating solution containing copper sulfate was used to perform electroplating for 40 minutes at a current density of 2 A/dm$^2$ with the plating seed layers (B) used as a cathode and phosphorus-containing copper used as an anode, and a copper plating layer (thickness: 18 μm) corresponding to a metal plating layer (E) was thereby formed on the plating seed layers (B). The electroplating solution used was 70 g/L of copper sulfate, 200 g/L of sulfuric acid, 50 mg/L of chlorine ions, and 5 mL/L of an additive (TOP LUCINA SF-M manufactured by OKUNO CHEMICAL INDUSTRIES CO., LTD.).

In this manner, a laminate (R1) was obtained in which the resin layers (C), the plating seed layers (B), and the metal plating layers (E) were sequentially stacked on both sides of the support (D).

<Method for Measuring Surface Resistance>

The surface resistance of a plating seed layer (B) was measured using Loresta GX MCP-T700 with a PSP probe. The unit is Ω/□.

<Method for Evaluating Scratches on Surface of Plating Seed Layer (B) and on Surface of Resin Layer (C)>

Scratches on the surface of a plating support layer (B) and on the surface of a resin layer (C) were evaluated by visual inspection using the following criteria.

A: No scratches were found on both the coating surface of the plating seed layer (B) and the coating surface of the resin layer (C).

B: No scratches were found on the coating surface of the plating seed layer (B), but scratches were formed on the coating surface of the resin layer (C).

C: Scratches were formed on the coating surface of the plating seed layer (B), but no scratches were found on the coating surface of the resin layer (C).

D: Scratches were formed on both the coating surface of the plating seed layer (B) and the coating surface of the resin layer (C).

TABLE 1

| | | Example 1 | Example 2 | Example 3 | Example 4 | Example 5 | Example 6 |
|---|---|---|---|---|---|---|---|
| Laminate | | (1) | (2) | (3) | (4) | (5) | (6) |
| Transfer layered body | | (1) | (2) | (3) | (2) | (2) | (1) |
| Surface resistance (Ω/□) of plating seed layer immediately before formation of metal plating layer (E) | Front side (side A) | 1 | 0.5 | 10 | 10 | 10 | 1 |
| | Back side (side B) | 1 | 0.5 | 10 | 10 | 10 | 1 |
| Scratches on surface of plating seed layer (B) | Front side (side A) | A | A | A | A | A | A |
| | Back side (side B) | A | A | A | A | A | A |
| | | Example 7 | Example 8 | Example 9 | Example 10 | Example 11 | Example 12 |
| Laminate | | (7) | (8) | (9) | (10) | (11) | (12) |
| Transfer layered body | | (2) | (2) | (2) | (1) | (1) | (1) |
| Surface resistance (Ω/□) of plating seed layer immediately before formation of metal plating layer (E) | Front side (side A) | 10 | 10 | 10 | 20 | 20 | 20 |
| | Back side (side B) | — | — | — | 20 | 20 | 20 |
| Scratches on surface of plating seed layer (B) | Front side (side A) | A | A | A | A | A | A |
| | Back side (side B) | — | — | — | A | A | A |
| | | Example 13 | Example 14 | Example 15 | Example 18 | Example 17 | Comparative Example 1 |
| Laminate | | (13) | (14) | (15) | (16) | (17) | (R1) |
| Transfer layered body | | (2) | (1) | (1) | (2) | (2) | — |

TABLE 1-continued

| | | | | | | | |
|---|---|---|---|---|---|---|---|
| Surface resistance (Ω/□) of plating seed layer immediately before formation of metal plating layer (E) | Front side (side A) | 10 | 20 | 20 | 10 | 10 | 30 |
| | Back side (side B) | 10 | — | — | — | — | 500 |
| Scratches on surface of plating seed layer (B) | Front side (side A) | A | A | A | A | A | D |
| | Back side (side B) | A | — | — | — | — | B |

In each of the laminates (1) to (17) obtained in Examples 1 to 17, each of which is the laminate of the invention, the surface resistances of the plating seed layers (B) on the sides A and B after the transfer layered bodies were laminated to the support(s) (D) and only the temporary supports (A) were removed were the same and relatively low. In Examples 1 to 17, unlike the Comparative Example, the coated surfaces did not come into contact with the coating apparatus, and no scratches were formed on the coated surfaces.

However, in Comparative Example 1, the front side (side A) and the back side (side B) were coated alternatively, and the thermal history of the side A differs from that of the side B. Therefore, the surface resistance on the side A differs significantly from that on the side B, and the surface resistances are relatively high. Moreover, since the coated surfaces came into contact with the coating apparatus, many scratches were formed on the coated surfaces. Since the sides A and B having different surface resistances were subjected to copper electroplating simultaneously, copper plating was concentrated on the side with the lower surface resistance, and the plating film on this side was thicker. Since the coated surfaces had scratches, the scratches caused breaks when the electrically conductive patterns were formed by pattern etching, resulting in a reduction in quality.

REFERENCE SIGNS LIST

1: temporary support
2: plating seed layer
3: resin layer
4: support
5: resist
6: metal plating layer
7: smoothing treatment substrate
8: through hole
9: palladium, electrically conductive polymer, electrically conductive paste, or carbon
10: metal film (dry plating method)
11: electrically conductive paste
12: core material
13: copper layer (inner layer)
14: blind hole

The invention claimed is:

1. A transfer layered body comprising: a temporary support (A); a plating seed layer (B) containing a dispersant (b1) and an electrically conductive material (b2); and a resin layer (C) containing a compound (c1) having a functional group [X], the plating seed layer (B) and the resin layer (C) being disposed in this order on at least one side of the temporary support (A), wherein the signal intensity of carbon atoms in the plating seed layer (B) that is measured by glow discharge optical emission spectrometry is larger on a resin layer (C) side than on a temporary support (A) side, wherein, in the plating seed layer (B), the signal intensity measured by the glow discharge optical emission spectrometry on the temporary support (A) side is less than or equal to ⅔ the signal intensity on the resin layer (C) side.

2. The transfer layered body according to claim 1, wherein a basic nitrogen atom-containing group or a phosphate group included in the dispersant (b1) contained in the plating seed layer (B) and the functional group [X] included in the compound (c1) contained in the resin layer (C) have been reacted with each other to form a chemical bond.

3. The transfer layered body according to claim 2, wherein the functional group [X] is at least one functional group selected from an epoxy group, carboxylic acid groups, carboxylic anhydride groups, a keto group, alkylolamido groups, an isocyanate group, a vinyl group, alkyl halide groups, an acryloyl group, a cyanamido group, a carbamido group, and acyl halide groups or at least one functional group selected from an epoxy group and an amino group.

4. The transfer layered body according to claim 1, wherein the electrically conductive material (b2) is silver.

5. The transfer layered body according to claim 1, wherein the resin layer (C) comprises one or more resin layers (C).

6. The transfer layered body according to claim 1, wherein the temporary support (A) has a surface roughness (maximum height Sz) of 0.001 to 20 μm as measured using a laser microscope.

7. The transfer layered body according to claim 1, further comprising a release layer on a surface of the temporary support (A).

8. The transfer layered body according to claim 1, wherein the temporary support (A) is a film or a metal.

9. A laminate comprising: a support D; and the transfer layered body according to claim 1, wherein the support D and the transfer layered body are laminated together such that a surface of the transfer layered body that is formed by the resin layer (C) faces at least one side of the support D.

10. The laminate according to claim 9, wherein the support D is formed of a fully cured product of a thermosetting resin.

11. A method for producing the layered body according to claim 1, the method comprising:

step 1 of forming, on at least one side of the temporary support (A), the plating seed layer (B) containing the dispersant (b1) including a basic nitrogen atom-containing group or a phosphate group and the electrically conductive material (b2); and step 2 of forming, on the plating seed layer (B), the resin layer (C) containing the compound (c1) having the functional group [X] and allowing the basic nitrogen atom-containing group or the phosphate group included in the dispersant (b1) contained in the plating seed layer (B) and the functional group [X] included in the compound (c1) contained in the resin layer (C) to react with each other to form a chemical bond.

12. The method for producing the transfer layered body according to claim 11, further comprising step 1' of forming a layer having releasability on the temporary support (A).

13. A method for producing an electrically conductive pattern, the method comprising:

step 1 of laminating the transfer layered body obtained by the method for producing according to claim 11 to at least one side of a support (D) such that a surface of the transfer layered body that is formed by the resin layer (C) faces the support (D); and step 2 of removing the temporary support (A) of the transfer layered body laminated to the support (D) to thereby form the resin layer (C) and the plating seed layer (B) on the at least one side of the support (D).

14. The method for producing an electrically conductive pattern according to claim 13, the method further comprising the step of smoothing a surface of the support (D).

15. A method for producing a printed wiring board, the method comprising using the method for producing an electrically conductive pattern according to claim 13.

16. A method for producing a printed wiring board and an electromagnetic seed film, the method comprising using the method for producing an electrically conductive pattern according to claim 13, wherein the support (D) is at least one selected from a rigid substrate, a film, a build-up film, a ceramic, glass, a silicon wafer, and a metal.

17. A method for producing a molded interconnect device, the method comprising using the method for producing an electrically conductive pattern according to claim 13, wherein the support (D) is a molded article.

18. The method for producing an electrically conductive pattern according to claim 15, further comprising the step of forming a metal plating layer (E) on the plating seed layer (B).

19. A method for producing an electrically conductive pattern, the method comprising:

step 1 of laminating the transfer layered body obtained by the method for producing according to claim 11 to at least one side of a support (D) such that a surface of the transfer layered body that is formed by the resin layer (C) faces the support (D);

step 2 of forming a through hole extending from the temporary support (A) of the transfer layered body so as to pass through both sides;

step 3 of applying palladium, an electrically conductive polymer, an electrically conductive paste, or carbon to the transfer layered body and a surface of the through hole to impart electrical conductivity to the surface of the through hole; and step 4 of removing the temporary support (A) and forming a metal plating layer (E) on the plating seed layer (B) and in the through hole.

20. A method for producing an electrically conductive pattern, the method comprising:

step 1 of laminating the transfer layered body obtained by the method for producing according to claim 11 to at least one side of a support (D) such that a surface of the transfer layered body that is formed by the resin layer (C) faces the support (D);

step 2 of forming a through hole extending from the temporary support (A) of the transfer layered body so as to pass through both sides;

step 3 of forming a metal film on the transfer layered body and a surface of the through hole using a dry plating method to impart electrical conductivity to the surface of the through hole; and step 4 of removing the temporary support (A) and forming a metal plating layer (E) on the plating seed layer (B) and in the through hole.

21. A method for producing an electrically conductive pattern, the method comprising:

step 1 of laminating the transfer layered body obtained by the method for producing according to claim 11 to at least one side of a support (D) such that a surface of the transfer layered body that is formed by the resin layer (C) faces the support (D);

step 2 of forming a through hole extending from the temporary support (A) of the transfer layered body so as to pass through both sides;

step 3 of removing the temporary support (A) and forming a metal plating layer (E) on a surface of the plating seed layer (B); and step 4 of filling the through hole with an electrically conductive paste to impart electrical conductivity to the through hole.

22. A method for producing an electrically conductive pattern, the method comprising:

step 1 of laminating a support (D) to at least one side of a substrate having an electrically conductive pattern formed thereon;

step 2 of laminating the transfer layered body obtained by the method for producing according to claim 11 to a surface of the support (D) such that a surface of the transfer layered body that is formed by the resin layer (C) faces the support (D);

step 3 of forming a blind hole extending from the temporary support (A) of the transfer layered body to the electrically conductive pattern on the substrate;

step 4 of applying palladium, an electrically conductive polymer, an electrically conductive paste, or carbon to the transfer layered body and a surface of the blind hole to impart electrical conductivity to the surface of the blind hole; and step 5 of removing the temporary support (A) and forming a metal plating layer (E) on the plating seed layer (B) and in the blind hole.

23. A method for producing an electrically conductive pattern, the method comprising:

step 1 of laminating a support (D) to at least one side of a substrate having an electrically conductive pattern formed thereon;

step 2 of laminating the transfer layered body obtained by the method for producing according to claim 11 to a surface of the support (D) such that a surface of the transfer layered body that is formed by the resin layer (C) faces the support (D);

step 3 of forming a blind hole extending from the temporary support (A) of the transfer layered body to the electrically conductive pattern on the substrate;

step 4 of forming a metal film on the transfer layered body and a surface of the blind hole using a dry plating method to impart electrical conductivity to the surface of the blind hole; and step 5 of removing the temporary support (A) and forming a metal plating layer (E) on the plating seed layer (B) and in the blind hole.

24. A method for producing an electrically conductive pattern, the method comprising:

step 1 of laminating a support (D) to at least one side of a substrate having an electrically conductive pattern formed thereon;

step 2 of laminating the transfer layered body obtained by the method for producing according to claim 11 to a surface of the support (D) such that a surface of the transfer layered body that is formed by the resin layer (C) faces the support (D);

step 3 of forming a blind hole extending from the temporary support (A) of the transfer layered body to the electrically conductive pattern on the substrate;

step 4 of removing the temporary support (A) and forming a metal plating layer (E) on a surface of the plating seed layer (B); and step 5 of filling the blind hole with an electrically conductive paste to impart electrical conductivity to the blind hole.

25. A method for producing an electrically conductive pattern, the method comprising:

step 1 of laminating the transfer layered body obtained by the method for producing according to claim 12 to at least one side of a support (D) such that a surface of the transfer layered body that is formed by the resin layer (C) faces the support (D);

step 2 of forming a through hole extending from the temporary support (A) of the transfer layered body so as to pass through both sides;

step 3 of applying palladium, an electrically conductive polymer, an electrically conductive paste, or carbon to the transfer layered body and a surface of the through hole to impart electrical conductivity to the surface of the through hole;

step 4 of removing the temporary support (A) and forming a patterned resist on a surface of the plating seed layer (B);

step 5 of forming a metal plating layer (E) on the plating seed layer (B) and in the through hole; and step 6 of removing the patterned resist and removing, using an etching solution, the plating seed layer (B) from a portion other than a portion in which the metal plating layer (E) serving as an electrically conductive pattern is formed.

26. A method for producing an electrically conductive pattern, the method comprising:

step 1 of laminating the transfer layered body obtained by the method for producing according to claim 11 to at least one side of a support (D) such that a surface of the transfer layered body that is formed by the resin layer (C) faces the support (D);

step 2 of forming a through hole extending from the temporary support (A) of the transfer layered body so as to pass through both sides;

step 3 of forming a metal film on the transfer layered body and a surface of the through hole using a dry plating method to impart electrical conductivity to the surface of the through hole;

step 4 of removing the temporary support (A) and forming a patterned resist on a surface of the plating seed layer (B);

step 5 of forming a metal plating layer (E) on the plating seed layer (B) and in the through hole; and step 6 of removing the patterned resist and removing, using an etching solution, the plating seed layer (B) from a portion other than a portion in which the metal plating layer (E) serving as an electrically conductive pattern is formed.

27. A method for producing an electrically conductive pattern, the method comprising:

step 1 of laminating the transfer layered body obtained by the method for producing according to claim 11 to at least one side of a support (D) such that a surface of the transfer layered body that is formed by the resin layer (C) faces the support (D);

step 2 of forming a through hole extending from the temporary support (A) of the transfer layered body so as to pass through both sides;

step 3 of removing the temporary support (A) and forming a patterned resist on a surface of the plating seed layer (B);

step 4 of forming a metal plating layer (E) on the plating seed layer (B);

step 5 of removing the patterned resist and removing, using an etching solution, the plating seed layer (B) from a portion other than a portion in which the metal plating layer (E) serving as an electrically conductive pattern is formed; and step 6 of filling the through hole with an electrically conductive paste to impart electrical conductivity to the through hole.

28. A method for producing an electrically conductive pattern, the method comprising:

step 1 of laminating the transfer layered body obtained by the method for producing according to claim 11 to at least one side of a support (D) such that a surface of the transfer layered body that is formed by the resin layer (C) faces the support (D);

step 2 of removing the temporary support (A) to form the resin (C) and the plating seed layer (B) on a surface of the support (D);

step 3 of forming a patterned resist on a surface of the plating seed layer (B);

step 4 of forming a metal plating layer (E) on the plating seed layer (B);

step 5 of removing the patterned resist and removing, using an etching solution, the plating seed layer (B) from a portion other than a portion in which the metal plating layer (E) serving as an electrically conductive pattern is formed;

step 6 of forming a through hole extending from the temporary support (A) of the transfer layered body so as to pass through both sides; and step 7 of filling the through hole with an electrically conductive paste to impart electrical conductivity to the through hole.

29. A method for producing an electrically conductive pattern, the method comprising:

step 1 of laminating a support (D) to at least one side of a substrate having an electrically conductive pattern formed thereon;

step 2 of laminating the transfer layered body obtained by the method for producing according to claim 11 to a surface of the support (D) such that a surface of the transfer layered body that is formed by the resin layer (C) faces the support (D);

step 3 of forming a blind hole extending from the temporary support (A) of the transfer layered body to the electrically conductive pattern on the substrate;

step 4 of applying palladium, an electrically conductive polymer, an electrically conductive paste, or carbon to the transfer layered body and a surface of the blind hole to impart electrical conductivity to the surface of the blind hole;

step 5 of removing the temporary support (A) and forming a patterned resist on a surface of the plating seed layer (B);

step 6 of forming a metal plating layer (E) on the plating seed layer (B) and in the blind hole; and step 7 of removing the patterned resist and removing, using an etching solution, the plating seed layer (B) from a portion other than a portion in which the metal plating layer (E) serving as an electrically conductive pattern is formed.

30. A method for producing an electrically conductive pattern, the method comprising:

step 1 of laminating a support (D) to at least one side of a substrate having an electrically conductive pattern formed thereon;

step 2 of laminating the transfer layered body obtained by the method for producing according to claim 11 to a surface of the support (D) such that a surface of the transfer layered body that is formed by the resin layer (C) faces the support (D);

step 3 of forming a blind hole extending from the temporary support (A) of the transfer layered body to the electrically conductive pattern on the substrate;

step 4 of forming a metal film on the transfer layered body and a surface of the blind hole using a dry plating method to impart electrical conductivity to the surface of the blind hole;

step 5 of removing the temporary support (A) and forming a patterned resist on a surface of the plating seed layer (B); and step 6 of forming a metal plating layer (E) on the plating seed layer (B) and in the blind hole; and step 7 of removing the patterned resist and removing, using an etching solution, the plating seed layer (B) from a portion other than a portion in which the metal plating layer (E) serving as an electrically conductive pattern is formed.

31. A method for producing an electrically conductive pattern, the method comprising:

step 1 of laminating a support (D) to at least one side of a substrate having an electrically conductive pattern formed thereon;

step 2 of laminating the transfer layered body obtained by the method for producing according to claim 11 to a surface of the support (D) such that a surface of the transfer layered body that is formed by the resin layer (C) faces the support (D);

step 3 of forming a blind hole extending from the temporary support (A) of the transfer layered body to the electrically conductive pattern on the substrate;

step 4 of removing the temporary support (A) and forming a patterned resist on a surface of the plating seed layer (B);

step 5 of forming a metal plating layer (E) on the plating seed layer (B);

step 6 of removing the patterned resist and removing, using an etching solution, the plating seed layer (B) from a portion other than a portion in which the metal plating layer (E) serving as an electrically conductive pattern is formed; and step 7 of filling the blind hole with an electrically conductive paste to impart electrical conductivity to the blind hole.

32. A method for producing an electrically conductive pattern, the method comprising:

step 1 of laminating a support (D) to at least one side of a substrate having an electrically conductive pattern formed thereon;

step 2 of laminating the transfer layered body obtained by the method for producing according to claim 11 to a surface of the support (D) such that a surface of the transfer layered body that is formed by the resin layer (C) faces the support (D);

step 3 of removing the temporary support (A) to form the resin (C) and the plating seed layer (B) on the surface of the support (D);

step 4 of forming a patterned resist on a surface of the plating seed layer (B);

step 5 of forming a metal plating layer (E) on the plating seed layer (B);

step 6 of removing the patterned resist and removing, using an etching solution, the plating seed layer (B) from a portion other than a portion in which the metal plating layer (E) serving as an electrically conductive pattern is formed;

step 7 of forming a blind hole extending from the temporary support (A) of the transfer layered body to the electrically conductive pattern on the substrate; and step 8 of filling the blind hole with an electrically conductive paste to impart electrical conductivity to the blind hole.

33. A method for producing the layered body according to claim 1, the method comprising:

step 1 of forming, on at least one side of the temporary support (A), the plating seed layer (B) containing the dispersant (b1) including a basic nitrogen atom-containing group or a phosphate group and the electrically conductive material (b2), the plating seed layer (B) being formed into a pattern; and step 2 of forming the resin layer (C) on the plating seed layer (B) formed into the pattern and allowing the basic nitrogen atom-containing group or the phosphate group included in the dispersant (b1) contained in the plating seed layer (B) and the functional group [X] included in the compound (c1) contained in the resin layer (C) to react with each other to form a chemical bond.

* * * * *